(12) United States Patent
Ohkawa et al.

(10) Patent No.: US 9,203,248 B2
(45) Date of Patent: Dec. 1, 2015

(54) BATTERY MANAGEMENT SYSTEM USING NON-VOLATILE MEMORY

(75) Inventors: Keiichiro Ohkawa, Hitachinaka (JP); Masahiro Ueda, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 775 days.

(21) Appl. No.: 13/387,396

(22) PCT Filed: Sep. 28, 2010

(86) PCT No.: PCT/JP2010/066826
§ 371 (c)(1),
(2), (4) Date: Mar. 14, 2012

(87) PCT Pub. No.: WO2011/037257
PCT Pub. Date: Mar. 31, 2011

(65) Prior Publication Data
US 2012/0175953 A1      Jul. 12, 2012

(30) Foreign Application Priority Data

Sep. 28, 2009   (JP) ................................. 2009-221825

(51) Int. Cl.
*H02J 7/00* (2006.01)
*B60L 3/00* (2006.01)
(Continued)

(52) U.S. Cl.
CPC ............. *H02J 7/0021* (2013.01); *B60L 3/0046* (2013.01); *B60L 11/1861* (2013.01);
(Continued)

(58) Field of Classification Search
CPC ........... G01R 31/3606; G01R 31/3624; G01R 31/3658

USPC ......................................................... 320/116
See application file for complete search history.

(56) References Cited

U.S. PATENT DOCUMENTS 4,680,736 A      7/1987   Schrenk
4,933,892 A *    6/1990   Nakaya et al. ................ 708/401
(Continued)

FOREIGN PATENT DOCUMENTS

CN      101318489 A      12/2008
CN      101488596 A      7/2009
(Continued)

OTHER PUBLICATIONS

Japanese Office Action with English Translation dated Nov. 12, 2013 (seven (7) pages).
(Continued)

*Primary Examiner* — Drew A Dunn
*Assistant Examiner* — Jerry D Robbins
(74) *Attorney, Agent, or Firm* — Crowell & Moring LLP

(57) ABSTRACT

A battery system according to the present invention includes: a battery module comprising a plurality of cell groups connected in series, each comprising a plurality of cells connected in series; a plurality of integrated circuits provided to corresponding each cell group of the battery module, that perform detection of terminal voltages of the cells in the corresponding each cell group, and that also perform diagnosis; and a battery controller that, along with issuing commands to the plurality of integrated circuits, also receives results of detection and results of diagnosis by the plurality of integrated circuits; wherein the battery system comprises a writable non-volatile memory, and data is stored in the writable non-volatile memory specifying usage environment of the battery module, including a maximum voltage or a maximum current of the battery module and history data based upon operation history of the battery module.

13 Claims, 35 Drawing Sheets

(51) Int. Cl.
  *B60L 11/18* (2006.01)
  *G01R 31/36* (2006.01)
  *H01M 10/44* (2006.01)
  *H01M 10/48* (2006.01)
  *H01M 10/0525* (2010.01)
  *G11C 16/22* (2006.01)
  *G11C 29/00* (2006.01)

(52) U.S. Cl.
  CPC ........ *B60L 11/1866* (2013.01); *G01R 31/3658* (2013.01); *H01M 10/441* (2013.01); *H01M 10/482* (2013.01); *H02J 7/0016* (2013.01); *H02J 7/0026* (2013.01); *B60L 2200/26* (2013.01); *B60L 2240/545* (2013.01); *B60L 2240/547* (2013.01); *B60L 2240/549* (2013.01); *B60L 2260/44* (2013.01); *G11C 16/225* (2013.01); *G11C 29/82* (2013.01); *H01M 10/0525* (2013.01); *Y02T 10/7005* (2013.01); *Y02T 10/7011* (2013.01); *Y02T 10/7044* (2013.01); *Y02T 10/7061* (2013.01); *Y10T 307/305* (2015.04)

(56) References Cited

U.S. PATENT DOCUMENTS

| | | | |
|---|---|---|---|
| 5,084,843 A | | 1/1992 | Mitsuishi et al. |
| 5,438,575 A | * | 8/1995 | Bertrand ........................ 714/799 |
| 5,701,068 A | | 12/1997 | Baer et al. |
| 6,029,189 A | * | 2/2000 | Ishida et al. ................ 718/105 |
| 6,184,656 B1 | | 2/2001 | Karunasiri et al. |
| 6,549,014 B1 | | 4/2003 | Kutkut et al. |
| 2005/0024015 A1 | * | 2/2005 | Houldsworth et al. ....... 320/119 |
| 2008/0089123 A1 | * | 4/2008 | Chae et al. ................. 365/185.03 |
| 2008/0164762 A1 | | 7/2008 | Pecile |
| 2008/0284375 A1 | | 11/2008 | Nagaoka et al. |
| 2009/0087722 A1 | * | 4/2009 | Sakabe et al. .................. 429/61 |
| 2009/0091332 A1 | * | 4/2009 | Emori et al. .................. 324/537 |
| 2009/0091977 A1 | * | 4/2009 | Hunt ........................ 365/185.08 |
| 2009/0187359 A1 | | 7/2009 | Hood et al. |
| 2009/0198399 A1 | * | 8/2009 | Kubo et al. ..................... 701/22 |

FOREIGN PATENT DOCUMENTS

| | | |
|---|---|---|
| EP | 1 703 294 A1 | 9/2006 |
| JP | 2000-357216 A | 12/2000 |
| JP | 2004-14205 A | 1/2004 |
| JP | 2007-336778 A | 12/2007 |
| JP | 2008-289234 A | 11/2008 |
| JP | 2008-312391 A | 12/2008 |
| JP | 2009-183025 A | 8/2009 |

OTHER PUBLICATIONS

Chinese Office Action dated Nov. 4, 2013, with English translation (ten (10) pages).

International Search Report with English translation dated Dec. 14, 2010 (four (4) pages).

European Search Report dated Dec. 11, 2013 (ten (10) pages).

Extended European Search Report dated Oct. 28, 2014 (Eight (8) pages).

* cited by examiner

FIG. 8    CONTENTS OF NON-VOLATILE MEMORY OF INTEGRATED CIRCUIT OR BATTERY CONTROLLER 20

| DATA TYPE (FILE) | | COLUMN A | | COLUMN B | |
|---|---|---|---|---|---|
| | | DATA AT FINAL WRITE (END OF OPERATION), OR DATA WHEN UPDATED DURING OPERATION | | HISTORY DATA BASED UPON PARAMETERS (CURRENT INTEGRATED VALUES, OPERATING TIME, NUMBER OF OPERATING EPISODES) | |
| FILE KD1 | CORRECTION DATA FOR DETECTION CIRCUITS | D1 | CORRECTION COEFFICIENTS FOR A/D CONVERTERS OF INTEGRATED CIRCUITS | | — |
| | | D3 | CORRECTION COEFFICIENT FOR VOLTAGE METER | | — |
| | | D5 | CORRECTION COEFFICIENTS FOR CURRENT METERS | | — |
| FILE KD2 | HISTORY DATA FOR BATTERY SYSTEM | D11 | INTEGRATED VALUE OF CHARGING AND DISCHARGING CURRENT | D12 | INTEGRATED VALUE OF CHARGING AND DISCHARGING CURRENT |
| | | D13 | TERMINAL VOLTAGE OF LITHIUM CELL | D14 | TERMINAL VOLTAGE OF LITHIUM CELL |
| | | D15 | STATE OF CHARGE (SOC) OF LITHIUM CELL / DISCHARGE INTERVAL TO MAKE UNIFORM | D16 | STATE OF CHARGE (SOC) OF LITHIUM CELL / DISCHARGE INTERVAL TO MAKE UNIFORM |
| | | D17 | VARIATION/DEVIATION OF STATE OF CHARGE (SOC) OF CELLS | D18 | VARIATION/DEVIATION OF STATE OF CHARGE (SOC) OF CELLS |
| | | D19 | NUMBER OF WARNINGS FOR CELL | D20 | NUMBER OF WARNINGS FOR CELL |
| | | D21 | PRODUCT INFORMATION AND HISTORY OF PROGRAM | | — |
| | | D23 | HISTORY OF STORAGE BLOCKS OF WRITE REGION | | |
| | | D25 | STATE OF OPERATION STOPPAGE OR OPERATION DEGRADATION, AND OTHER | D26 | STATE OF OPERATION STOPPAGE OR OPERATION DEGRADATION, AND OTHER |
| FILE KD3 | DATA SPECIFYING USAGE ENVIRONMENT OF BATTERY SYSTEM | D31 | TEMPERATURES OF VARIOUS LOCATIONS ON BATTERY MODULE | | |
| | | D33 | MAXIMUM AND MINIMUM TERMINAL VOLTAGES DURING OPERATION | | — |
| | | D35 | MAXIMUM AND MINIMUM CURRENTS SUPPLIED DURING OPERATION | | |
| | | D37 | MAXIMUM AND MINIMUM STATES OF CHARGE (SOCS) | | — |
| FILE KD4 | SECURITY DATA | D41 | SECRET SECURITY NUMBER FOR ACCESSING DATA | | |
| | | D43 | NUMBER OF TIMES OF DATA ACCESS ACTS AND ITS DATE AND TIME | | — |

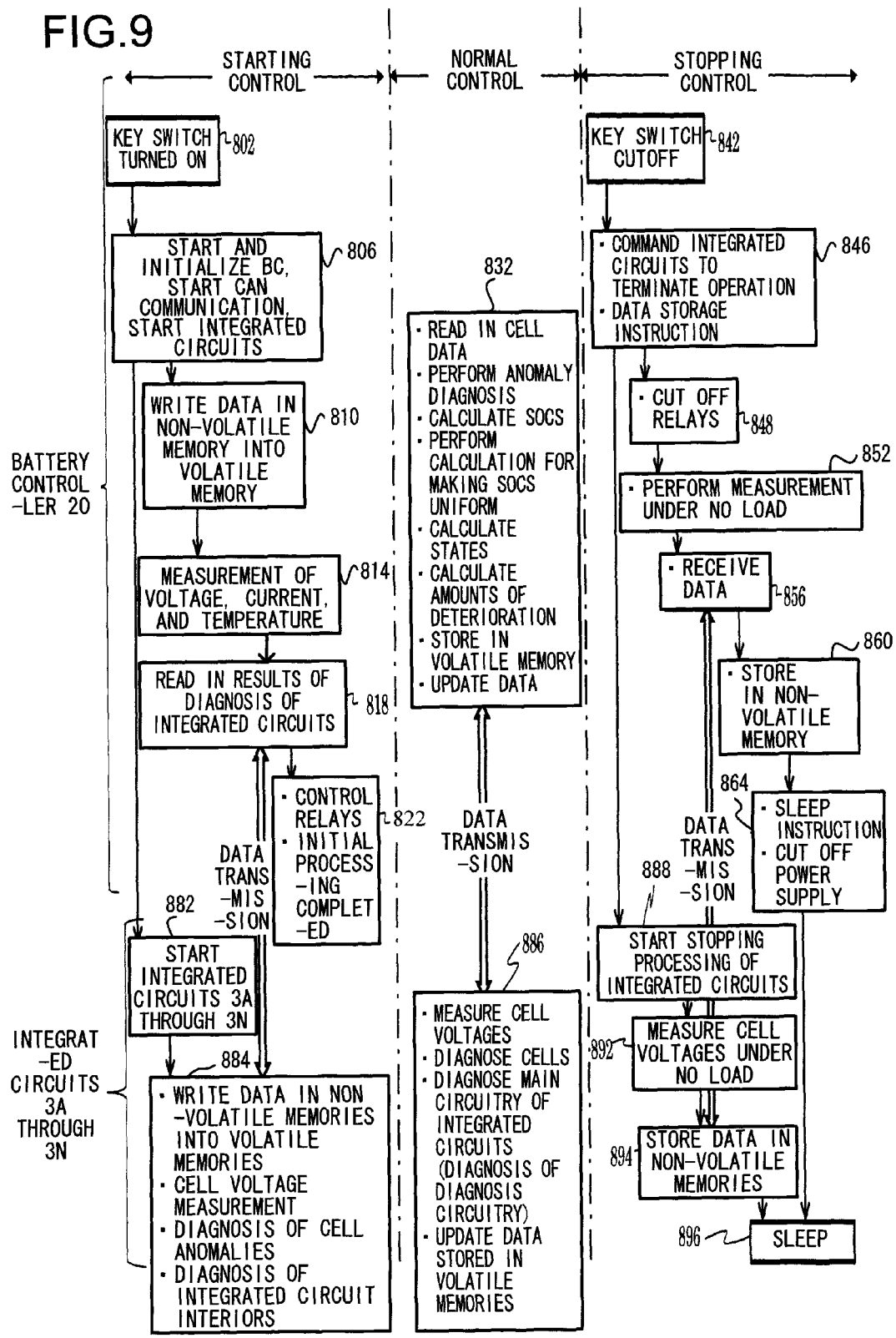

BATTERY MANAGEMENT SYSTEM USING NON-VOLATILE MEMORY

TECHNICAL FIELD

The present invention relates to a battery system in which information related to a battery is stored in a rewritable non-volatile memory.

BACKGROUND ART

In recent years, demand for higher reliability battery systems for onboard vehicle use has increased, and in particular it has become desirable to enhance the reliability of battery systems that use, for example, lithium cells that store high amounts of power. Battery systems have been proposed that include improved diagnosis functions for heightening their reliability. For example a battery system for onboard vehicle use is disclosed in Patent Document #1 that, in order to enhance reliability, is equipped with a diagnosis circuit that diagnoses whether or not any anomalous condition is occurring in the battery system.

CITATION LIST

Patent Literature

Patent Document #1: Japanese Laid-Open Patent Publication 2009-183025.

SUMMARY OF INVENTION

Technical Problem

In Patent Document #1 described above, a technique of diagnosis is disclosed that uses a diagnosis circuit for diagnosing whether or not any anomalous condition in the battery system is occurring, and this diagnosis technique does indeed contribute to enhancement of the reliability of the battery system. However, the Patent Document described above does not extend to contemplation of monitoring of changes of the state of the battery on the basis of elapsed operation time of the battery system, and to enhancement of the reliability on the basis of this monitoring.

The object of the present invention is to enhance the reliability of a battery system.

Solution to Problem

As one method that has been envisaged for enhancing the reliability of a battery system, it may be arranged to store information specifying history related to the battery system on the basis of history of the battery system operation. The integrated value of the current of the battery system is one example of an item of operation history. Deterioration of the cells comprising the battery system depends to a great extent upon the current that they have supplied. Accordingly, data representing the state of the cells and so on when the integrated value of the current reaches a value determined in advance is stored as history data, and anomalies can be detected or forecast by monitoring changes of the above described history data.

Another item of operation history is the time that the battery system has been operated or the time that the cells have been in use. Data representing the states of the cells and so on when the time that the battery system has been operating or the time that the cells have been in use reaches a value determined in advance is stored as history data, and anomalies can be detected or forecast by monitoring changes of the above described history data.

Yet another method that has been envisaged for enhancing the reliability of a battery system is to reduce losses of data during the storage operation by storing detected data in a rewritable non-volatile memory. For example, in the embodiment described below, a storage region in a rewritable non-volatile memory is divided into a plurality of regions, and it is arranged to perform storage in them alternatingly. By using a memory that is divided into a plurality of regions in this manner, if hypothetically some anomaly has occurred with the data that was stored in the previous cycle, then it is possible to use the data stored in the cycle before the previous cycle, i.e. the data that was stored one cycle previously. Or, if hypothetically some anomaly has occurred with the data that was stored in the previous cycle, then, by storing the new data in the region in which the anomaly has occurred, or by storing the new data in a region that is different from the region in which the anomaly has occurred, it is still possible to use data stored in that other region, even if an anomaly occurs for a second time with the data that has been stored in the region where the anomaly has occurred.

(1) According to the 1st aspect of the present invention, a battery system comprises: a battery module comprising a plurality of cell groups connected in series, each comprising a plurality of cells connected in series; a plurality of integrated circuits provided to corresponding each cell group of the battery module, that perform detection of terminal voltages of the cells in the corresponding each cell group, and that also perform diagnosis; and a battery controller that, along with issuing commands to the plurality of integrated circuits, also receives results of detection and results of diagnosis by the plurality of integrated circuits; wherein the battery system comprises a writable non-volatile memory, and data is stored in the writable non-volatile memory specifying usage environment of the battery module, including a maximum voltage or a maximum current of the battery module and history data based upon operation history of the battery module.

(2) According to the 2nd aspect of the present invention, in a battery system according to the 1st aspect, it is preferred that when storing, as the history data in the non-volatile memory, as stored data that is not to be deleted, data indicating the states of the cells in a state in which a cumulative value indicating operation history of the battery module satisfies a predetermined condition, this data is stored in a storage block that is set in the non-volatile memory as the data that is not to be deleted.

(3) According to the 3rd aspect of the present invention, in a battery system according to the 1st aspect, it is preferred that, as the history data, data representing states of the cells each time integrated value of current of the battery module reaches a predetermined value is appended, as stored data that is not to be deleted, to the stored data that is not to be deleted that is already stored, and is stored in the non-volatile memory.

(4) According to the 4th aspect of the present invention, in a battery system according to the 1st aspect, it is preferred that, as the history data, data representing states of the cells each time the integrated value of the operation time of the battery module reaches a predetermined value is appended, as stored data that is not to be deleted, to the stored data that is not to be deleted that is already stored, and is stored in the non-volatile memory.

(5) According to the 5th aspect of the present invention, in a battery system according to the 1st aspect, it is preferred that, as the history data, data representing states of the cells each time an integrated value related to the number of episodes of operation of the battery module reaches a predetermined value is appended, as stored data that is not to be deleted, to the stored data that is not to be deleted that is already stored, and is stored in the non-volatile memory.

(6) According to the 6th aspect of the present invention, in a battery system according to the 1st aspect, it is preferred that: a circuit is provided for making charge states (SOCs) of the cells uniform; and data specifying operational time intervals calculated for striving to making the charge states (SOCs) of the cells uniform is appended, as stored data that is not to be deleted, to the stored data not to be deleted that is already stored, and is stored in the non-volatile memory as the history data.

(7) According to the 7th aspect of the present invention, in a battery system according to any one of the 1st through 6th aspects, the battery system comprises a volatile memory, wherein, at start of operation, data representing the usage environment and history data stored in the non-volatile memory are read out from the non-volatile memory and are written into the volatile memory, during operation data written in the volatile memory is updated, and during ending of operation updated data stored in the volatile memory is written into the non-volatile memory for a second time.

(8) According to the 8th aspect of the present invention, in a battery system according to any one of the 1st through 6th aspects, it is preferred that: at least a first storage block and a second storage block for storing the data specifying the usage environment and the history data are set in a storage region of the non-volatile memory; if, among the first and the second storage blocks in the non-volatile memory, a storage block that has been written later is the second storage block, then, when reading out data from the non-volatile memory, data stored in the second block is read out; and it is decided whether or not this data that has been read out is normal, and, if it has been decided that the data that has been read out is normal, then, among the first and the second storage blocks, next writing of data is performed into the first storage block, that is different from the storage block from which the data was read out.

(9) According to the 9th aspect of the present invention, in a battery system according to the 8th aspect, it is preferred that, if it has been decided that the data that has been read out from the second storage block in the non-volatile memory is anomalous, then the next writing of data to the non-volatile memory is performed to the second storage block, that is the same as the block from which the data that it was decided was anomalous was read out.

(10) According to the 10th aspect of the present invention, in a battery system according to the 8th aspect, it is preferred that, if it has been decided that the data that has been read out from the second storage block in the non-volatile memory is anomalous, then new writing of data to the non-volatile memory is performed both for the first storage block and for the second storage block.

(11) According to the 11th aspect of the present invention, in a battery system according to the 8th aspect, it is preferred that: a third storage block is further set in the non-volatile memory; and if it has been decided that the data that has been read out from the second storage block in the non-volatile memory is anomalous, then, when writing next data to the non-volatile memory, the next data is written to the third storage block, and, when reading out the next data from the non-volatile memory, stored data is read out from the third storage block of the non-volatile memory.

(12) According to the 12th aspect of the present invention, in a battery system according to the 8th aspect, it is preferred that: a third storage block is further set in the non-volatile memory; and if it has been decided that the data that has been read out from the second storage block in the non-volatile memory is anomalous, then, when writing next data to the non-volatile memory, the next data is written both to the second storage block and to the third storage block.

(13) According to the 13th aspect of the present invention, in a battery system according to the 7th aspect, it is preferred that terminal voltages of the cells are detected during operation starting, variation or deviation of SOCs is obtained from the terminal voltages that have been detected during operation starting, the variation or deviation of the SOCs that has been obtained is compared with variation or deviation of the SOCs that is stored in the non-volatile memory, and it is determined that an anomaly is present if the variation or deviation of the SOCs is increased.

(14) According to the 14th aspect of the present invention, in a battery system according to the 7th aspect, it is preferred that terminal voltages of the cells are detected during operation starting, a discharge time for making the SOCs uniform is obtained from the terminal voltages that have been detected during operation starting, the discharge time that has been obtained is compared with discharge time that is stored in the non-volatile memory, and it is determined that an anomaly is present if the discharge time is increased.

(15) According to the 15th aspect of the present invention, in a battery system according to the 7th aspect, it is preferred that terminal voltages of the cells are detected during operation starting, the terminal voltages of the cells that have been detected are compared with the terminal voltages of the cells that are stored in the non-volatile memory, and it is determined that an anomaly is present if terminal voltage is increased. Advantageous Effects of Invention According to the present invention, it is possible to manage change of the battery system over time, so that it is possible to enhance the reliability of the battery system.

BRIEF DESCRIPTION OF DRAWINGS

FIG. 8 shows contents stored in a non-volatile memory of a cell controller IC or of a battery controller;

FIG. 9 is a flow chart for explanation of the operation of the lithium battery system;

DESCRIPTION OF EMBODIMENTS

Figure 1:
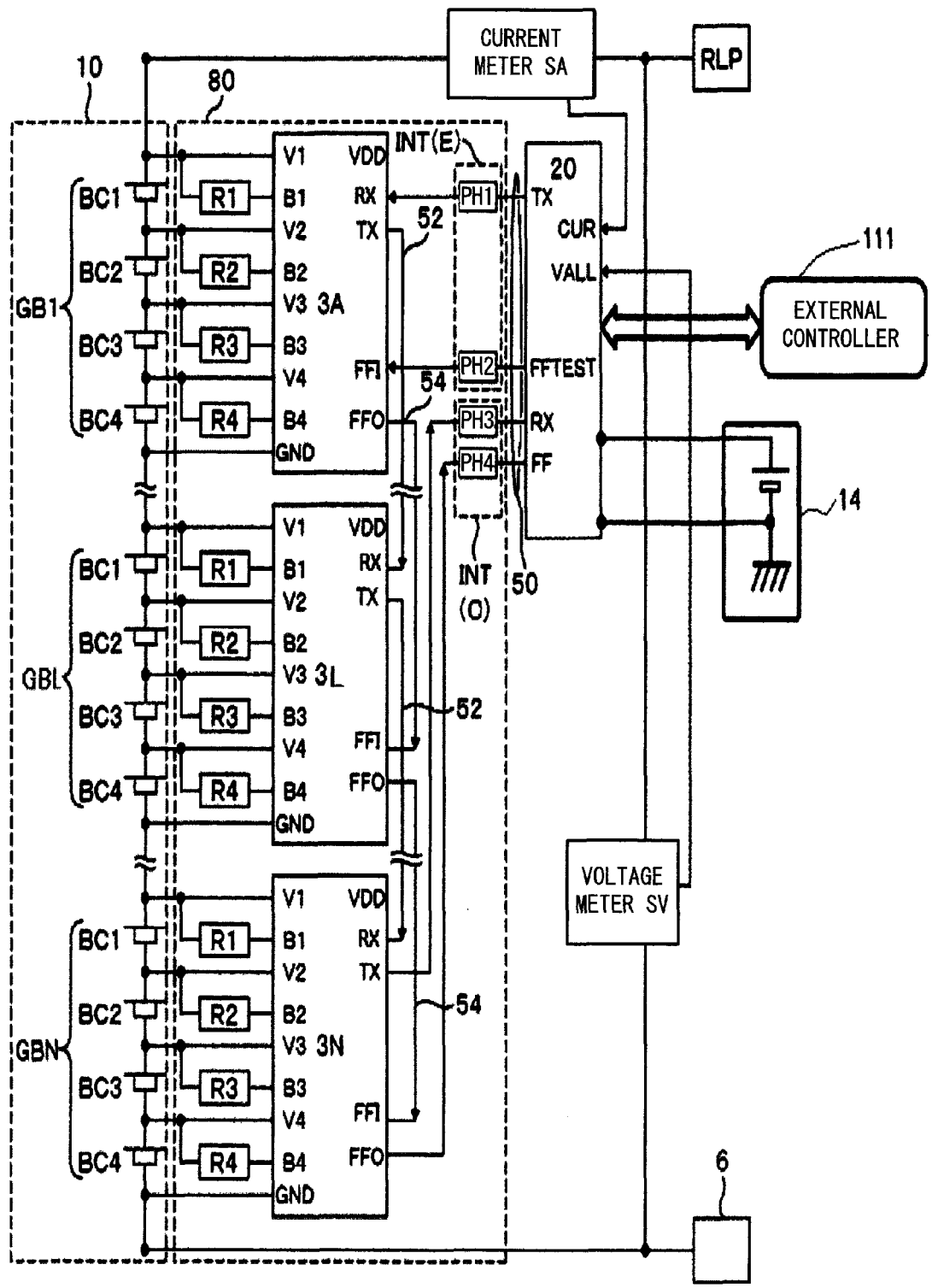
FIG. 1 is a block diagram showing the structure of a battery system according to an embodiment of the present invention.

In the embodiments explained subsequently, not only the details described in the above sections "Technical Problem", "Solution to Problem", and "Advantageous Effect of Invention", but also various other problems are solved, and various advantageous effects are pointed out. Various problems solved by and various advantageous effects of the embodiments explained subsequently are enumerated below, although there are some portions that overlap the details described in the above sections "Technical Problem", "Solution to Problem", and "Advantageous Effect of Invention". Moreover, in the subsequent description of the embodiments, along with explanation of the problems to be solved and the advantageous effects enumerated below, other problems that are solved and other advantageous effects are also explained in concrete terms.

It should be understood that although, as a representative example, the following embodiments are explained in terms of a lithium battery system that is mounted to a vehicle, the present invention should not be considered as being limited to a lithium battery system that is mounted to a vehicle. The invention described above and the advantageous effects yielded thereby described below can also be implemented over broad fields other than the field of vehicles, such as, for example, the industrial field and the household field and the like.

—Enhancement of the Accuracy of Detection of Anomaly of a Lithium Cell, or of its State of Health (SOH)—

In the following embodiments, the integrated value of the current value of the lithium battery system, in other words the integrated value of the output current, the integrated value of the charging current, or the integrated values of both the output current and the charging current, is used as a parameter or parameters representing operation history; and changes of the states of the lithium cells are detected on the basis of the above described parameter or parameters, and anomalies of the lithium cells are detected from these changes of state, or phenomena are obtained that are connected with abnormalities. Since the integrated value of the current is used as a parameter, accordingly it is possible to enhance the accuracy of detection of anomaly of the lithium cells, or of deterioration thereof.

In concrete terms, integration of the above described current value is constantly performed, and, each time the integrated value of the current reaches a value that is determined in advance, data is stored representing a state related to the entire lithium battery system, or representing the states of the lithium cells. Anomalous conditions related to the entire lithium battery system, or anomalous conditions of each of the lithium cells, are obtained by using this stored data, or by using newly detected information and also on the basis of the stored data. Or the states of health (i.e. the SOHs) of the lithium cells may be forecast, or their lives estimated, by using the stored data, or by using newly detected information and also on the basis of the stored data.

As parameters indicating operation history to be stored as the above described history data, while the integrated value of the current value described above is optimum, as alternatives, it would be possible to employ the integrated value of the time of use, or of the number of times of use. It is often the case that in the state in which a lithium battery system is used, for example in the state of being mounted to a vehicle, the system is used repeatedly in approximately the same type of conditions, and very often the current value of the lithium battery system during operation is approximately the same value. Accordingly, it is often the case that the integrated value of the current of the lithium battery system and the integrated value of the time of use of the lithium battery system exhibit a relationship of correlation. Due to this type of reason, it is possible to use the integrated value of the time of use as a parameter. In a similar manner, it is possible to use the integrated value of the number of times of use of the lithium battery system as a parameter.

One of the elements of history data that can be stored on the basis of the parameter described above is the state of variation of numerical values specifying the states of charge (i.e. the SOCs) of the lithium cells included in the lithium battery system. From this history data, it becomes possible to understand how the states of variation of the numerical values (i.e. of the SOCs) change on the basis of the operation history as specified by the parameter described above, and it becomes possible to enhance the accuracy of detection of a lithium cell in which anomaly has occurred, or of detection of deterioration. In the new state of the lithium battery system, the numerical values (i.e. the SOCs) that indicate the states of charge of the lithium cells have values that are close to one another. And, along with the progression of deterioration, the states of charge (the SOCs) of the lithium cells that have deteriorated have values that are different from the numerical values (the SOCs) that specify the states of charge of the other lithium cells. As compared with normal lithium cells, those lithium cells for which deterioration has progressed exhibit the phenomenon of increase of leakage current, and, since this increased leakage current is an extremely minute value, in the prior art detection thereof presented a difficult problem. However it has now been found that it is possible to detect minute leakage of the lithium cells comparatively easily, by investigating how the variations of the states of charge (the SOCs) of the lithium cells, or their differences from the average value, have changed in terms of operation history. Moreover, it has now been found that it is possible to detect deterioration of a lithium cell at an early stage by taking advantage of the phenomenon that its variation of state of charge (SOC) or its difference from the average value becomes abruptly greater in terms of the parameter described above. Yet further, it has now been found that it is possible to estimate change of variations of the states of charge (the SOCs) or of the differences from the average value from the present time point onwards, so that it is possible to forecast the lives of the cells.

In the embodiments explained below, control is performed in order to suppress variations of the states of charge (the SOCs) of the lithium cells, and also with the aim of making the SOCs more uniform. In concrete terms, by providing bypass circuits for discharging those lithium cells for which the states of charge (the SOCs) are large and performing discharge therewith, control is performed in order to bring those cells closer to the states of charge (the SOCs) of those lithium cells for which the values of the states of charge (the SOCs) are small. The time interval required for this control to make the states of charge uniform becomes longer, the greater is the amount of variation of the states of charge (the SOCs) of the lithium cells. In other words, the fact has now been clarified by research by the present inventors that the time interval required for this control to make the states of charge uniform becomes longer as the deterioration of the lithium cells progresses. Accordingly, the time period of operation of control to make the states of charge uniform may be stored as history data, and this value may be used in the detection of anomaly of the lithium cells and in the detection of deterioration thereof. Moreover, it is possible to forecast the lives of the lithium cells by estimating the change from the present moment onwards in terms of the value of the parameter described above.

—Discovery of an Anomaly of a Cell at an Early Stage—

Another problem is that, from the point of view of enhancement of the reliability of a battery system, it is very important to detect an lithium cell that is in an anomalous state, among the many cells, at an early state of development of the anomalous state. As explained in the following embodiments, when the operation of the battery system stops, the terminal voltages of the lithium cells are detected and the state of charge (the SOC) of each of the lithium cells is obtained, and the state of charge of each of the lithium cells is stored in a rewritable non-volatile memory. Next, in the state in which the operation of the battery system described above has started, the terminal voltage of each of the lithium cells is detected and the state of charge (the SOC) of each of the lithium cells is obtained. By comparing together the state of charge (the SOC) of each of the lithium cells when operation starts and the state of charge (the SOC) of each of the lithium cells that was previously stored, the differences in the states of charge (i.e. the SOCs) between when operation stopped and when operation starts are compared for each of the lithium cells. And, if the above described differences in the states of charge (the SOCs) are large, then it can be decided that an anomaly has occurred with that lithium cell, such as a minute short circuit or the like.

—Enhancement of the Accuracy of Detection of an Anomaly of a Cell—

In the embodiments explained below, the deviations of the lithium cells with respect to the state of charge (the SOC) of the entire lithium battery are stored, it is detected whether or not this deviation described above has changed for each of the lithium cells, and any lithium cell for which the change of deviation is unique is detected on the basis of change of this deviation. It is possible to detect lithium cells whose condition is anomalous at yet higher accuracy with this method. As a method in concrete terms for detecting anomalous condition of the lithium cells with high accuracy, the state of charge (the SOC) of each of the lithium cells is obtained by detecting the terminal voltages of the lithium cells, and then the deviation of the state of charge (the SOC) of each of the lithium cells is obtained. For the deviation, for example, the deviation of the state of charge (the SOC) of each of the lithium cells from the average state of charge (the SOC) of the lithium battery system may be used.

Next, the deviations of the states of charge (the SOCs) that have been obtained by this calculation are compared with the deviations of the states of charge (the SOCs) of the corresponding lithium cells that are stored. The states of change of the deviations respectively related to the state of charge (the SOC) of each of the lithium cells is calculated, and those lithium cells for which the change of the deviation exceeds some reference value are selected. And, for any lithium cell for which the above described change of deviation exceeds the reference value, it can be decided that some anomalous condition such as a minute leakage or the like is occurring.

Examples of deviation of the lithium cells that may be the subjects of comparison are deviation when operation the previous time terminates, and deviation when operation is again resumed. When operation of the vehicle terminates, the deviation of the state of charge (the SOC) of each of the lithium cells is obtained by calculation, and is stored in the writable non-volatile memory. When the lithium battery system is kept in the non-operational state, such as when the vehicle is in the parked state for several hours or several days, the states of charge (the SOCs) of the lithium cells gradually decrease. Since the leakage current of a normal lithium cell is extremely minute, and since moreover the time during which operation is stopped is the same for each of the lithium cells, accordingly the states of charge (the SOCs) of the various lithium cells change in approximately the same way, so that the deviations of the states of charge (the SOCs) of the lithium cells almost do not change. On the other hand, the leakage current of a lithium cell in which an anomaly such as a minute short circuit or the like is taking place is large compared to the leakage current of a normal lithium cell, so that the rate of change of its state of charge (i.e. its SOC) is large. Accordingly, along with the passage of time, the deviation of such an anomalous lithium cell becomes large as compared to that of a normal lithium cell.

A very important characteristic that may be used is the deviation between the state of charge (the SOC) of each of the lithium cells and the state of charge (the SOC) of the entire lithium battery. While operation of the vehicle is stopped, the state of charge (the SOC) of each of the lithium cells changes for various reasons. For example, elapsed time and temperature and so on are possible causes. If the times of stoppage of operation of the vehicle are irregular, then, although the differences in the states of charge (the SOCs) of the lithium cells between when vehicle operation stops and when it starts again change according to the time of stoppage, when attention is directed to deviation between the state of charge (the SOC) of each of the lithium cells and the state of charge (the SOC) of the entire lithium battery, it is seen that this does not change very much. In a similar manner, even though the temperature to which each of the lithium cells is subjected changes while the vehicle is stopped, if the deviation described above is employed, then the influence of changes of temperature becomes small.

On the other hand, among the lithium cells incorporated in the battery system, the number of lithium cells for which an anomaly is occurring is extremely low, and even if some are present, there will only be one or at the most two of them. Since almost all of the lithium cells are normal, a prominent characteristic is that the change of the state of charge (the SOC) of a normal lithium cell and the change of the average state of charge (the SOC) of the entire lithium battery system resemble one another extremely closely. Thus, a tendency is evident for the deviation between the average states of charge (the SOCs) of an anomalous lithium cell and of the lithium battery system to stand out. Due to this, by storing the deviation of the state of charge (the SOC) of each of the lithium cells in the rewritable non-volatile memory when the operation of the lithium battery system is stopped, and by comparing it with the deviation of the state of charge (the SOC) of each of the lithium cells when the operation is resumed, it becomes possible to detect with high accuracy any lithium cell that is in an anomalous condition, such as a minute short circuit or the like that is difficult to find.

From the standpoint of enhancement of the accuracy of detection, it is optimum for the detection of the states of charge (the SOCs) of the lithium cells described above to be performed when operation starts or when operation stops, due to the reasons below. For this, it is desirable for the calculation of the variation of the state of charge (the SOC) of the lithium cells to employ the states of charge (the SOCs) that have been detected when operation starts or when operation stops. Since the states of charge (the SOCs) of the lithium cells have a relationship of correlation with the terminal voltages of the lithium cells, accordingly the terminal voltages of the lithium cells are detected, and the states of charge (the SOCs) of the lithium cells are calculated on the basis of these terminal voltages that have been detected. However, in the state in which a load current is flowing, this relationship of correlation between the terminal voltages and the states of charge (the SOCs) changes due to influence of the equivalent internal resistances and so on. Thus, in the state in which operation is started, in order to enhance the accuracy of detection of the states of charge (the SOCs) of the lithium cells, it is desirable to measure the terminal voltages of the lithium cells before any load current is supplied from the lithium battery system, and to calculate the states of charge (the SOCs) of the lithium cells by using the terminal voltages of the lithium cells before the supply of current to the load, i.e. by using the results of this measurement. Moreover, in the state in which operation is stopped, it is desirable to measure the terminal voltages of the lithium cells and to calculate the states of charge (the SOCs) of the lithium cells after the supply of load current from the lithium battery system has stopped. Of course, even when the operation of the lithium battery system is not being started or stopped, it would be possible to measure the terminal voltages of the lithium cells and to calculate the states of charge (the SOCs) of the lithium cells, provided that a state holds in which supply of load current is stopped, and also provided that control is not being performed as described above in order to make the states of charge of the lithium cells uniform.

—Enhancement of Reliability Related to Data Updating and Storage—

Another problem that needs to be solved is enhancement of the reliability of the operation for storage of the data that represents the history data or the usage environment of the lithium battery module, and such enhancement of the reliability related to storage of data is anticipated in the following embodiments. It is repeatedly performed that the operation of reading out the data stored in the writable non-volatile memory representing the history data or the usage environment of the lithium battery module (hereinafter this data stored in the non-volatile memory will be referred to as the "stored data", as a generic term), the operation of updating this stored data, and the operation of writing this updated stored data for a second time (this will hereinafter be termed the "storage updating operation"). If stored data is lost due to a malfunction or the like in the writing operation during this storage updating operation or the like, then it is difficult to ensure the reliability of the battery system. According to the methods explained subsequently in the following embodiments, the limited storage capacity is taken advantage of effectively in order to enhance the reliability of the updating storage operation. A first storage region and a second storage region (hereinafter termed "storage blocks"), i.e. at least two storage regions, are set in the rewritable non-volatile memory, and, if that storage block among the first and second storage blocks in which writing was last performed is the second storage block, then the stored data in the second storage block is read out, it is decided whether or not this stored data that has been read out is normal, and, if it is decided that this stored data is normal, then it is arranged to perform the next writing of the updated stored data into the first storage block, i.e. into the one among the first and second storage blocks that is different from the storage block from which the data was read out. The decision as to whether or not the stored data described above that has been read out is normal is performed according to a technique such as, for example, parity checking or the like.

It should be understood that, if it has been decided that the data read out from the second storage block is anomalous, then updating of the stored data is performed on the basis of the data stored in the first storage block, i.e. in the other storage block, and, the next time that writing is performed, the stored data that has been updated is written into the second storage block, i.e. into that block for which it was decided that the data first read out was anomalous. By performing the updating storage operation in this manner, and by writing the updated stored data into the second storage block while storing the normal data in the first storage block, it is possible to perform the next updating storage operation on the basis of the stored data in the second storage block for which the updating storage operation was most recently written, and it is possible to return to normal operational repetition of the storage updating operation. Even if due to noise or the like some anomaly has temporarily occurred during writing of the stored data, it is possible to stop this anomalous updating storage operation at a minimal stage, and it is possible to return rapidly to normal updating storage operation. Furthermore, along with restraining increase of the memory capacity that is used, it is also possible to maintain high reliability for the updating storage operation.

Other updating storage operations are described in the following embodiments. The operation for reading out the stored data in the second block, that is the storage block in which writing was last performed, and for performing the next writing operation into the first storage block if it is decided that this stored data that has been read out is normal, is the same as the operation described above. The feature by which this operation differs from the operation described above is as follows. When it has been decided that the data that has been read out from the second storage block is anomalous, then it is updated on the basis of the stored data that is stored in the first storage block, and, during the next write, operation is performed to write into both of the storage blocks, i.e. into the first storage block for which the data that was read out was normal and also into the second storage block for which the data that was read out was anomalous. With this method it is possible to continue with the updating storage operation even if some anomaly has occurred in the rewritable non-volatile memory itself, although this is extremely uncommon. The fact that the beneficial effect is obtained of keeping down increase of the memory capacity that is employed is the same as in the case of the method described above.

—Verification of Usage State and Operational State, Analysis of Fault Cause, and Appropriate and Rapid Repairs—

In the embodiments described below, history data is stored in the non-volatile memory that specifies the history of usage environment data describing the state of usage of the lithium battery system and in particular of the lithium cells, the history of changes of state of the lithium cells or of changes of their characteristics along with operation history, and the like. This stored data can be taken out to the exterior, and can be displayed upon a display device. If hypothetically an anomaly has occurred, then it becomes possible to analyze the cause of the anomaly with this function, so that it is possible to utilize this data for improvement of the system in order further to enhance the reliability. Furthermore there are the beneficial effects that it is possible rapidly to bring to light the cause of the fault in an accurate manner, so that repair becomes simple and easy and the reliability is enhanced. Moreover, diagnosis at high accuracy becomes possible by taking advantage of this stored data in diagnosis of the system. In some cases it is not necessarily appropriate for it to be possible for the stored data to be freely read out by all and sundry, and, as explained in connection with the following embodiments, such a system in which data is stored may be provided with a data security function.

—Solution of Yet further Problems—

It should be understood that, in the various methods described above, the fact that it is desirable for the timing for reading out the stored data from the non-volatile memory and the timing for writing the next updated data therein to be when the operation of the battery system starts and when it ends, is as previously described. Moreover, while the methods described above and explained in the following embodiments may be used, not only for a battery system that employs lithium cells, but also for battery systems that employ cells of other types, a larger beneficial effect may be obtained when they are used for a system that employs lithium cells, for which high reliability is very desirable.

In the following, an example of the structure of a device that is suitable for the management method of the battery system described above will be explained with reference to the drawings. The layout of the device will be explained in its entirety, and moreover first through third embodiments will be explained.

In the following discussion, embodiments in which various other problems are solved, and embodiments in which the reliability of the updating storage operation is improved, will be explained. Moreover, in the following embodiments, structure and operation will be described for bringing stored data, including data stored in the battery system, out from the battery system to the exterior thereof By doing this, it is possible to utilize data that is stored in the battery system for inspection or repairs to the battery system, for bringing to light the cause of an occurrence related to an abnormality, or for reusing the battery module. In the following embodiments, in order to enhance the reliability of this stored data, functions are provided for making it difficult for a third party to perform operations upon the data, and these will be explained during the description of the following embodiments.

—The First Embodiment—

While the battery system described in this embodiment is optimized for usage as a power supply system to be mounted in a vehicle, it could also be employed as a power supply system for a railroad vehicle or for an industrial machine. Among such power supply systems, a battery system that is optimum for use as a power supply system for a vehicle will be explained as a representative example. It should be understood that, in the explanation above and below, the term "calculate" refers not only to the operation of calculation, but also is used to include and to mean operations such as storage of values calculated in advance in a memory, reading out of data stored in the memory, obtaining values proved to be suitable by experiment and storing them in the memory, reading out values obtained by experiment from the memory, and so on.

—Structure of the Battery System—

FIG. 1 is a block diagram showing an example of the structure of a battery system according to the present invention. This battery system includes a battery module 10 in which a plurality of cell groups are connected in series, with a plurality of lithium cells (in this embodiment, four) being connected in series in each cell group, a cell controller 80 (hereinafter sometimes abbreviated as "C/C"), a battery controller 20, a current meter SA, and a voltage meter SV. In the actual battery system, a plurality of battery modules of this type are connected in series-parallel. Moreover, the details of the battery module 10 and of the cell controller 80 will be described hereinafter.

The battery controller 20 is mounted to the vehicle, and operates by receiving low voltage electrical power from a low voltage system DC power supply 14, such as, for example, a 14 volt system power supply. Moreover, via a transmission path 112, the battery controller 20 performs sending and reception of information relating to the onboard battery system to and from an external controller 111 and so on, including an external higher ranking control device.

The battery module 10 includes a plurality of groups GB1, ... GBM, ... GBN, and each of these groups includes a plurality of lithium cells BC1 through BC4 connected in series. In this embodiment each of these groups has four lithium cells, and integrated circuits (hereinafter sometimes termed "ICs") 3A, 3L, and 3N, are respectively provided corresponding to the groups GB1, GBM, GBN for detecting the terminal voltages of the cells BC1 through BC4 that make up each of the groups, and for performing diagnosis thereof. It should be understood that the number of lithium cells that make up each of the groups is not necessarily limited to being four; it would also be acceptable for each of the groups GB1, GBM, GBN to include six cells, and indeed some other number would also be acceptable. Moreover, the number of lithium cells included in each of the groups may vary between the groups; for example, it would be acceptable to arrange for some group or groups to include four lithium cells, while some other group or groups include six lithium cells.

The number of lithium cells included in each of the groups GB1, GBM, GBN is determined in consideration of the relationship between the terminal voltages of the lithium cells and the withstand voltages of the integrated circuits (hereinafter sometimes termed "ICs"), and is desirably around 4 to 6 or 10. The number of lithium cells included in the battery module 10 is determined in consideration of the electrical power used by the load and the voltage to be supplied to the load; the number of lithium cells connected in series in the battery module 10 may, for example, be from several tens to several hundreds. The number of lithium cells included in each of the groups is determined by dividing the total number of cells used in the lithium battery module 10. An integrated circuit is provided to correspond to each of the groups, and, when the number of lithium cells included in a group increases, the terminal voltage of that group becomes higher, so that the voltage applied to its integrated circuit also becomes higher.

The terminal voltage of each of the lithium cells changes with the state of charge (i.e. the SOC) of that lithium cell; for example, in a state of charge (a SOC) of around 30% the terminal voltage may be around 3.3 volts, while in a state of charge (a SOC) of around 70% the terminal voltage may become around 3.8 volts. In the over-discharged state in which the lithium cell is discharged beyond its normal operational range, sometimes the terminal voltage of the cell becomes, for example, 2.5 volts or less; and moreover, in the overcharged state in which the cell is charged beyond its normal operational range, sometimes the terminal voltage of the cell becomes, for example, 4.2 volts or greater. It should be understood that the above described state of charge (SOC) has a relationship of correlation with the terminal voltage of the lithium cell in the no load state, and, by measuring the terminal voltage of each of the lithium cells BC1 through BC4, it is possible to ascertain their respective states of charge.

If a group is made up of four lithium cells connected in series, then the voltage between the terminals of the group in the above described overcharged state becomes 16.8 volts, while if a group is made up of six lithium cells connected in series, then the voltage between the terminals of the group of lithium cells becomes 25.2 volts. When the number of lithium cells making up the group becomes great, it becomes necessary for the withstand voltage of its integrated circuit to be made high, and the number of lithium cells that make up each of the groups is determined by the relationship with the withstand voltage of the integrated circuits. In this embodiment of the present invention the number of lithium cells that make up each of the groups is from 4 through 6, and at the greatest is 10, due to reasons such as the relationship with the withstand voltage of the integrated circuits, making it easy to perform measurement of the terminal voltages of the cells BC1 through BC4, and so on.

In FIG. 1, each of the group BG1 [sic], the group GBL, and the group GBN consists of cells BC1 through BC4, and, while further groups are present between the group BG1 and the group GBL and between the group GBL and the group GBN, these groups are omitted in order to avoid complication of the explanation, because each of them has a similar structure.

The cell controller 80 includes the integrated circuits 3A, 3L, 3N corresponding to the groups of lithium cells that make up the battery module 10, and, in order to detect the terminal voltages of the lithium cells that make up its corresponding group, each of the integrated circuits is provided with terminals V1, V2, V3, V4, and GND for voltage detection, with each of these terminals V1 through V4 and GND of the integrated circuits being connected to a positive electrode and/or to a negative electrode of the lithium cells that make up the groups. Moreover, each of the integrated circuits 3A through 3N is provided with transmit and receive terminals (RX, TX, FFI, and FFO) for signal transmission, and these transmit and receive terminals of each of the integrated circuits are electrically connected in series with the transmit and receive terminals of the neighboring one of the integrated circuits 3A through 3N as will be explained hereinafter, so that signal transmission is performed by the integrated circuits 3A through 3N and the battery controller 20 via a signal transmission path 112 (refer to FIG. 1). By connecting the signal transmission path in this manner, the electrical potential at the GND terminal that constitutes the base of each of the integrated circuits 3A through 3N changes gradually, so that the potential difference between the transmit and receive terminals of adjacent ones of the integrated circuits becomes equal to the group terminal voltage of the group of lithium cells.

Along with detecting the voltages of the cells BC1 through BC4 that make up the respectively corresponding one of the groups GB1 through GBN, each of the integrated circuits 3A through 3N is also provided with control terminals B1 through B4 for individually adjusting the SOCs of the lithium cells BC1 through BC4 to which the integrated circuits 3A through 3N correspond, in order to make the SOCs (States Of Charge) of all of the cells in all of the groups uniform. While this matter will be explained in detail hereinafter (FIG. 2), series circuits each consisting of a resistor R1 through R4 for adjusting the state of charge and a switching element 129A through 129B that consists of a semiconductor element are connected in parallel with each of the lithium cells BC1 through BC4. By the switching elements 129A through 129B of those ones of these series circuits that are connected in parallel with those of the cells whose states of charge are high being made continuous, and by the stored electrical power in those cells whose states of charge are high being discharged via the resistors for state of charge adjustment, it is aimed at for each of the integrated circuits 3A through 3N to make the states of charge uniform.

Each of the integrated circuits 3A, 3L, and 3N has the function of detecting an anomalous condition of the lithium cells BC1 through BC4 that make up the corresponding group among the groups GB1 through GBN. All of these integrated circuits have the same construction, and each of the integrated circuits includes a terminal voltage measurement circuit for each of its cells, a state of charge adjustment circuit, and an anomalous condition detection circuit. Anomalous conditions that are detected by the integrated circuits 3A through 3N are overcharge or over-discharge of the lithium cells, temperature elevation anomalies, and anomalies relating to the internal operation of the integrated circuits. As will be described hereinafter, other representative anomalies that are detected by the battery controller 20 are minute short circuits inside the lithium cells and other deterioration internal to the lithium cells, interruption of lines in the connection circuits between the terminals of the lithium cells and the integrated circuits 3A through 3N, and interruption of lines in the signal transmission paths. Threshold values for detection of anomalies by the integrated circuits may be set from the battery controller 20, and thereby detection conditions for anomalous conditions in the integrated circuits, including permitted ranges for the overcharged and over-discharged states of the lithium cells, are set so that anomaly determination can be performed. This means that, even when the integrated circuits have detected an anomaly with the lithium cells, in terms of the possibility of damage to the battery system and so on, the above described permitted range is still respected, so that the situation has not yet deteriorated to the point of failure.

—Signal Transmission Paths of the Battery System—

Figure 7:
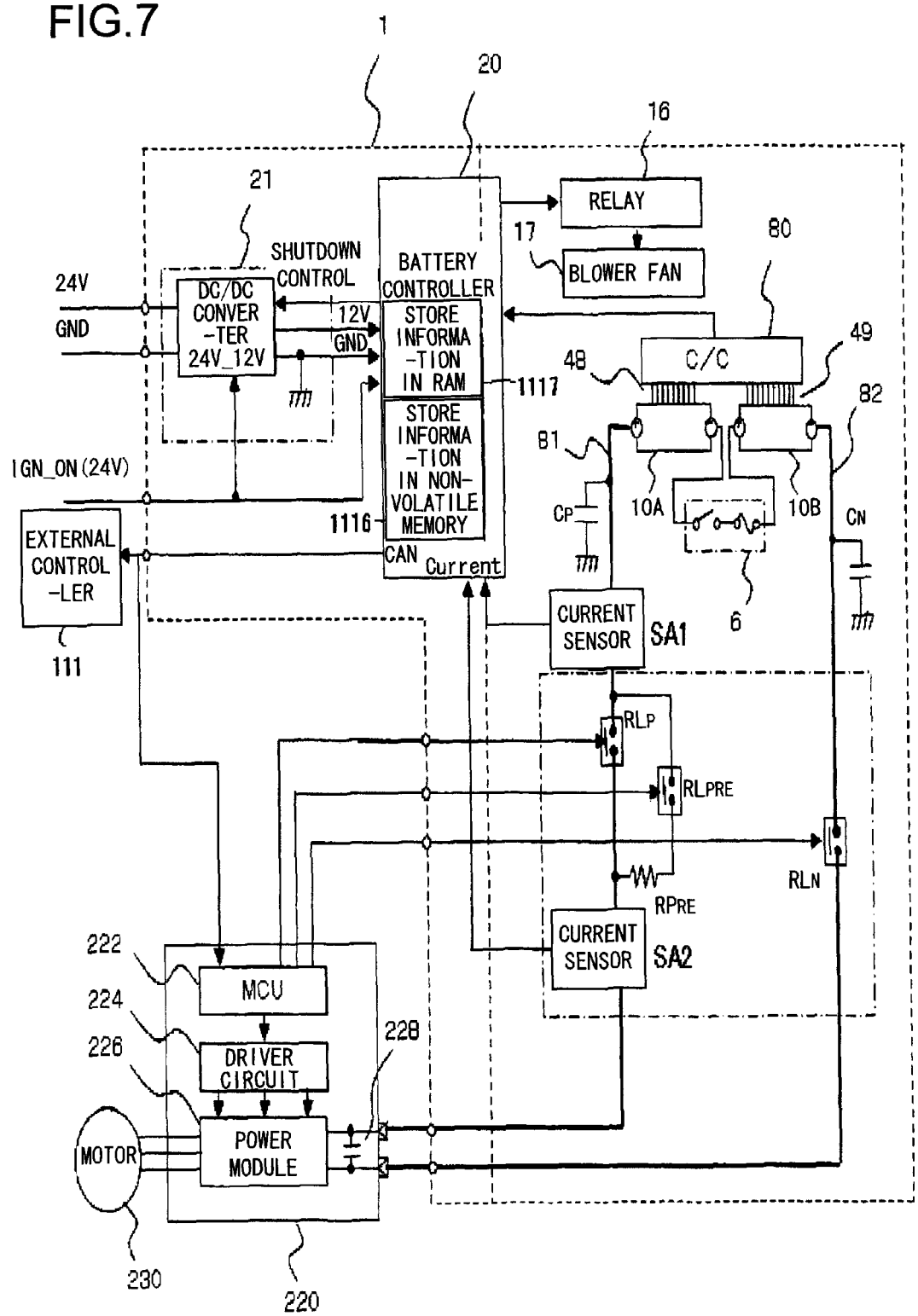
FIG. 7 is a block diagram for explanation of a lithium battery system.

The relationship of connection and operation between the integrated circuits 3A through 3N that are built as semiconductors is shown in FIG. 7, where for the battery controller 20 two battery modules 10 and two cell controllers 80 are provided, one among these being described in FIG. 1. Signal transmission between the integrated circuits 3A through 3N and the battery controller 20 is performed via a communication harness 50 and an interface that is provided with an input side interface INT(E) and an output side interface INT(O).

—Transmission of Information between the Integrated Circuits—

Since the battery controller 20 operates upon electrical power from the low voltage DC power supply 14 that takes the body of the vehicle as reference potential, accordingly it operates at a voltage lower than 12 V, for example at 5 volts (refer to FIG. 1), when the potential of the vehicle body is taken as a reference potential. The other integrated circuits 3A through 3N operate upon electrical power from the groups of lithium cells to which they correspond, these being power supply systems with different potentials from that of the vehicle body described above, and, since the potentials of these groups are different, their corresponding reference potentials (i.e. their ground potentials) are different. Furthermore, since the terminal voltages of the various lithium cells change on the basis of their states of charge SOC, accordingly the potential of each group of the battery module 10 changes on the basis of its state of charge SOC, and as a result the relationships between the electrical potentials of the various integrated circuits 3A through 3N are always changing. The integrated circuits 3A through 3N detect the terminal voltages of the lithium cells that make up the corresponding groups within the battery module 10, or perform discharge control for adjusting the states of charge SOC of the cells in their corresponding groups. The power for performing these operations is supplied from the lithium cells that make up the corresponding group. In this embodiment, the reference potentials of the integrated circuits are determined on the basis of the potentials of the groups to which they are related. For each of the integrated circuits, the GND terminal that becomes its reference potential is connected to the negative terminal of that lithium cell that is at the minimum level of potential of the corresponding cell group, and the integrated circuit operates by taking this potential at the negative terminal of that lithium cell that is at the minimum level of potential of the corresponding cell group as its reference potential (i.e. as its ground potential).

The power supply system for the battery controller 20 and the power supply system for the cell controller 80 are different. Since it is necessary for the communication harness 50 connected to the battery controller 20 to be electrically insulated from transmission paths 52 and 54 that are serially connected within the integrated circuits 3A through 3N, accordingly an input side interface INT(E) and an output side interface INT(O) that operate as insulating circuits are provided to the input sides and to the output sides of the transmission paths 52 and 54 respectively. Since photocouplers having circuit structures that temporarily convert the electrical signals into optical signals and then convert them back into electrical signals are used in these interfaces INT(E) and INT(O), accordingly electrical insulation is maintained between the transmission path of the battery controller 20 and the transmission path of the cell controller 80.

Command information and data information are transmitted from the transmit terminal TX of the battery controller 20; this transmitted information is received at the receive terminal RX of the integrated circuit 3A via a photocoupler PH1 within the input side interface INT(E); on the basis of the above described received information, information is sent from the transmit terminal of the integrated circuit 3A to the next integrated circuit and is received at the receive terminal RX of the integrated circuit 3L; information transmitted from the transmit terminal TX of the integrated circuit 3L passes through the integrated circuits in order; is received at the receive terminal RX of the integrated circuit 3N; is transmitted from the transmit terminal TX of the integrated circuit 3N; and is received at the receive terminal RX of the battery controller 20 via a photocoupler PH3 in the output side interface INT(O). In this manner, a loop shaped communication path is provided and serial communication is performed via this loop shaped communication path, and thereby measured values and diagnosis results are received by the battery controller 20, such as the terminal voltages and the temperatures of the cells, the results of diagnosis of the cells, the internal states of the integrated circuits, the results of diagnosis related to connection between the integrated circuits and the cells, and so on.

Furthermore, each of the integrated circuits 3A through 3N is of the same construction, and it is necessary to determine the addresses of the integrated circuits 3A through 3N when initially starting up the battery system. According to requirements, the battery controller 20 transmits address assignment command information from its transmit terminal TX and the integrated circuits 3A through 3N receive this command information, specify their own addresses, and transmit this command information to the next integrated circuits. Address assignment is performed in order by this transmission of command information as the command information is transmitted to the next integrated circuits, and it can be confirmed that the address assignment operation is completed when the command information returns back to the receive terminal RX of the battery controller 20. Due to this it is possible for the circuit construction of each of the integrated circuits 3A through 3N to be the same, so that the mass production of the integrated circuits is facilitated, and moreover difficulty in the wiring process is eliminated.

Furthermore, when the operation of the battery system stops, it is arranged for the integrated circuits 3A through 3N to go into a sleep state in order to keep down the consumption of electrical power; and, when the operation of the battery system starts, it is arranged for the battery controller 20 to send the command information "wake up" to the integrated circuits 3A through 3N via this transmission path, so that they automatically transit from the sleep state to the waking state. Accordingly, when a communication command 292 is transmitted from the battery controller 20, each of the integrated circuits 3A through 3N transits from its sleep state to its operational state.

In this embodiment, the transmission path within the battery system is built as a return loop for transmission from the battery controller 20, via the integrated circuits 3A through 3N, and back to the battery controller 20 again. Since, in this embodiment, the information that has been transmitted from the transmit terminal TX of the battery controller 20 returns via the transmission loop back at the receive terminal RX of the battery controller 20 for a second time, accordingly it is possible to check whether or not this command information has been correctly transmitted, so that the reliability is enhanced. If an anomaly occurs partway through transmission of the command information due to the influence of noise or the like, then it is possible simply and easily to detect the occurrence of this anomaly, since the correct command information is not returned back to the receive terminal RX of the battery controller 20. And, assuming that a slight reduction in enhancement of the reliability can be tolerated, then it will be acceptable to arrange not to form the transmission path in the shape of a loop, but just to transmit from the battery controller 20 via the integrated circuit 3A to the integrated circuit 3N, and to terminate the transmission operation at this integrated circuit 3N. Moreover, although the time period for transmission would become longer, it would be acceptable not to return the information transmitted to this integrated circuit 3N back from this integrated circuit 3N to the battery controller 20, but instead to return it to the integrated circuit 3A for a second time, and then to return it back from this integrated circuit 3A to the battery controller 20.

—The High Speed Transmission Path for Anomaly Signals—

Each of the integrated circuits 3A through 3N repeatedly performs diagnosis of the lithium cells BC1 through BC4 that make up its corresponding group and diagnosis of its own internal operation on a predetermined cycle, and a transmission path, separate from the transmission path described above, is provided for automatically reporting the results of this anomaly information diagnosis at high speed, even if no command is received from the battery controller 20, so that single-bit information indicating the presence or absence of an anomaly is transmitted to the battery controller 20 via this transmission path. If one of the integrated circuits 3A through 3N detects an anomaly in the lithium cells BC1 through BC4 in the group that corresponds to that circuit, if one of the circuits detects an anomaly in its own operation, or if an anomaly signal indicating an anomaly arrives at the receive terminal FFI from the integrated circuit that is positioned before this one in the transmission path, then this integrated circuit transmits an anomaly signal from its transmit terminal FFO to the next integrated circuit. On the other hand, if a signal indicating an anomaly that is already being received at its receive terminal FFI ceases, if by itself it determines that the details of its anomaly decision have changed, or if the anomalous condition has disappeared, then this integrated circuit changes over the signal transmitted from its transmit terminal FFO from an anomaly signal to a normal signal. Although this anomaly signal is a single-bit signal, it would also be acceptable for its number of bits to be increased. While in principle no anomaly signal is ever transmitted from the battery controller 20 to the integrated circuits 3A through 3N, it is very important to confirm that the transmission path for anomaly signals is operating correctly, so that, in order to diagnose the transmission path, a test signal, i.e. a pseudo-anomaly signal, can be transmitted from a terminal FFTEST of the battery controller 20, and it is possible to diagnose whether or not the above described transmission path for anomaly signals is operating normally by checking whether or not it is possible to receive this pseudo-anomaly signal at the terminal FF of the battery controller 20.

The transmission path for the above described anomaly signal connects from the transmit terminal FFTEST of the battery controller 20 via a photocoupler PH2 of the input side interface INT(E) to the receive terminal FFI of the integrated circuit 3A, and then connects from the transmit terminal FFO of the integrated circuit 3A via the integrated circuits not shown in the figures to the receive terminal FFI of the integrated circuit 3L. Further, this circuit is sequentially connected in the above manner, then connects to the receive terminal FFI of the integrated circuit 3N, and then connects from the transmit terminal FFO via a photocoupler PH4 of the output side interface INT(0) to the receive terminal FF of the battery controller 20. Since the above described transmission path of the anomaly signal is formed in a loop shape, accordingly it is possible to perform transmission route diagnosis by sending and receiving a pseudo-anomaly signal from the battery controller 20, so that the reliability of the system is enhanced. Moreover the beneficial effect is obtained that it is possible to deal with the occurrence of an anomaly rapidly, since, as described above, an anomalous condition is transmitted rapidly to the battery controller 20 by the integrated circuit that has detected the anomalous condition sending an anomaly signal to the next integrated circuit even though it has not received any transmit command from the battery controller 20.

The current supplied from the battery module 10 to the load is detected by the current meter SA and the battery controller receives the output of the current meter SA, and thereby the current outputted from the battery module 10 is detected. Moreover, the terminal voltage of the entire battery module 10 is measured by the voltage meter Vd, so that it is possible for to detect the total voltage supplied from the battery module 10 to the load from the output of the voltage meter Vd. From this voltage meter and current meter it is possible to detect the usage environment, i.e. in what state the battery module 10 is being used, and it is possible to store this information in the rewritable non-volatile memory. In particular, by storing the highest voltage and the maximum current in the rewritable non-volatile memory, it is possible to check the usage environment of the battery module 10 afterwards, and in particular, if the battery module 10 has been used in an anomalous state, then this state is initially held in volatile memories (hereinafter termed "RAM") of the integrated circuits that are housed internally to the battery module 10 or the cell controller 80 that will be described hereinafter, and then is stored in the rewritable non-volatile memory, for example on the basis of the key switch of the vehicle being turned OFF, or the like.

—Summary of the Cell Controller ICs of the Cell Controller 80—

Figure 2:
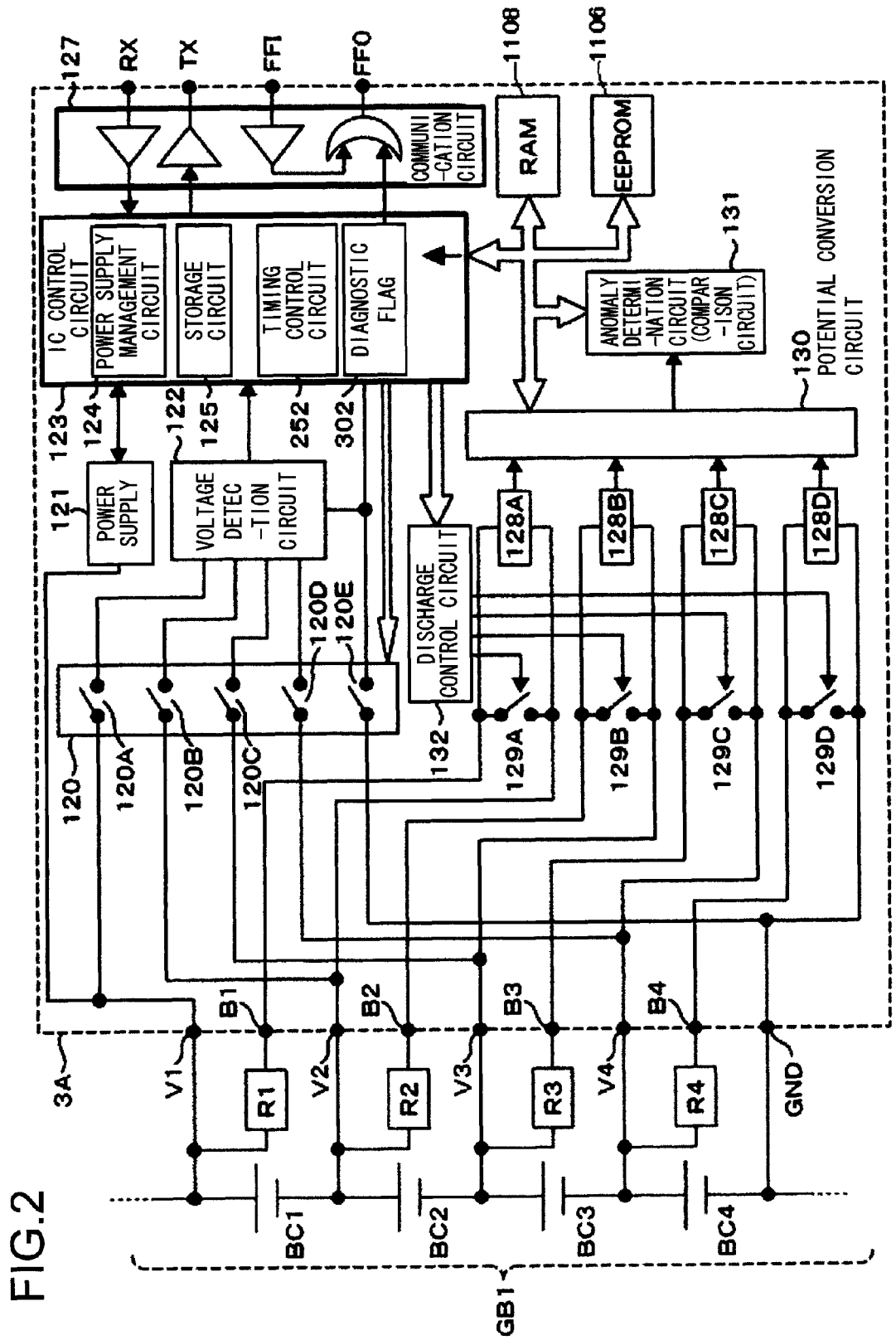
FIG. 2 is a block diagram showing a summary of a cell controller.

FIG. 2 is an block electronic circuit diagram showing an embodiment of the integrated circuit 3A. Each of the integrated circuits 3A through 3N has the same circuit structure, and accordingly the integrated circuit 3A will be explained as a representative example. Input side terminals V1 through V4 of the integrated circuit 3A are respectively connected to the positive terminals of the lithium cells BC1 through BC4 that make up the corresponding group GB1, and its GND terminal is connected to the negative electrode side of the lowest ranking lithium cell BC4. The terminal voltages of the lithium cells BC1 through BC4 are respectively inputted to a selection circuit 120 via the input terminals V1 through V4 and GND. The selection circuit 120 includes a multiplexer, and has switches 120A through 120E. By changing over the connections of these switches 120A through 120E in a predetermined order, the terminal voltages of the lithium cells BC1 through BC4 are inputted to a voltage detection circuit 122, and are converted into digital values by the voltage detection circuit 122.

The terminal voltage of the corresponding group GB1 is inputted to the input terminal V1 and GND of the integrated circuit 3A, and this terminal voltage of the group GB1 is supplied to a power supply circuit 121. The power supply circuit 121 includes a DC/DC converter and so on, and converts this voltage that is supplied into a predetermined constant voltage that is then supplied as a power supply voltage to the various circuits within the integrated circuit 3A. Furthermore, this voltage is supplied to an analog comparison circuit as a comparison reference voltage for state determination. The power management circuit 124 is adapted to manage the state of this power supply circuit 121.

After conversion into digital values by the voltage detection circuit 122, the terminal voltages of the cell group GB 1 are inputted to an IC control circuit 123, and are stored in an internal storage circuit 125. Along with including a calculation circuit, this IC control circuit 123 also includes the storage circuit 125, the power supply management circuit 124, and a timing control circuit 252 for periodically performing detection of the various voltages and state diagnosis. The storage circuit 125 includes a volatile memory (i.e. a RAM) that consists of, for example, register circuits, and a rewritable non-volatile memory, and stores the terminal voltages of the lithium cells BC1 through BC4 detected by the voltage detector 122 in correspondence with those lithium cells BC1 through BC4, as well as storing other detected values in addresses determined in advance, so that they can be read out.

The integrated circuit stores temporarily the above described measured values and the results of diagnosis by an anomaly determination circuit 131 that will be described hereinafter in a volatile memory RAM, and by also writing this content into a rewritable non-volatile memory, for example an EEPROM. History data is stored in the above described rewritable non-volatile memory, based upon data indicating the usage environment of the lithium cells BC1 through BC4 of the corresponding group, and on one or more parameters indicating operation history. The method for storing this data will be described hereinafter. For example, the maximum terminal voltages or the minimum terminal voltages of the lithium cells, their maximum temperatures, their time periods of use, the number of times they have been used, and the like, are examples of this data indicating the usage environment. And the terminal voltages of the lithium cells, their states of charge (the SOCs), the deviations of their states of charge, and the like are examples of the history data based upon data of various types when the previous episode of operation stopped and upon the parameters described above. The IC control circuit 123 and the volatile memory or the rewritable non-volatile memory are connected to the communication circuit 127, and are transmitted to the battery controller 20 via this communication circuit 127.

The integrated circuit 3A includes the communication circuit 127 for transmitting and receiving signals such as commands and data and the like, and input and output terminals for these signals. An example is when a communication command is received at the RX terminal from the battery controller via the photocoupler PH1 of the input side interface INT (E). The communication command is sent from the communication circuit 127 to the IC control circuit 123 that decrypts the contents of the communication command, and processing is performed according to the contents of the communication command. Examples of such communication commands include a communication command that requests the integrated circuit 3A to transmit the measured values of the terminal voltages of the lithium cells BC1 through BC4, a communication command that commands the integrated circuit 3A to perform discharge operation in order to adjust the states of charge of the cells BC1 through BC4, a communication command ("wake up") that commands the start of operation of the integrated circuit 3A, a communication command ("sleep") that commands stoppage of the operation of the integrated circuit 3A, a communication command that requests the integrated circuit 3A to set an address, and so on. Commands for reporting the contents stored in the integrated circuit 3A and in the above described volatile memory and commands for reporting the contents stored in the rewritable non-volatile memory are also included.

—Operation to make the SOCs Uniform—

The positive terminal of the lithium cell BC1 is connected to an input terminal B1 via a resistor R1, with this input terminal B1 being connected to one terminal of an operational state detection circuit 128A of a balancing switch 129A, and moreover with the other input terminal of the operational state detection circuit 128A of this switch 129A being connected to the negative terminal of the lithium cell BC1 via a terminal V2. Furthermore, the series circuit of the resistor R1 and the balancing switch 127A is connected between the terminals of the lithium cell BC1. The opening and closing of this balancing switch 129A is controlled by a discharge control circuit 132. In a similar manner, the positive terminal of the lithium cell BC2 is connected to an input terminal B2 via a resistor R2, with this input terminal B2 being connected to one terminal of an operational state detection circuit 128B of a balancing switch 129B, and moreover with the other input terminal of the operational state detection circuit 128B of this switch 129B being connected to the negative terminal of the lithium cell BC2 via a terminal V3. Furthermore, the series circuit of the resistor R2 and the balancing switch 127B is connected between the terminals of the lithium cell BC2. The opening and closing of this balancing switch 129B is controlled by the discharge control circuit 132. In a similar manner, the positive terminal of the lithium cell BC3 is connected to an input terminal B3 via a resistor R3, with this input terminal B3 being connected to one terminal of an operational state detection circuit 128C of a balancing switch 129C, and moreover with the other input terminal of the operational state detection circuit 128C of this switch 192C being connected to the negative terminal of the lithium cell BC3 via a terminal V4. The series circuit of the resistor R3 and the balancing switch 127C is connected between the terminals of the lithium cell BC3. The opening and closing of this balancing switch 129C is controlled by the discharge control circuit 132. And the positive terminal of the lithium cell BC4 is connected to an input terminal B4 via a resistor R4, with this input terminal B4 being connected to one terminal of an operational state detection circuit 128D of a balancing switch 129D, and with the other input terminal of the operational state detection circuit 128D of this switch being connected to the negative terminal of the lithium cell BC4 via the terminal GND. The series circuit of the resistor R4 and the balancing switch 127H is connected between the terminals of the lithium cell BC4. The opening and closing of this balancing switch 129D is controlled by the discharge control circuit 132.

The operational state detection circuits 128A through 128D of the balancing switches 129A through 129D repeatedly detect the voltages between the two sides of the corresponding balancing switches 129A through 129D on a predetermined cycle, and detect whether or not the balancing switches 129A through 129D are normal. These balancing switches 129A through 129D are switched for adjusting the states of charge of the cells BC1 through BC4, and, if there is any anomaly with these switches, then there is a danger that it may become impossible to control the states of charge of the cells, and that the cells may become overcharged or overdischarged.

An anomaly with the balancing switches 129A through 129D may be detected if, for example, irrespective of whether or not some one of the balancing switches is in the continuous state, the terminal voltage of the corresponding balancing switch exhibits the terminal voltage of its cell. In this case, it may be concluded that this balancing switch is not going into the continuous state on the basis of its control signal. On the other hand if, irrespective of the fact that the control signal for some one of the balancing switches is trying to put this balancing switch into the open state, the terminal voltage of the corresponding balancing switch exhibits a low value as compared to the terminal voltage of its cell, then it may be concluded that this balancing switch is in the continuous state irrespective of the value of its control signal. Voltage detection circuits including differential amps or the like are used as the operational state detection circuits 128A through 128D of these switches 129A through 129D, and the above described decisions are made by an anomaly determination circuit 131 that will be described hereinafter, by comparison with a constant voltage.

The balancing switches 129A through 129D may, for example, be made with MOS type FETs, and, by putting one of these switches into the closed state, the electrical power accumulated in the respectively corresponding one of the lithium cells BC1 through BC4 is discharged. Electrical loads such as an inverter or the like are connected to the battery module 10 in which a large number of cells are connected in series, and the supply of current to these electrical loads is performed from all of the large number of cells connected in series all together. Moreover, for example in the regenerating state, the supply of regenerated current to charge up the battery module 10 from an electrical load is performed to all of the large number of cells connected in series all together. The supply of current by a large number of cells that are connected in series is limited by the state of that cell, among the large number of cells, that is in the most discharged state, in other words is limited by the state of the cell whose SOC is the lowest. On the other hand, when regenerated current is being supplied from an electrical load, the supply of this current is limited by the state of that cell, among the large number of cells, that is in the highest charged state, in other words is limited by the state of the cell whose SOC is the highest. Due to this, for those cells among the large number of cells that are connected in series that are, for example, in states of charge greater than the average state, the balancing switches that are connected to those cells are put into the continuous state, so that discharge currents flow via the resistors that are connected in series therewith. Due to this, control is performed in the direction that mutually brings the states of charge of the cells that are connected in series towards the same level. Furthermore, there is also another method in which the cell that is in the most discharged state is taken as a reference cell, and discharge of the other cells is performed on the basis of the differences between them and this reference cell. There are various other methods for adjusting the states of charge (SOCs). The states of charge of the cells may be obtained by calculation on the basis of the terminal voltages of the cells. Since there is a relationship of correlation between the states of charge of the cells and the terminal voltages of those cells, accordingly it is possible to bring the states of charge of the cells to the same level by controlling the opening and closing of the balancing switches 129 so as to bring the terminal voltages of the cells to the same level.

The voltages between the sources and the drains of the FETs that are detected by the operational state detection circuits 128A through 128D of the balancing switches 129A through 129D are outputted to a potential conversion circuit 130. Since the potentials of the sources and the drains of the FETs with respect to the reference potential of the integrated circuit 3A are different from one another and it is difficult to perform decision by comparing them together just as they are, accordingly they are converted into potential differences by the potential conversion circuit 130 that includes differential amps and so on, and anomaly determination is then performed by the anomaly determination circuit 131. The potential conversion circuit 130 also is endowed with a function of selecting a balancing switch 129 for which diagnosis is to be performed on the basis of a control signal from the IC control circuit 123. The voltage of the balancing switch 129 that has been selected is sent to the anomaly determination circuit 131, and the anomaly determination circuit 131 compares the terminal voltage of the balancing switch 129 for which diagnosis is to be performed, that is the signal from the potential conversion circuit 130 based upon the control signal from the IC control circuit 123, with a decision voltage, and makes a decision as to whether or not the balancing switch 129A1 through 129D is anomalous.

Information is sent via the transmission path from the battery controller 20 of FIG. 1 to the integrated circuits 3A through 3N, related to the ones of the lithium cells, among the lithium cells for the corresponding group, for which discharges are required, and related to the time intervals for continuity that are required for these discharges. On the basis of commands from the battery controller 20 that have arrived at the integrated circuits, the IC control circuits 123 issue command signals to their discharge control circuits 132 to make the balancing switches 129 corresponding to the cells that are to be discharged go continuous, and, on the basis of these command signals, the discharge control circuits 132 apply gate voltage to the balancing switches 129A through 129D that are built from MOS type FETs for making them go continuous, so that the operation of making the switches go continuous is performed.

If an anomaly of the balancing switches 129A through 129D has been detected by the anomaly determination circuit 131, then, according to the signal from the discharge control circuit 132, it is specified in which of the balancing switches 129A through 129D the anomaly is present, and this information is outputted to the IC control circuit 123. Furthermore, the anomaly signal that has been detected is stored in a volatile memory RAM within the integrated circuit. The IC control circuit 123 described above outputs the anomaly of the balancing switches 129A through 129D from the single-bit transmit terminal FFO of the communication circuit 127 and sends it to the communication circuits 127 of the following integrated circuits, and finally single-bit information indicating an anomaly is sent to the battery controller 20. Moreover, on the basis of a command from the battery controller 20, the IC control circuit 123 transmits the anomaly of the balancing switches 129A through 129D and information specifying in which one of the balancing switches this anomaly is present to the battery controller 20 via the transmit terminal TX of the communication circuit 127. And, upon reception of this anomaly signal, the battery controller 20 temporarily stores it in a volatile memory RAM internal to the battery controller 20. And data specifying the measured values and the results of diagnosis stored in the volatile memories RAM of the integrated circuit and the battery controller 20 is stored in a rewritable non-volatile memory (EEPROM). As the timing for this storage, for example, the time point at which the key switch of the vehicle is turned OFF is appropriate.

—Explanation of the Communication Means and the Transmission Path—

Figure 3:
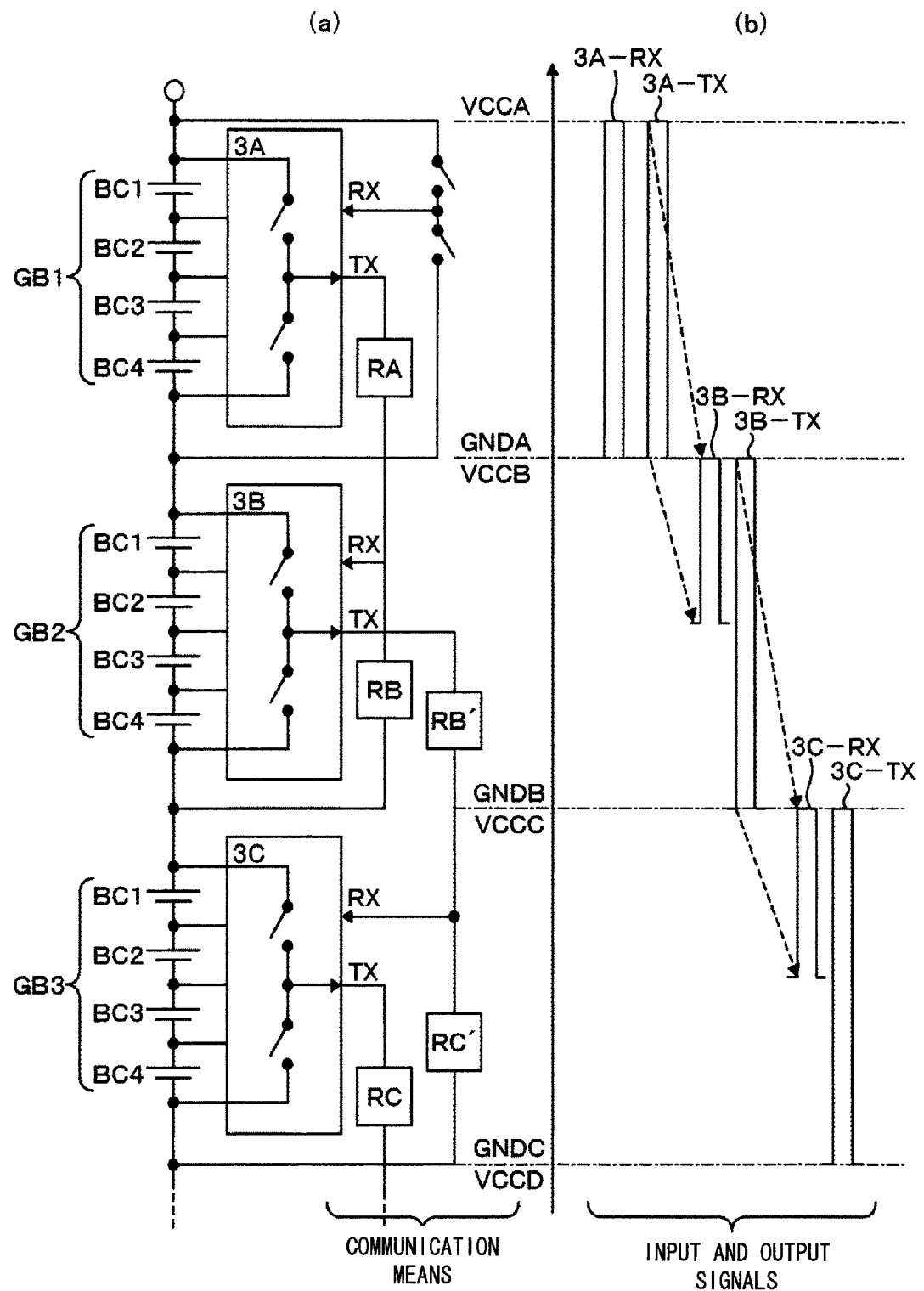
FIG. 3 is an explanatory figure for explanation of transmission of information related to an abnormality by connections between cell controller ICs.

FIG. 3 is an explanatory figure showing the method of transmitting and receiving signals between the integrated circuits 3A through 3N. FIG. 3(*a*) shows a signal 3A-RX received at the terminal RX of the integrated circuit 3A and a signal 3A-TX transmitted from the terminal TX of the integrated circuit 3A, further shows a signal 3B-RX received at the terminal RX of the next integrated circuit 3B and a signal 3B-TX transmitted from the terminal TX of the next integrated circuit 3B, and even further shows a signal 3C-RX received at the terminal RX of the next integrated circuit 3C and a signal 3C-TX transmitted from the terminal TX of that integrated circuit 3C. The signal 3A-TX is voltage divided by a resistor RA within the integrated circuit 3A and a resistor RB within the integrated circuit 3B to create the signal 3B-RX, and the signal 3B-TX is voltage divided by a resistor Rif within the integrated circuit 3B and a resistor RC within the integrated circuit 3C to create the signal 3C-RX. And the voltage level of the received signal is determined by further voltage division by various resistors internal to the further integrated circuits connected in series on the communication path.

FIG. 3(b) shows the voltage levels of the signals 3A-RX, 3A-TX, 3B-RX, 3B-TX, 3C-RX, and 3C-TX. In this manner, from the group GB1 whose voltage level is the highest ranking towards the groups on its downstream side, it is arranged to set the threshold value voltages to voltages intermediate between the voltage sum corresponding to four cells and voltage sum corresponding to two cells. The reason for this is in order to avoid the inconvenience that the low level of that signal would become ½ of the total voltage applied to the integrated circuit 3B, when an attempt were to be made to decide upon the signal from the TX terminal of the integrated circuit 3A with the same threshold value as the integrated circuit 3A while based on the voltages of the cells managed by the integrated circuit 3B as reference. It should be understood that, while the above explanation supposes that the signal level described above is transmitted from the high potential side to the low potential side, it is also possible to perform level shifting in a similar manner for transmission from the low potential side to the high potential side by division with resistances.

—Diagnosis and Measurement: (1) Summary of the Operating Schedule—

Figure 4:
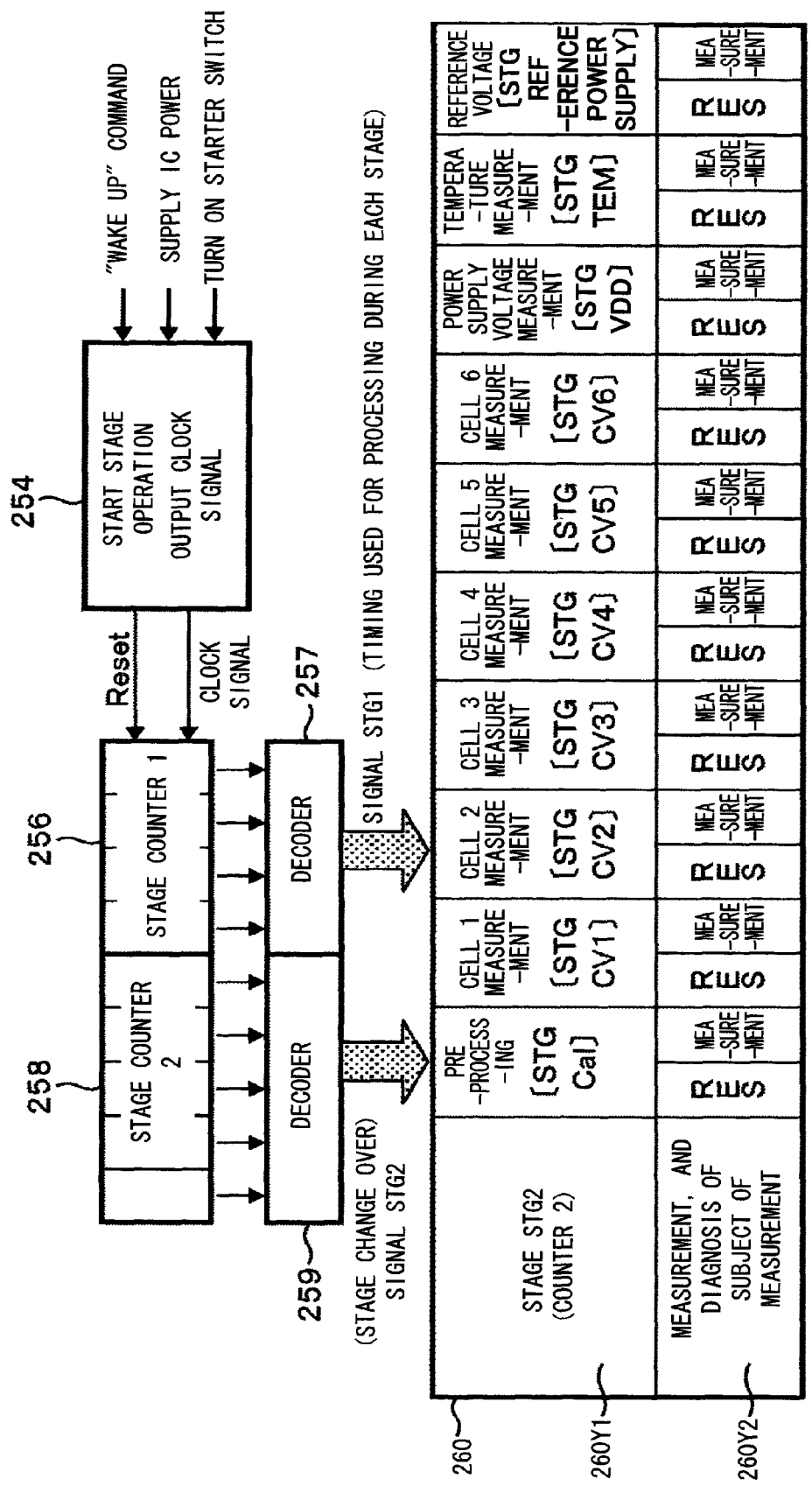
FIG. 4 is a figure for explanation of the processing timing of a cell controller.

The circuitry and operation for measurement by the integrated circuits 3A through 3N shown in FIG. 1 of the lithium cell voltages will now be explained with reference to FIGS. 4 through 6B. FIG. 4 is a figure for explanation of the timing of the operation of measurement. Along with the operation of measurement, each of the integrated circuits 3A through 3N is also provided with a function of performing diagnosis operation, and performs measurement repeatedly at the operational timing shown in FIG. 4, while also executing diagnosis in synchronization with these measurements. And FIGS. 6A and B are a detailed circuit of the selection circuit 120, the voltage detection circuit 122, and the storage circuit 125 that stores the voltages of the integrated circuits 3A through 3N that have been detected, and a detailed circuit that performs diagnosis, and also shows a volatile memory RAM 1107 that temporarily stores the results of diagnosis and the results of measurement, according to the present invention, and a rewritable non-volatile memory (EEPROM) 1106.

It should be understood that the groups that make up the battery module 10 shown in FIGS. 1 and 2 are embodiments that include four lithium cells. However, the integrated circuit shown in FIGS. 4 through 6B is a circuit that can handle six cells. Accordingly, while in the embodiment shown in FIGS. 1 and 2 each of the groups that make up the battery module 10 is provided with four lithium cells, it would be possible to increase the number of lithium cells making up each of those groups to six, and, by a similar type of thinking, it would also be possible to increase them to include yet more lithium cells. How many lithium cells should be included in each of the above described groups is determined by the total number of lithium cells and by the processing speed for measurement and diagnosis and so on.

FIG. 4 is a figure for explanation of the timing of the measurement operation. The timing and the measurement period for the above described measurement operation, and the diagnosis operation, are managed by a stage counter that consists of a start circuit 254, a first stage counter 256, and a second stage counter 258. The stage counter described above could be a normal counter, or could be a shift register. In the case of a shift register, the number of stages thereof will be equal to the number of types of stages, and in this embodiment is ten stages.

When (1) a communication command sent from the transmission path is received at the terminal RX requesting "wake up", or when (2) the power supply voltage supplied to the integrated circuit reaches a predetermined voltage, or when (3) a signal is received indicating that the starter switch (i.e. the key switch) of the vehicle has been turned ON, then the start circuit 254 outputs reset signals to the first and the second stage counters 256 and 258 so that these counters are put into their initial states, and then performs operation to output a clock signal of a predetermined frequency. Accordingly, when any one of the conditions (1) through (3) described above is satisfied, then the integrated circuits execute their operations for measurement and for diagnosis. On the other hand, when a communication command 292 requesting "sleep" is received from the transmission path 112 (refer to FIG. 1), or when it has not been possible to receive any communication command 292 for at least a predetermined interval of time, then the start circuit 254 stops the output of the clock signal at the timing at which the stage counter returns to its reset state, in other words to its initial state. Since the progression of the stages is stopped by this clock signal output stopping, accordingly the execution of the measurement operation and the diagnosis operation described above goes into the stopped state.

The first stage counter 256 receives the clock signal from the start circuit 254, outputs a count value that controls the processing timing within each stage, and generates a timing signal STG1 with the decoder 257 that controls the processing timing within the stages. The count value of the second stage 258 corresponds to the type of the stage shown in the row 260Y1 of an operation table 260, so that, as the count value progresses, the corresponding stage changes over from the left to the right of the row 260Y1 of the operation table 260. And a stage signal STG2 that specifies each stage is outputted from a decoder 259. Initially in the reset state, in other words with the first stage counter 256 and the second stage counter 258 in their initial states, the second stage counter 258 has a count value that specifies a stage STGCa1, so that the stage signal STG2 that is the output of the decoder 259 becomes a signal that selects the stage STGCa1. Processing within the stage is performed on the basis of the counting operation of the first stage counter 256, and next the count of the second stage counter 258 advances by one, so that the count contents of this second stage counter 258 becomes a value that indicates STGCV1, i.e. the second stage from the left of the row 260Y1 of the operation table 260, and the stage signal STG2, that is the output of the decoder 259, becomes a signal that designates STGCV1. Measurement and diagnosis for the cell BC1 are performed in this stage STGCV1. And in a similar manner, along with the progression of the count of the second stage counter 258, the stage shown in the field of the row 260Y1 of the operation table 260 changes over from the left to the right. Measurement and diagnosis for the cell BC1 are performed in the stage STGCV1, and measurement and diagnosis are performed for the cell B2 in the next stage STGCV2, measurement and diagnosis are performed for the cell B3 in the next stage STGCV3, and measurement and diagnosis are performed for the cell BC4 in the next stage STGCV4.

Since, in the embodiment shown in FIGS. 1 through 3, each of the groups GB1 through GBN of the battery module 10 consists of four cells, accordingly the stages STGCV5 and STGCV6 are not used, or the stages STGCV5 and STGCV6 do not exist because they are skipped. The details of this operation will be described hereinafter. Due to this, the stage after the next stage STGCV4 becomes a stage STGVDD in which measurement and diagnosis of the output of the power supply circuit 121 within the integrated circuit are performed, and, after that, the stage becomes a stage STGTEM in which measurement and diagnosis of the outputs of the temperature sensors are performed. Furthermore, after this, the stage becomes a stage "STG reference power supply" in which measurement and diagnosis of the reference voltage used within the integrated circuit are performed. After this stage "STG reference power supply", the count value of the second stage counter 258 returns to its initial state, and, since now for a second time it becomes a value that corresponds to the stage STGCa1, accordingly the output signal STG2 of the decoder 259 becomes a signal that specifies the stage STGCa1 for a second time. Each of the stages from left to right in the row 260Y1 of the operation table 260 is executed on the basis of the counting operation of the second stage counter 258 in this manner, and this is repeated. It should be understood that, if the contents of the second stage counter is forcibly set to some specified value, then the processing of the stage that corresponds to this value is executed. The details of the processing within each stage will be described hereinafter.

—Diagnosis and Measurement: (2) Changing Over the Number of Cells—

As described above, the details of execution of the diagnosis operation and the measurement operation are selected according to whether the number of the lithium cells making up each of the groups corresponding to the integrated circuits is four or is six. A circuit is shown in concrete terms in FIG. 5. The first stage counter 256 repeats its counting operation on the basis of the count signal from the start circuit 254, and the count value of the second stage counter 258 is increased by one when the count value of the first stage counter 256 reaches a prescribed count value.

Figure 5:
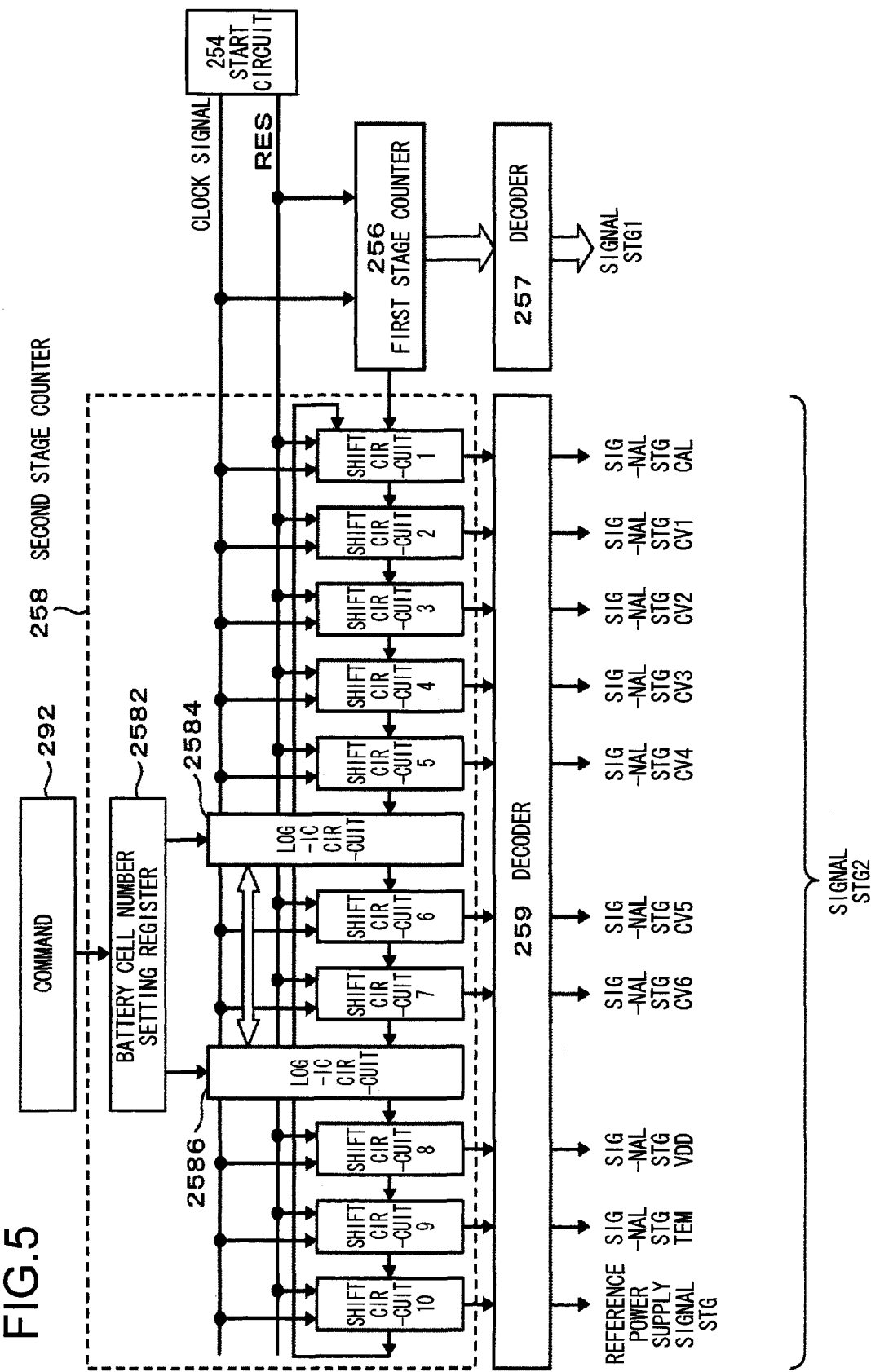
FIG. 5 is a block diagram for explanation of a circuit of a cell controller for generating stage signals.

FIG. 5 shows an example of the structure of the second stage counter 258. Here, the second stage counter 258 consists of ten registers. In a first state, only the shift circuit 1 is in the 1 state while the other shift circuits 2 through 10 are in the zero state, and the output STG2 of the decoder 259 is the stage signal STGCa1. And, when the count value of the first stage counter 256 reaches a predetermined value, the 1 state moves on to the next shift circuit 1, while the shift circuit 1 and the shift circuits 3 through 10 go into the zero state. When the 1 state shifts in order through the shift circuits 1 through 4 while the shift circuits 6 through 10 are in the zero state, the decoder 259 outputs a stage signal STGCV4.

If the number of cells that make up the corresponding group is six, then 6 is set in a register 2582 by a communication command 292 from the exterior. On the other hand, if the number of cells that make up the corresponding group is four, then 4, the cell number, is set in the register 2582 by the communication command 292. If 6 is set as the number of cells in the register 2582, then, after the shift circuit 5 has gone into the 1 state and the stage signal STGCV4 has been outputted from the decoder 259, next the shift circuit 6 goes into the 1 state and a stage signal STGCV5 is outputted, and furthermore the shift circuit 7 goes into the 1 state and a stage signal STGCV6 is outputted. And, after the shift circuit 7 has gone into the 1 state, the shift circuit 8 goes into the 1 state and a stage signal STGVDD is outputted from the decoder 259. If the cell number 4 is set in the register 2582, then the shift circuit 6 and the shift circuit 7 are skipped on the basis of the operation of a logic circuit 2584 and a logic circuit 2586, and, after the shift circuit 5 has gone into the 1 state, the shift circuit 8 goes into the 1 state. The result of this is that the stage signal STGCV5 and the stage signal STGCV6 corresponding to the shift circuit 6 and the shift circuit 7 are not outputted from the decoder 259, and, after the stage signal STGCV4, the stage signal STGVDD is outputted from the decoder 259.

—Diagnosis and Measurement: (3) Measurement of the Terminal Voltages of the Cells, and Diagnosis of the Cells—

The details of the measurement and diagnosis in the various stages of the row 260Y1 of the operation table 260, as shown in FIG. 4, will now be explained. Broadly speaking, the measurement and diagnosis may be divided into two classifications, one of which is a diagnosis as to whether measurement with the sensors and measuring objects are in an anomalous state, and the measurement schedule for this is described in the row 260Y2. The other of these classifications is diagnosis of the control device that includes this integrated circuit, in other words is diagnosis of the measurement system described in FIG. 2 or diagnosis of the diagnosis circuitry itself associated with this measurement system, and also includes self diagnosis of the discharge control system for the cells.

The operation of measurement is divided into two portions according to elapsed time: the diagnosis of the subjects of measurement is carried out in the front half portions that are described as "RES", in which self diagnosis is performed, while the rear half portions that are described as "measurement" are portions in which measurement and diagnosis of each of the cells accompanying the results of measurement is performed. In the front half portion RES of each stage, not only is self diagnosis performed, but also initialization is performed of the analog to digital converter 122A that is used for measurement. In this embodiment, an integrated type analog to digital converter 122A is used in which a capacitor is employed in order to reduce the influence of noise, and discharge of the electric charge accumulated in this capacitor during earlier operation and so on is also implemented at the timing of this front half portion RES. In the rear half portion "measurement" of each of the stages of the row 260Y2, measurement is executed using the analog to digital converter 122A, and diagnosis of the subject that is measured is performed on the basis of the value that has been measured.

Figure 6A:
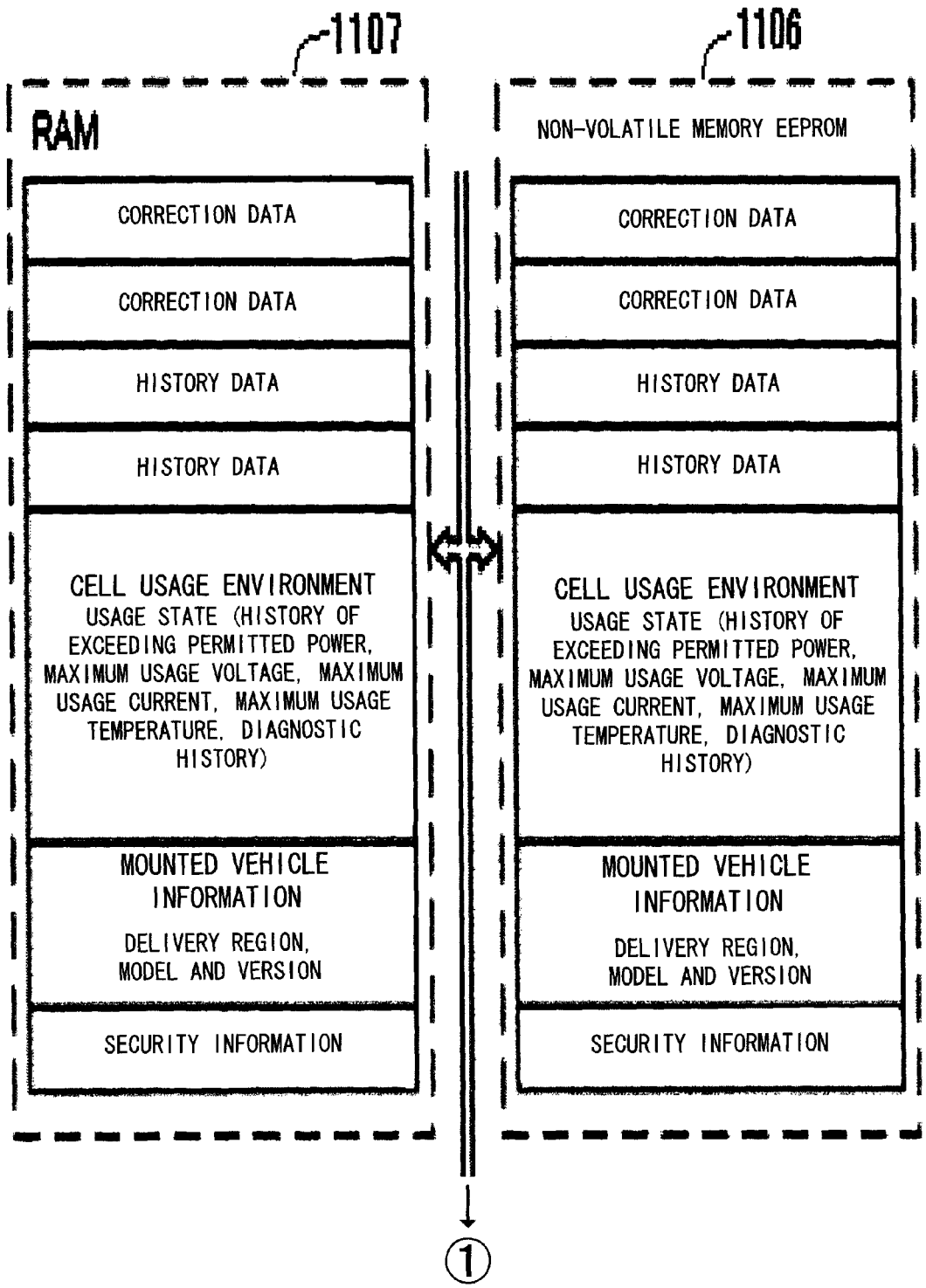
FIGS. 6A and B are a block diagram for explanation of the structure of a cell controller.
Figure 6B:
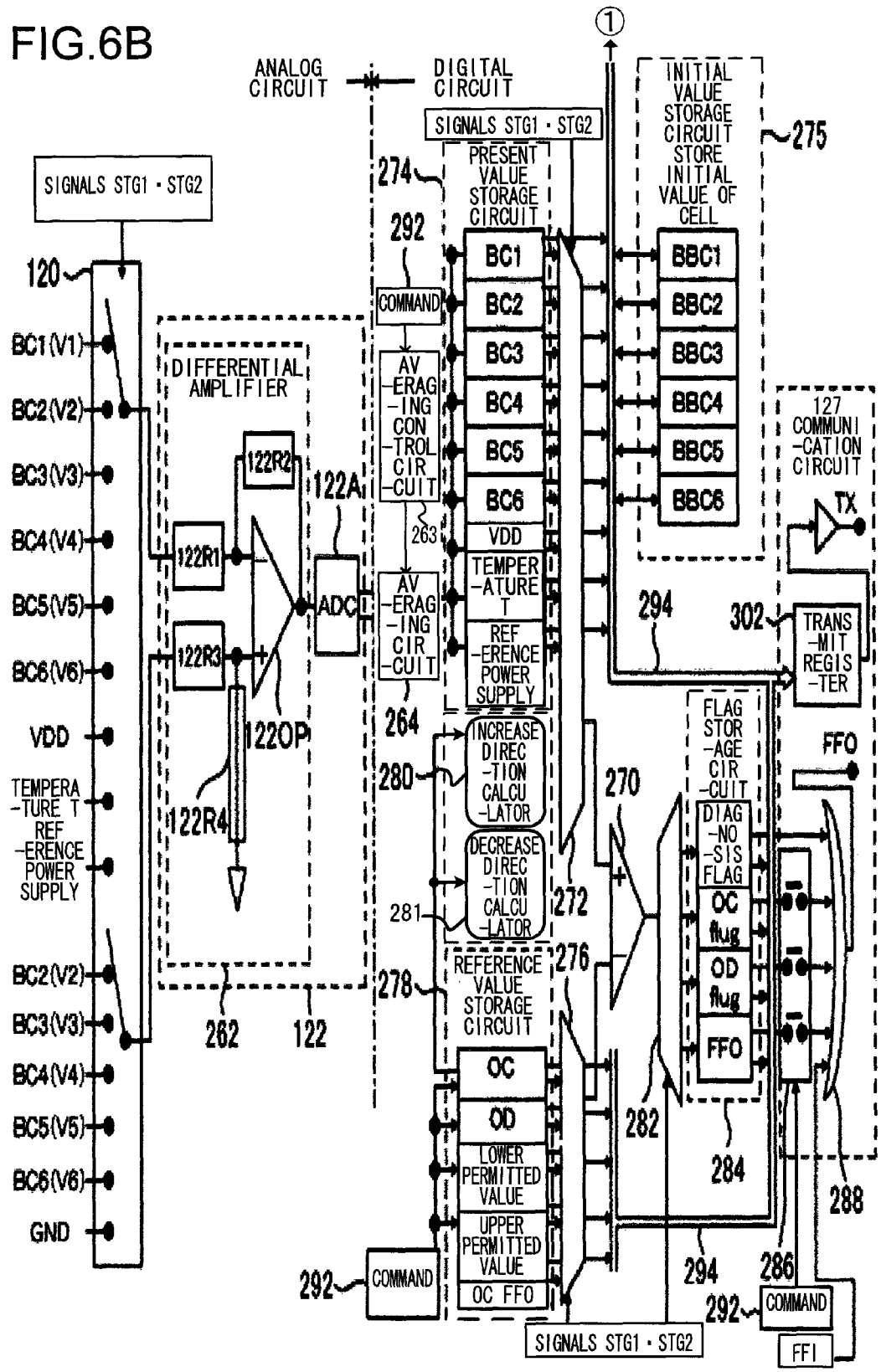

In the stage STGCa1, principally the self diagnoses shown in the rows 260Y3 through 260Y9 are performed: in the front half of the stage that is the RES mode, diagnosis of the selection circuit 120 itself is performed, this being a multiplexer and being the item described in the row 260Y6; diagnosis of a changeover circuit that performs changeover operation for the selection circuit 120 and so on is performed as described in the row 260Y7; and moreover diagnosis is performed of the selection signals for the portions internal to the integrated circuit that perform the digital comparison operation (i.e. of the selection signals for the present value storage circuit 274 and the reference value storage circuit 278 of FIG. 6B) and so on, this being the item described in the row 260Y9. And, in the rear half "measurement" of the stage STGCa1, measurement of the terminal voltages of the balancing switches 129 for adjustment of the states of charge of the cells and diagnosis of those balancing switches 129 is performed, this being the item described in the row 260Y3, and moreover diagnosis of a digital comparison circuit internal to the integrated circuit is performed, this being the item described in the matching row 260Y5. For the diagnosis items described in the row 260Y7 and the items described in the row 260Y9, diagnosis is performed in either the front half or the rear half of all of the stages. However, the period at which these diagnostics are performed is only an example; it would also be acceptable not to perform diagnostics during each cycle, but to perform them at longer intervals. In the diagnostics described in the row 260Y8, a diagnosis is made as to whether or not a circuit that generates a threshold value for detecting if each of the cells is in a state of overcharge (over-discharge) is operating normally. If the circuit that generates the threshold value becomes abnormal, then it becomes impossible to perform correct over-discharge diagnosis.

The stages STGCV1 through STGCV6 are stages in which the terminal voltages of the cells are measured in order, and moreover, from the values that have been measured, it is diagnosed whether each of the cells is in the overcharged state or is in the over-discharged state. Since the overcharged state and the over-discharged state are reasons for the battery system to become faulty, accordingly diagnosis of overcharging and over-discharging is actually set so as to give a margin of security. As shown in FIGS. 1 and 2, if four cells are included in a group, as explained in FIG. 5, the stage STGCV5 and the stage STGCV6 are skipped. In the stage STGVDD the output voltage of the power supply circuit 121 is measured, and then in the stage STGTEM the output voltage of the temperature sensor is measured. In this stage STGTEM, diagnosis is performed as to whether or not the analog circuitry and the analog to digital converter internal to the integrated circuit and the circuit that generates the reference voltage are normal overall, these being the diagnosis items described in the row 260Y4. The voltage outputted from this circuit that generates the reference voltage is an already known voltage value, and, if the result of measurement of this voltage value is not within a predetermined range, then it is possible to determine that there is an anomaly with one or the other of the circuits described above, and it is possible to diagnose whether or not it is possible to execute control correctly.

—Diagnosis and Measurement: (4) The Measurement Circuits and the Diagnosis Circuits—

FIGS. 6A and B show the measurement circuitry, the diagnosis circuitry, and the storage circuitry internal to each of the integrated circuits 3A through 3N. The operation of measurement of the terminal voltages of the cells in the group GB1 of the battery module 10, corresponding to the integrated circuit 3A, will now be explained. The selection circuit 120 selects the terminal V1 and the terminal V2 with the stage signal STGCV1 described in FIG. 4, and, due to this selection, the terminal voltage of the cell BC1 shown in FIGS. 1 and 2 is outputted from the selection circuit 120 to the voltage detection circuit 122. The voltage detection circuit 122 includes a differential amplifier 262 and an analog to digital converter 122A. The differential amplifier 262 consists of an operational amplifier 1220P and resistors 122R1 through 122R4. The differential amplifier 262 has a function of adjusting between different electrical potentials, in other words of level shifting, and generates an analog output on the basis of the voltage difference between its two input terminals that are selected, without any relation to the base electrical potentials of these input terminals. As a result, the influence of potential difference in terms of differences of reference potential between the lithium cells that are connected in series is eliminated, and analog output is obtained on the basis of the terminal voltage of the lithium cell BC1.

The output of the differential amplifier 262 is converted to digital by the analog to digital converter 122A, and is outputted to an averaging circuit 264. An average value of the results of measurement during a predetermined number of measurement cycles is obtained by the averaging circuit, and, in the case of the lithium cell BC1, this average value is stored in BC1 of the present value storage circuit 274. The average value circuit 264 calculates the average value of the measurements for the measurement cycle number stored in the averaging control circuit, and stores its output in the above described present value storage circuit 274. Thus, if "1" is commanded to the averaging control circuit, then the output of the analog to digital converter 122A is not averaged, but is stored in BC1 of the present value storage circuit 274 just as it is. But if "4" is commanded to the averaging control circuit, then the results of measuring the terminal voltage of the cell BC1 four times are averaged, and the result is stored in BC1 of the above described present value storage circuit 274. While it becomes necessary to perform measurement four times with the stages of FIG. 4 before first calculating an average of four measurements, by using the newest ones from among the measured values in the calculation from the fourth time onwards, it becomes possible to perform averaging calculation by the averaging circuit 264 each time that measurement is performed.

As described above, it is possible to eliminate the bad influence of noise by averaging the measurement results over a predetermined number of measurement cycles. The DC electrical power of the battery module 9 shown in FIG. 1 is supplied to the inverter device, and is converted into AC electrical power. During this operation by the inverter device to convert from DC electrical power into AC electrical power, operation to make currents go continuous and discontinuous is performed at high speed. A great amount of noise is generated by this operation to make currents go continuous and discontinuous. With the averaging circuit, the beneficial effect is obtained that it is possible to reduce the negative influence of this type of noise.

The digital value of the terminal voltage of the cell BC1 converted into digital is stored in the register BC1 of the present value storage circuit 274. The measurement operation described above is performed within the time interval shown as "measurement" of the stage STGCV1 of FIG. 4. Moreover, the subsequent diagnosis operation is performed within this time interval shown as "measurement" of the stage STGCV 1. This diagnosis operation consists of overcharge diagnosis and over-discharge diagnosis. First, the digital value of the terminal voltage of the cell BC1 is stored in the register BC1 of the present value storage circuit 274, and next, on the basis of the stage signals STGCV1 and STG1, the digital multiplexer 272 reads out the terminal voltage of the cell BC1 from this register BC1 of the present value storage circuit 274 and sends it to the digital comparator 270. Moreover, a digital multiplexer 276 reads out an overcharge determination reference value OC from the reference value storage circuit 278 and sends it to the digital comparator 270.

The digital comparator 270 compares together the terminal voltage of the cell BC1 from the register BC1 and the reference value OC for overcharge determination, and sets a flag "diagnosis flag" that indicates the occurrence of an anomaly in a flag storage circuit 284 if the terminal voltage of the cell BC1 is greater than the overcharge determination reference value OC. Moreover "OCflag" is also set. Actually, this type of situation almost never happens during control that is directed at ensuring that the overcharged state does not occur. However it is extremely dangerous if it does occur, and accordingly diagnosis is executed repeatedly.

When an anomaly appears due to a diagnosis of overcharging, next the anomaly flag that has been set in the flag storage circuit 284 is sent to the volatile memory RAM and the number of anomalies is summed up. Moreover, the value in the flag storage circuit 284 is stored in the item "results of diagnosis" as past history, and in particular is stored in the field "battery information" that relates to abnormality in the cells.

After this overcharge diagnosis, next, diagnosis of over-discharge is also performed. The digital multiplexer 272 reads out the terminal voltage of the cell BC1 from the register BC1 of the present value storage circuit 274, and sends it to the digital comparator 270. Moreover, a digital multiplexer 276 reads out an over-discharge determination reference value OD from the reference value storage circuit 278 and sends it to the digital comparator 270. The digital comparator 270 compares together the terminal voltage of the cell BC1 from the register BC1 and the reference value OD for over-discharge determination, and sets a flag "diagnosis flag" that indicates the occurrence of an anomaly in the flag storage circuit 284 if the terminal voltage of the cell BC1 is lower than the over-discharge determination reference value OD. Moreover "ODflag" is also set. In the same manner as described above, for the case of over-discharge, actually this type of over-discharged state almost never happens during control that is directed at ensuring that the over-discharged state does not occur. However, since it constitutes a cause for the battery system to become faulty if it does occur, accordingly diagnosis is executed repeatedly.

The result of diagnosis not only is stored in the flag storage circuit 284, but also is stored as history data in the item "results of diagnosis" in the history data item in the volatile memory 1107. All the various conditions of this lithium cell when the anomaly occurred are stored in this history data in the volatile memory 1107. Moreover, the current number of times of occurrence is obtained by adding 1 to the past value of the number of times that an anomaly has occurred, and this numerical value is stored.

The explanation given above is for measurement and diagnosis related to the cell BC1 in the stage STGCV1. In a similar manner, in the next stage STGCV2, the selection circuit 120 of FIG. 6B selects the terminal voltage of the cell BC2 and outputs it to the voltage detection circuit 122. The voltage detection circuit 122 converts this terminal voltage to digital, calculates its average value with the averaging circuit 264, and stores the result in the register BC2 of the present value storage circuit 274. The terminal voltage of the cell BC2 is then read out from the register BC2 by the digital multiplexer 272 and is compared with the above described overcharge determination reference value OC, and next this terminal voltage of the cell BC2 is compared with the over-discharge determination reference value OD. Thus, anomalous condition determination is performed by comparison with the over-charge determination reference value OC and by comparison with the over-discharge determination reference value OD, described above. If an anomalous condition is found, then the diagnostic flag in the flag storage circuit 284 that indicates the presence of an anomaly is set, and the flag "OCflag" or the flag "ODflag" is set so as to indicate the cause of the anomaly.

In the following, in a similar manner, measurement of the terminal voltage of the cell BC3 and diagnosis of overcharge or over-discharge thereof are performed in the stage STGCV3 of FIG. 4. And measurement of the terminal voltage of the cell BC4 and diagnosis of overcharge or over-discharge thereof are performed in the stage STGCV4. Moreover, the diagnosis history and the results of diagnosis are stored in the volatile memory 1107.

—Diagnosis and Measurement: (5) Measurement of the Terminal Voltages of the Cells, and Storage of the Initial Data—

With the battery system shown in FIG. 1, when the operation of the vehicle has been stopped and before the driver starts operating the vehicle again, current supply from the battery module 10 to the inverter device is not performed. Since the state of charge (the SOC) of each of the lithium cells is obtained accurately when the terminal voltage of each of the cells is measured in the state in which no charging current or discharge current is flowing in the cells, accordingly, in this embodiment, the measurement operation of the integrated circuits is started automatically on the basis of actuation of the key switch of the vehicle, or on the basis of a communication command 292 from the battery controller 20 such as "wake up" or the like.

In the measurement operation explained in FIGS. 6A and B, the operations of measurement and diagnosis of the cells by the integrated circuits are started, and, when measurements have been performed over the measurement cycle number stored in the averaging control circuit 263, then calculation is performed by the averaging circuit 264 to obtain the average of these measured values. The results of this calculation are first stored in the present value storage circuit 274. Each of the integrated circuits independently performs measurement for each of the cells in the group that is related to that integrated circuit and performs calculation of the average values of the results of these measurements, and stores the results in the registers BC1 through BC6 of the present value storage circuit 274 of that integrated circuit.

Information items (1) through (5) described below are stored in the volatile memory 1107. The information item (1) is the gain of the voltage meter SV and a voltage offset that is the error of the voltage meter SV, the gain of the current meter SA and a current offset that is the error of the current meter SA, and correction data for the analog to digital converter. This information item (1) is correction data that is used for enhancing the accuracy of measurement by the integrated circuits 3A through 3N. The information item (2) is the results of diagnosis of the lithium cells and of the integrated circuit itself, and the information therein is information about the number of times of diagnosis for each item and the number of anomalies for each item, or about variations of the charging ratios of the lithium cells BC1 through BC4 and so on, as will be described hereinafter. In other words, it is history data for the lithium battery module or for the lithium cells. The information item (3) is information related to the usage environment of the lithium cells. The information item (4) is information about the subject product, for example information about the vehicle to which it is mounted. And the information item (5) is security information, i.e. is information for protecting the stored data from third parties.

While the information items (1) through (5) described above are information that need not necessarily be stored in each of the integrated circuits but may acceptably be stored in the battery controller 20, in this embodiment, this information is not only stored in the battery controller 20 but is stored in the various integrated circuits as well, since sometimes the battery controller 20 may be removed for some reason, and sometimes an anomaly may occur in the battery controller 20.

By providing each of the integrated circuits 3A through 3N with a rewritable non-volatile memory 1106, it is possible to enhance the accuracy of detection and the accuracy of diagnosis by storing therein the information item (1) related to corrections specific to each of the integrated circuits, for example by storing correction values related to the voltage detection circuit 122. In particular, in the case of lithium cells, the electrical characteristics change in various ways under the influence of temperature, and this can constitute an obstacle to enhancement of the accuracy of diagnosis. If it is possible not only to provide correction for the voltage detection circuit 122, but also to correct for characteristic changes of the subjects of detection and diagnosis, then this is linked to enhancement of the accuracy of detection and of the accuracy of diagnosis. The information item (2) will be described hereinafter.

The information item (3) is information for knowing the usage environment of the lithium cells, and, in this item, to what extent usage has taken place in a state in which some standard is exceeded is stored, and also the maximum terminal voltage and the minimum terminal voltage are stored. Moreover, the maximum load current and the maximum charging current are also stored. This maximum load current and maximum charging current are values that cannot be detected by the integrated circuits, and accordingly these values are sent from the battery controller 20. On the other hand, the maximum terminal voltage and the minimum terminal voltage for each of the cells are detected by the integrated circuits, and, along with these results being stored by the integrated circuits, they are also sent to the battery controller 20 and are stored by the battery controller 20. Moreover, the temperature of the battery module 10 is also stored as part of its history.

The information about the subject product in the information item (4) is, for example, information about the type of vehicle to which it is mounted and version information and also information about the delivery region where the subject product will be used, and, by reading out this information, it is possible to become clear about the vehicle to which this battery system is mounted, and to prevent mounting errors during maintenance or the like. Although this information is regularly used by the battery controller 20, it is not very important information for the integrated circuits, but nevertheless it is stored therein as a backup for the battery controller 20. The security information in the information item (5) is used when reading out or writing stored information. By providing this security information, it is possible to prevent other information from being mistakenly written during maintenance, or the like.

While, in this embodiment, roughly similar information is also stored in the battery controller 20, it would also be acceptable to arrange for different information to be stored. Moreover, it would also be acceptable to arrange for data to be stored only in the battery controller 20, and not to endow the integrated circuits that control the cells with any function of storing information. Naturally, it would also be acceptable to arrange to perform storage by dividing the information to be stored into information to be stored by the integrated circuits that control the cells, and information to be stored by the battery controller 20. In particular, it would be acceptable for the integrated circuits that control the cells to be specialized for storing the results of measurement and the results of diagnosis for their respectively corresponding groups. By doing this, for each of the cells making up the battery module 10, it is possible to store the past states of usage as history, and this history can be used for analysis and so on.

—A Power Supply System for a Vehicle—

FIG. 7 is a circuit diagram of a power supply system 1 for a rotating electrical machine for a vehicle that uses the battery system described in FIG. 1 as a DC power supply for a rotating electrical machine for driving a hybrid automobile or an electric automobile or the like, and a motor 230 is a rotating electrical machine that is used for driving the vehicle. In the power supply system shown in FIG. 7, two of the battery modules explained in FIG. 1 are used, i.e. a high potential side battery module 10A and a low potential side battery module 10B, with each of them being built up from a number of lithium cells connected in series. The high potential side battery module 10A and the low potential side battery module 1 OB are connected in series via a cutoff switch 6. This cutoff switch 6 is a service disconnect switch (hereinafter termed a "SD switch") that is provided for safety during maintenance and inspection, and the SD switch 6 must be opened before opening a metallic case that covers over the exterior of the power supply system 1, the construction being arranged so that it is only possible to open this metallic case after the SD switch 6 has been opened.

The positive terminal of the high potential side battery module 10A is connected to a positive terminal of an inverter device 220 via a high power positive cable 81 and a relay RLP. Moreover, the negative terminal of the low potential side battery module 10B is connected to a negative terminal of the inverter device 220 via a high power negative cable 82 and a relay RLN. The high potential side battery module 10A and the low potential side battery module 10B are connected in series via the SD switch 6, thus constituting a high power battery (the battery of the power supply system 1, in which the two battery modules 10 are connected in series) having, for example, a nominal voltage of 340 V and a capacity of 5.5 Ah. It should be understood that the SD switch 6 is not only a mechanical path interruptor but is also provided with a fuse, and this may, for example, have a rated current of 125 A. Since in this manner the SD switch 6 is definitely opened during the task of maintenance and inspection, accordingly it is possible to maintain high security, since it is possible to prevent electric shock due to the formation of a closed circuit, even supposing that the body of the operator comes into contact with only one of the positive electrode high power cable 81 and the negative electrode high power cable 82, or for a similar reason.

As previously described, the relay RLN is provided between the negative terminal of the low potential side battery module 10B and the inverter device 220, and moreover two current meters SA1 and SA2 that function as the current meter SA and the relay RLP are provided between the positive terminal of the high potential side battery module 10A and the inverter device 220. Moreover, the series circuit of the resistor RPRE and the charge relay RLPRE is connected in parallel with the relay RLP. The current meter SA1 is provided between the positive terminal of the high potential side battery module 10A and the positive electrode side main relay RLP, and the current meter SA2 is provided between the positive electrode side main relay RLP and the inverter device 220, and the output lines of the current meter SA1 and the current meter SA2 are brought to the battery controller 20, so that it becomes possible for the flow rate of electricity supplied from this lithium battery system to be monitored by the current meters SA1 and SA2.

In the normal state of the system, the values of the readings of the current meter SA1 and of the current meter SA2 must be the same. However, when an anomaly such as electrical leakage or the like occurs, then the values of the readings of the current meter SA1 and of the current meter SA2 become different. Accordingly, with this structure, it is possible to detect the occurrence of an anomaly such as electrical leakage or the like. Moreover, if the relay RLP and the relay RLN are operating normally, then the outputs of the current meters SA1 and SA2 must both change according to continuity or discontinuity of the relay RLP and the relay RLN, so that it is possible to diagnose the operation of the relays and the measurement functions of the current meters by monitoring the operation of these relays and the values measured by the current meters SA1 and SA2.

In order to enhance the accuracy of measurement of the value of the current outputted from the power supply system, the errors inherent to the current meters SA1 and SA2 are measured in advance before shipment, and correction values are stored before shipment. The data shown in FIG. 8 is stored in a rewritable non-volatile memory 1116 that is incorporated in the battery controller 20, with the data D5 in a file KD 1 in this stored data being gain information and offset information for the current meters SA1 and SA2. Furthermore, the stored contents shown in FIG. 8 are read into a volatile memory 1117 just as they are when operation of this power supply system 1 starts, so that similar data is stored in the volatile memory 1117.

The outputs of the current meters SA1 and SA2 are inputted to the battery controller 20, and are corrected on the basis of the gain information and the offset information for the current meters stored in the volatile memory RAM of the battery controller 20, and accordingly the accuracy of the measured current values will be improved; and, using these values, the power being outputted by the high potential side battery module 10A and by the low potential side battery module 10B, or the power being charged into these battery modules, is calculated on the basis of the terminal voltages. The results of these calculations are written into the volatile memory (ROM) 1117 of the battery controller 20 as battery information, and are subsequently stored in the rewritable non-volatile memory (EEPROM) 1116.

Among the above described results of calculation, values that exceed standards determined in advance and highest values are stored as separate items. The currents measured by the current meters SA1 and SA2 are integrated, and are stored in the storage regions of the data D11 of the file KD2 and of the data D35 of the file KD3 of FIG. 8.

Furthermore, the output electrical power or the charging power of each of the cells that make up the high potential side battery module 10A and the low potential side battery module 10B is calculated by using the current values described above, and also from the terminal voltages of the lithium cells. The results calculated by the calculation described above are stored in the volatile memories 1107 or in the rewritable non-volatile memories 1107 of the integrated circuits corresponding to the cells (refer to FIG. 6A), or in the volatile memory 1117 or the rewritable non-volatile memory 1116 of the battery controller 20 (refer to FIG. 7).

When the operation of the inverter control circuit 222 starts, a motor control command is received from the external controller 111, and, in order to start operating the motor 230, the relay RLN on the negative electrode side is changed over from its opened state to its closed state, then the pre-charge relay RLPRE is changed over from its opened state to its closed state so that the smoothing capacitor 228 is charged up, and then the relay RLP on the positive electrode side is changed over from its opened state to its closed state so that the supply of electrical power from the lithium battery system of this power supply system 1 to the inverter device 220 starts.

By controlling the phase of the AC electrical power generated by the power module 226 to be leading or trailing with respect to the position of the magnetic poles of the rotor of the motor 230, the inverter device 220 operates the motor 230 either as a motor that generates rotational torque, or as a generator that generates AC power. During braking operation of the hybrid vehicle or of the electric automobile, regenerative braking operation is performed by operating the motor 230 as a generator, so that the kinetic energy of the vehicle is converted into electrical power. And when braking operation is performed, by operating the motor 230 as a generator, braking torque is generated by the vehicle, and the power generated by the motor 230 is returned to the battery modules 10A and 10B of the lithium battery system, so that these battery modules 10A and 10B are charged up. Moreover, if the values of SOCs (states of charge) of the battery modules 10A and 10B decrease below a reference state, then these SOC values are sent to the external controller 111, and an operating command is sent from the external controller 111 to the inverter control circuit 222, and the inverter device 220 controls the power module 226 so that the motor is operated as a generator at the highest possible power level. Due to this control, the motor 230 described above converts the kinetic energy generated by the engine into AC electrical power, this AC electrical power is converted into DC electrical power by the power module 226, and this DC power then charges up the battery modules 10A and 10B.

—Detection, Diagnosis, and Storage Operation in this Power Supply System 1 for a Vehicle—

FIG. 9 is a figure showing the flow of operation of this lithium battery system. In the following, the steps of this operational flow will be explained in order. It should be understood that time is shown as elapsing from the left of the figure to the right. Moreover, the upper portion of FIG. 9 shows the operation of the battery controller 20, while the lower portion thereof shows the operation of the integrated circuits 3A through 3N.

In the state with operation stopped, in a step 802, the vehicle is started when the key switch of the vehicle is actuated, and then control passes to a step 806, in which the battery controller 20 (termed BC in the figure) is started. In this step 806, along with performing operation for the necessary initialization and so on, command information is transmitted from the terminal TX of the battery controller 20 shown in FIG. 1 and is received at the terminals RX via the transmission path 52 (refer to FIG. 1), and CAN communication starts via the transmission path. Moreover, the integrated circuits 3A through 3N are provided with the transmission path 54 that transmits the results of anomaly diagnosis (refer to FIG. 1).

The battery controller 20 starts communication upon the transmission path for anomaly signals by transmitting a pseudo-anomaly signal from the terminal FFTEST shown in FIG. 1 and by receiving it back via the transmission path 54 at the terminal FF of the battery controller 20, thus making a check as to whether or not the transmission paths 52 and 54 are normal. And the battery controller 20 transmits "wake up" command information to the integrated circuits 3A through 3N, and, on the basis of this CAN communication, the operational modes of the integrated circuits 3A through 3N change from the sleep state to the wake up state (as shown in the step 882 of FIG. 9).

In the next step 810, the data shown in FIG. 8 that is stored in the rewritable non-volatile memory 1116 is read out, and is transferred to the volatile memory RAM 1117. The stored data shown in FIG. 8 is transferred from the rewritable non-volatile memory 1116 to the volatile memory 1117 and is stored therein, because the speed of reading out data from the rewritable non-volatile memory 1116 and the speed of writing data thereinto are slow, and because there is a tendency for the reliability of the rewritable non-volatile memory 1116 to decrease as the number of writes thereinto increases. The transferred data is used during the operation of the power supply system, and in processing for calculation or the like, and also is updated. This operation is the same for the rewritable non-volatile memories 1106 and the volatile memories RAM 1107 that are provided to the integrated circuits 3A through 3N, and thus, in a step 884, the information stored in the rewritable non-volatile memories 1106 of the integrated circuits 3A through 3N is transferred to their volatile memories 1107.

In a step 814, the voltage value measured by the voltage meter SV shown in FIG. 1 and the current values measured by the current meters SA1 and SA2 shown in FIGS. 1 and 7 are corrected by the battery controller 20, so that an accurate voltage value and an accurate current value are obtained for the electrical power supplied from the power supply system. It should be understood that, although in FIG. 7 not only the terminal voltage of the high potential side battery module 10A but also the terminal voltage of the low potential side battery module 10B is detected, but the voltage meter that detects the terminal voltage of the low potential side battery module 10B is fundamentally the same as the voltage meter SV shown in FIG. 1, and accordingly this voltage meter is omitted from the figure.

The voltage and the current detected in the step 814 are corrected on the basis of the information in the data D3 of the file KD1 shown in FIG. 8 in the stored data transferred from the rewritable non-volatile memory to the volatile memory RAM in the next step 810 and specifying the gain and the offset of the voltage meter and the information in its data D5 specifying the gain and the offset of the current meter, and thereby the accuracy of the measured values is enhanced.

The outputs of the current meters SA1 and SA2 and of the voltage meter VD has a slight non-linear temperature dependence. Moreover, their offset characteristics vary, due to variations of the circuit characteristics and so on. Correction data based upon characteristics specific to the sensors that are used in the voltage meter and the current meters are stored in the rewritable non-volatile memory 1116 of the battery controller 20, are shifted to the volatile memory 1117, and are used in correction for enhancement of the accuracy of measurement.

The stored data shown in FIG. 8 is data that is stored in the rewritable non-volatile memories 1106 of the integrated circuits 3A through 3N shown in FIG. 6A, or is data that is stored in the rewritable non-volatile memory 1116 of the battery controller 20. The data that is stored in the rewritable non-volatile memories 1106 of the integrated circuits 3A through 3N is fundamentally the same as the data that is stored in the rewritable non-volatile memory 1116 of the battery controller 20, but, instead of the gain and the offset for the voltage meter, it would also be acceptable to employ a variation correction for the amplifiers shown by the differential amplifier 262 internal to each of the integrated circuits, and an offset value for the analog to digital converter 122A.

It is possible further to enhance the accuracy of measurement and the accuracy of diagnosis by storing the data that is used for measurement and diagnosis by each of the integrated circuits in the rewritable non-volatile memory of each of the integrated circuits in this manner. Moreover, with the lithium cells that are the subject of measurement and diagnosis as described above, the various characteristics that depend upon the temperature and current values also vary greatly between different cells. Accordingly, the information that is used in correction for enhancing the accuracy of measurement and of diagnosis on the basis of the characteristics of the lithium cells that are the subjects of measurement and diagnosis is stored in the rewritable non-volatile memory 1116, and it becomes possible further to enhance the accuracy of measurement and diagnosis during vehicle operation by performing correction using this information.

In the step 884, the data in the rewritable non-volatile memories 1106 is stored in the volatile memories 1107. Moreover, in this step 884, measurement is performed for the cells in the respectively corresponding groups and diagnosis is performed for overcharge, over-discharge, and other predetermined conditions, and if any anomaly is present, then it is reported from the integrated circuits 3A through 3N to the battery controller 20 via the transmission path 54. At this time, the integrated circuits 3A through 3N not only perform diagnosis of their subject cells, but also perform self diagnosis of the main circuitry internal to the integrated circuits 3A through 3N, and, if any anomaly is detected, report a signal indicating the occurrence of that anomaly via the transmission path 54. In a step 818 reports of the results of diagnosis are received from the integrated circuits 3A through 3N via the transmission path 54 and it is checked that no anomaly is present, and then in a step 822 the relay RLPRE and the relays RLP and RLN of FIG. 7 are closed, and the power supply system goes into the state of supplying electrical power.

Thereafter in a step 832 the battery controller 20 calculates the states of charge (the SOCs) of all of the cells making up the integrated circuits 3A through 3N on the basis of the results of measurement of their terminal voltages, performs calculation of the discharge time intervals shown in FIG. 2 and of the states of variation of the states of charge (the SOCs) in order to make the states of charge (the SOCs) of the cells uniform, and performs calculation of the deviations of the states of charge (the SOCs) of the various cells. Furthermore, on the basis of the history data D15, D17, and D19 or of the history data D16, D18, and D20 in the file KD2 shown in FIG. 8, the controller 20 determines the level of deterioration of each of the cells. On the other hand, in a step 886, each of the integrated circuits 3A through 3N performs measurement of the terminal voltages of the cells and diagnosis on a predetermined cycle and also diagnosis of the internal circuitry of the integrated circuits themselves, and transmission and reception of data is also performed via the communication circuit.

It should be understood that, in this cyclic measurement and diagnosis of the battery controller 20 and the integrated circuits 3A through 3N, data representing the usage environment of the file KD3, including the temperature at which the battery has been used, the output electrical power, the charging power, the number of times the reference value has been exceeded, the maximum values and so on, is sequentially updated and is stored in the volatile memory RAM. This processing is executed repeatedly by the step 832 and the step 886 that are shown as normal processing, and that are executed on a predetermined cycle during operation.

Next, when the operation of the vehicle ends and the key switch is turned off, in a step 846 the battery controller 20 issues commands to terminate processing by the integrated circuits 3A through 3N and to write the data currently in the volatile memory 1107 into the writable non-volatile memory 1106. And next in a step 848 the relays RLP and RLN shown in FIG. 7 are opened.

In a step 852, the output of the voltage meter AV is read in the state in which there is no electrical load upon the battery module 10, in other words when the supplying current and the charging current are zero. In normal circumstances in which there is no electrical leakage or the like, it is possible to detect the terminal voltage in the state of no load. This value is first stored in the volatile memory 1117 of the battery controller 20.

In a step 888, each of the integrated circuits 3A through 3N enters into its operation for the stopping mode, and in a step 892 each of the integrated circuits 3A through 3N detects the terminal voltage of its corresponding lithium cells BC 1 through BC4 in the no load state. These terminal voltages in the no load state, i.e. the detected values, are stored in the volatile memories 1106 incorporated in each of the integrated circuits 3A through 3N.

The updating of the data in the step 886 performed during normal control and the results of measurement in the step 892 are stored in the volatile memories 1107 of the integrated circuits 3A through 3N, in a step 894 the data that has been stored in the volatile memories 1107 is transmitted to the battery controller 20, and in a step 856 the battery controller 20 first stores this data in its volatile memory 1117. This data is then written into the rewritable non-volatile memory 1116 in a step 860.

In a step 894, the integrated circuits 3A through 3N write the data in their volatile memories 1107 into their rewritable non-volatile memories 1106, thus storing the data.

After the step 860, in a step 864, the battery controller 20 issues a command to put the integrated circuits 3A through 3N into the sleep state, and thereafter it cuts off its own power supply.

In a step 896, on the basis of the sleep command from the battery controller 20, each of the integrated circuits 3A through 3N goes into its sleep state. As shown in FIGS. 1 and 2, the lithium cells are connected to the integrated circuits 3A through 3N, so that voltage is always being applied to them. However, it is desirable for the consumption of electrical power to be as low as possible. Due to this, the integrated circuits 3A through 3N are put into their sleep states, so that their consumption of electrical power becomes low.

In this embodiment, the rewritable non-volatile memories 1106 or the rewritable non-volatile memory 1116 may, for example, be an EEPROM. In the embodiments described above, the data that is stored in the rewritable non-volatile memories 1106 or in the rewritable non-volatile memory 1116 is written into the volatile memories 1107 and 1117 when the operation of this power supply system 1 that uses lithium secondary cells is being started, this data stored in the volatile memories 1107 and 1117 is updated, and this updated data that is stored in the volatile memories 1107 and 1117 is stored for a second time in the rewritable non-volatile memories 1106 or in the rewritable non-volatile memory 1116 when the operation of the power supply system 1 is being stopped. According to this type of operation, it is possible to perform the calculation processing and the diagnosis operation at high speed, since in this operational state the data in the volatile memories 1107 and 1117 is used. Moreover, it is possible to reduce the number of writes into the non-volatile memories 1106 and 1116, so that it is possible to reduce decrease of the reliability of these non-volatile memories.

The terminal voltages of the lithium cells are detected in the no load state in which the power supply system 1 is not supplying any electrical power, and the states of charge (the SOCs) are calculated on the basis of these terminal voltages of the lithium cells in this no load state, so that it is possible to obtain the states of charge (the SOCs) with high accuracy.

Figure 10:
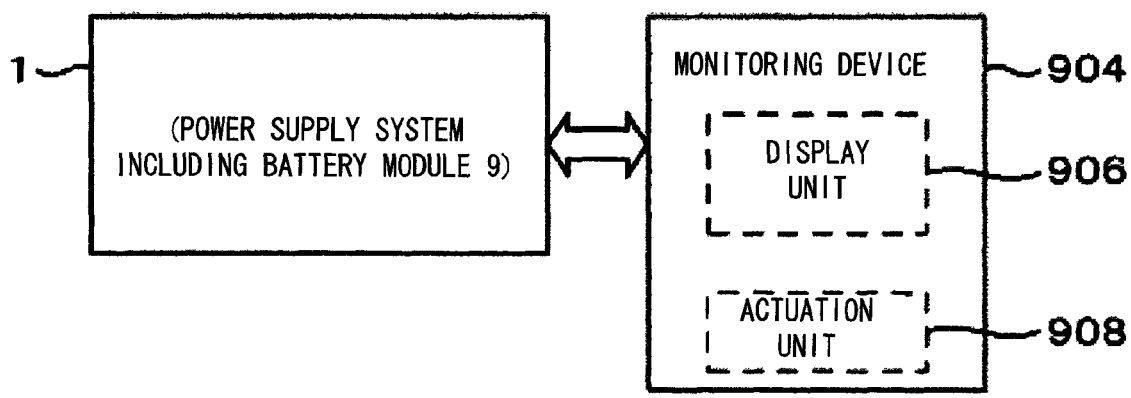
FIG. 10 is a block diagram of a monitoring device.
Figure 11:
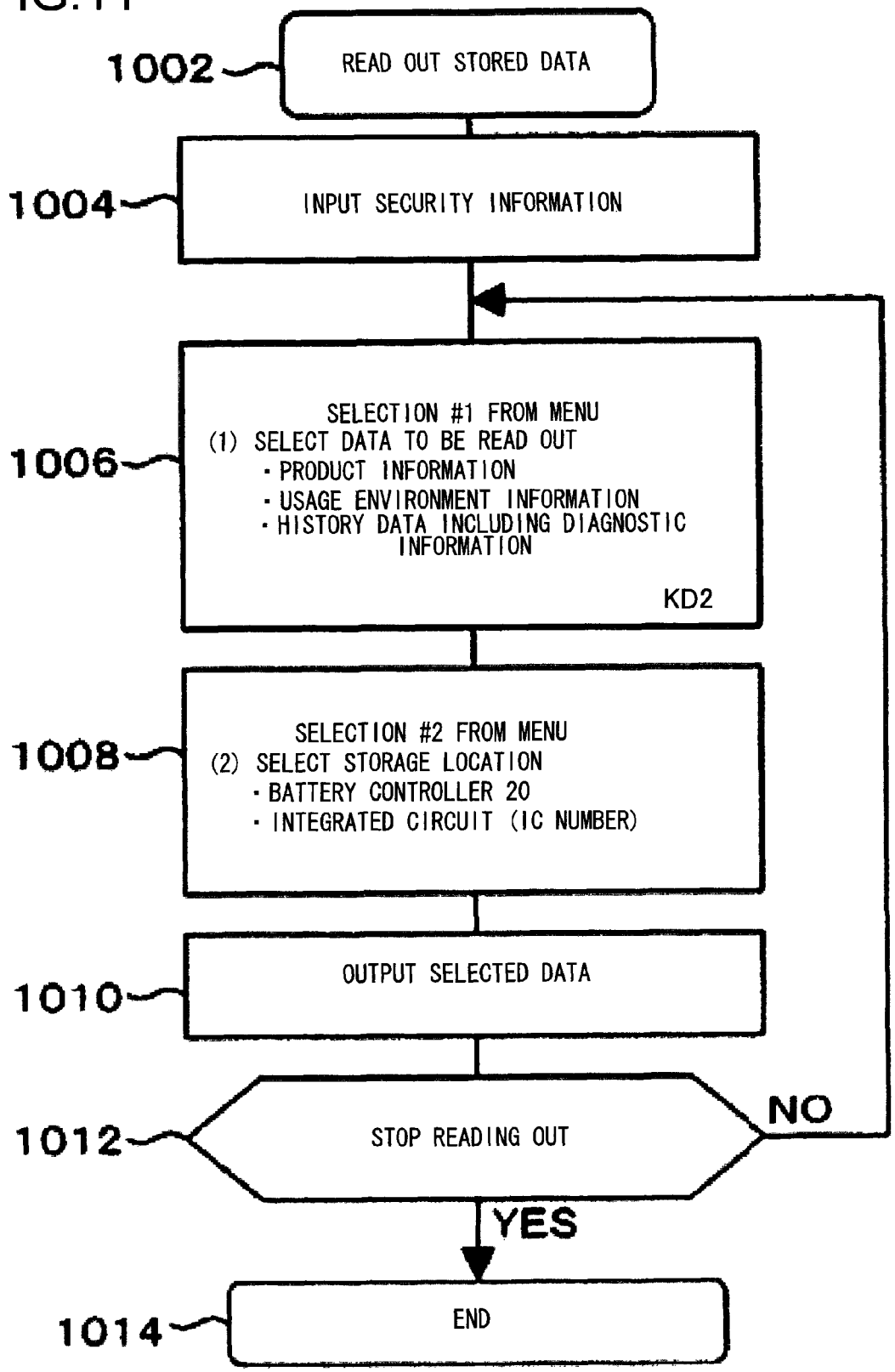
FIG. 11 is a flow chart for explanation of the operation of the monitoring device.

FIG. 10 is a system block diagram showing a monitoring system in which a monitoring device 904 is connected to the power supply system as an external device for reading out the file KD3 of FIG. 8 that specifies the usage environment of the lithium battery system and the file KD2 that is history data. And FIG. 11 is a flow chart showing the reading out of the data that is stored in the rewritable non-volatile memories 1116 or 1106 by the monitoring device 904 shown in FIG. 10. This power supply system 1 is the same as the power supply system 1 shown in FIG. 7. However, if just the battery controller 20 is capable of operating by itself even when the battery module 10 and the cell controller 80 are not in their operational states, then it is possible to read out the stored data from the battery controller 20 by connecting together the battery controller 20 and this monitoring device 904 with a communication circuit.

The monitoring system according to the above description includes the power supply system 1 and the monitoring device 904, and this monitoring device 904 includes a display unit 906 and an actuation unit 908, and also has an internal processing circuit that includes a computer. The processing circuitry of the monitoring device 904 performs operation as shown in FIG. 11.

In a step 1002 shown in FIG. 11, when the reading out of stored data is selected with the actuation unit 908 from a display menu on the display unit 906, the flow of control proceeds to a step 1004, in which an input request for security data is displayed upon the display unit 906. This security data operates as a password, and when the security data is inputted from the actuation unit 908, this inputted data is compared with the data D41 of FIG. 8, i.e. with the security data stored in the rewritable non-volatile memory 1116 shown in FIG. 7, and, if it bears a relationship thereto that is fixed in advance, then the flow of control advances to the next step 1006.

In this step 1006, a menu is displayed on the display unit 906 for the details of the data to be read out. The information that the user desires to be read out is selected from this menu: it may be the product information D21 (FIG. 8) related to the subject product with which this power supply system 1 is used; it may be the environment information KD3 describing the environment in which the battery has been used; or it may be the history data KD2 that includes diagnostic information of various types.

If stored data is to be read out from data stored in one of the rewritable non-volatile memories 1106 that are housed internally to the integrated circuits 3A through 3N rather than from the rewritable non-volatile memory 1116 of the battery controller 20, then the storage location of the data that the user desires to be read out is selected in a step 1008. If the data is only stored in the battery controller 20, or if the integrated circuits 3A through 3N are not connected, then this step 1008 is unnecessary. It should be understood that a message to the effect that reading out cannot be performed is displayed upon the display unit 906 of the monitoring device 904, when the data in the integrated circuits 3A through 3N cannot be read out in cases that the integrated circuits 3A through 3N were produced so as not to incorporate any rewritable non-volatile memories 1116, or that the integrated circuits 3A through 3N are not connected, or that an anomaly has occurred in, for example, the transmission path 52 or 54 that connects the integrated circuits 3A through 3N of FIG. 1 to the battery controller 20 or the like, or that the data in the integrated circuits 3A through 3N cannot be read out.

Next in a step 1010 the data that has been selected is displayed upon the display unit 906. If it is necessary to output the data electronically, then electronic data is outputted to an external memory means, although this feature is not shown in FIG. 10.

In a step 1012, a display asking whether or not the user desires to output any further data, in other words whether or not the task of reading out has been completed, is displayed upon the display unit 906, and if the user desires further information to be read out then the flow of control returns to the step 1006 for a second time. When input operation for termination is performed in this step 1012 from the actuation unit 908 of the monitoring device 904, then the flow of control proceeds to a step 1014 and this series of steps terminates.

The method of storing data in the rewritable non-volatile memory 1116 that is provided internally to the battery controller 20, for which an EEPROM is used, will now be explained with reference to FIGS. 12 through 15 and FIGS. 21 through 23. This method may also be employed in a similar manner when storing the data shown in FIG. 8 in the rewritable non-volatile memories 1106 that are provided internally to the integrated circuits 3A through 3N. Furthermore, this method can also be employed for storage of data related to a power supply system for an industrial machine of a general type that is provided with lithium cells, and thereby, in a data storage system that utilizes a rewritable non-volatile memory, the reliability of the writing and storage of data is enhanced.

While, as described above, it is possible to employ the following data storage method for all of the rewritable non-volatile memories 1106 and 1116, as a representative example, it will be explained in connection with the rewritable non-volatile memory 1116 that is housed internally to the battery controller 20.

Figure 12:
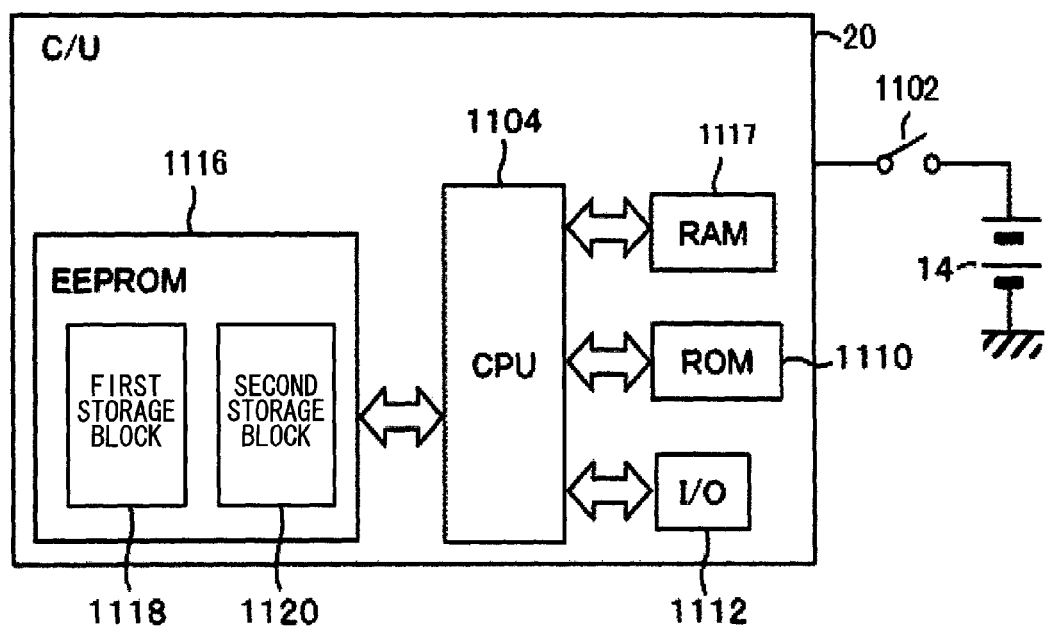
FIG. 12 is a block diagram of an electronic control device that includes a non-volatile memory.

FIG. 12 is a block diagram showing the battery controller 20, and this is provided with the rewritable non-volatile memory 1116, a CPU 1104, a RAM 1117, a ROM 1110, and an input and output interface 1112. This structure can be used in a general type of lithium power supply system, and an extremely great advantageous effect is obtained thereby, since it is possible to store the information that is required for cell control with high reliability. Via a switch 1102 of self-interrupter, low voltage electrical power of a 14 volt system is supplied from a power source 14 to the battery controller 20 that is provided internally to the power supply system shown in FIG. 7. It should be understood that, in this explanation, the contents written and read out are as previously explained with reference to FIG. 8, and the timing of writing and reading is as previously explained with reference to FIG. 9. Moreover, it should be understood that this method explained below for writing and reading out is extremely effective for enhancing the reliability, irrespective of the contents to be written or read out, and irrespective of the timing of writing and reading out.

The detailed operation of various embodiments for writing data into the non-volatile memory and for updating this data will now be further explained with reference to FIGS. 13 and FIGS. 21 through 23. —Embodiment #1 of Writing Data into and Reading Data Out from the Non-volatile Memory—

Figure 13:
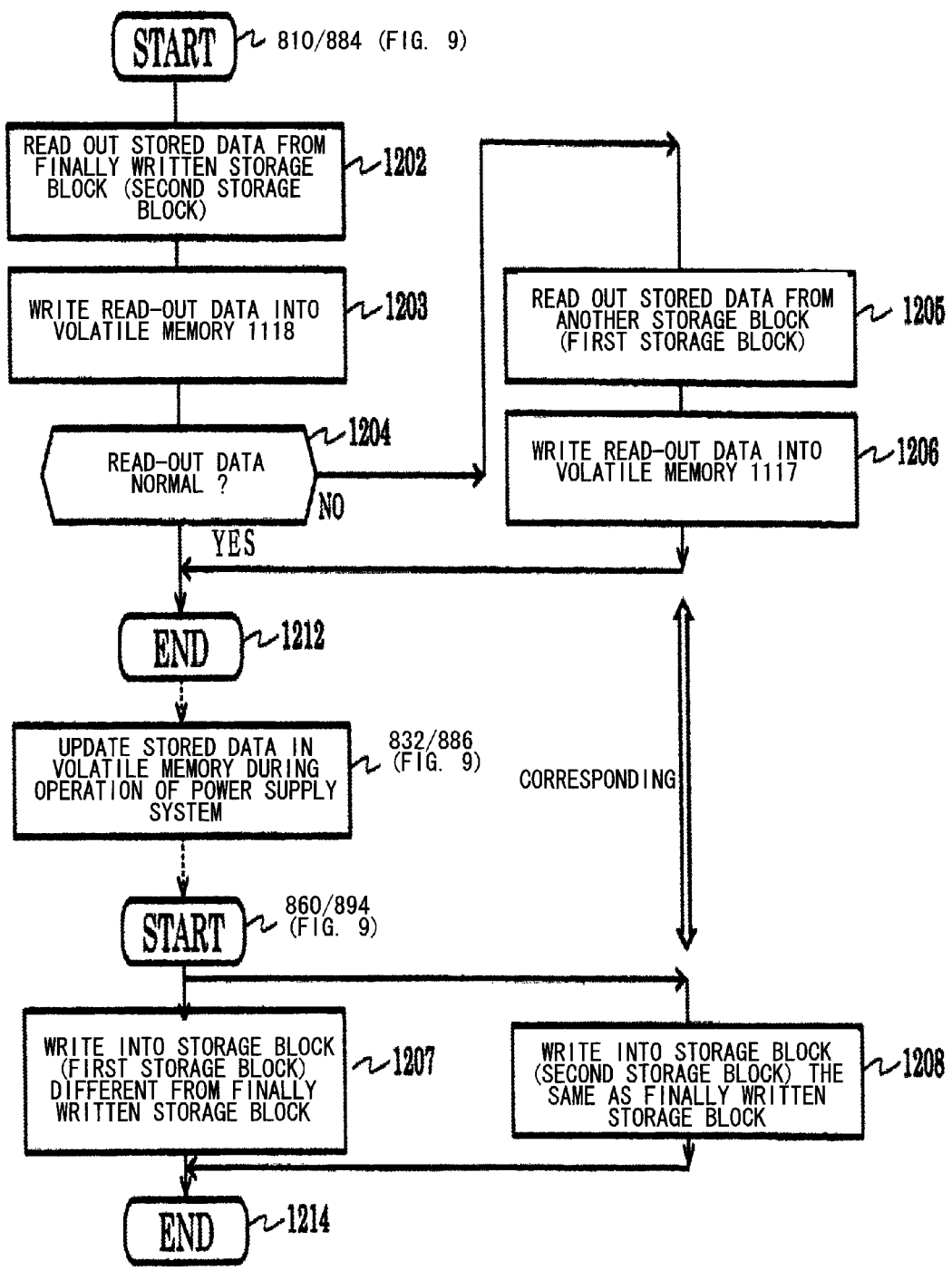
FIG. 13 is a flow chart for explanation of the operation of writing into the non-volatile memory.

FIG. 13 is a figure showing a portion of FIG. 9 in further detail. The operational flow from the START to the END at the upper side of FIG. 13 corresponds to the step 810 or to the step 884 of the starting control of FIG. 9 in which the reading or writing operation for the non-volatile memory is checked, and in which a malfunction has been found in the reading or writing operation. And the flow from the START to the END at the lower side corresponds to the step 860 or to the step 886 during the ending control of FIG. 9. The step between these two flows from START to END corresponds to the step 832 or the step 836 of FIG. 9 during normal control. Since the steps other than these are the same as in FIG. 9, they are omitted.

In a step 1202 of the flow from the START to the END at the upper side of FIG. 13, as explained in the step 810 of FIG. 9 described above, the stored data stored in the rewritable non-volatile memory 1116 is read out, and then in a step 1203 it is written into the volatile memory RAM 1117.

Then in a step 1204 a check is performed as to whether or not the information in this stored data that has been read out is correct. This check may, for example, be performed by a parity checking method. With the power supply system 1 shown in FIG. 7 that uses lithium cells, the main information that is to be stored is the information shown in FIG. 8. As shown in FIG. 12, the storage region of the rewritable non-volatile memory 1116 is provided with at least two storage blocks, a first storage block 1118 and a second storage block 1120.

Now the operation of the first storage block 1118 and the second storage block 1120 will be explained with reference to FIG. 21(a).

Figure 21:
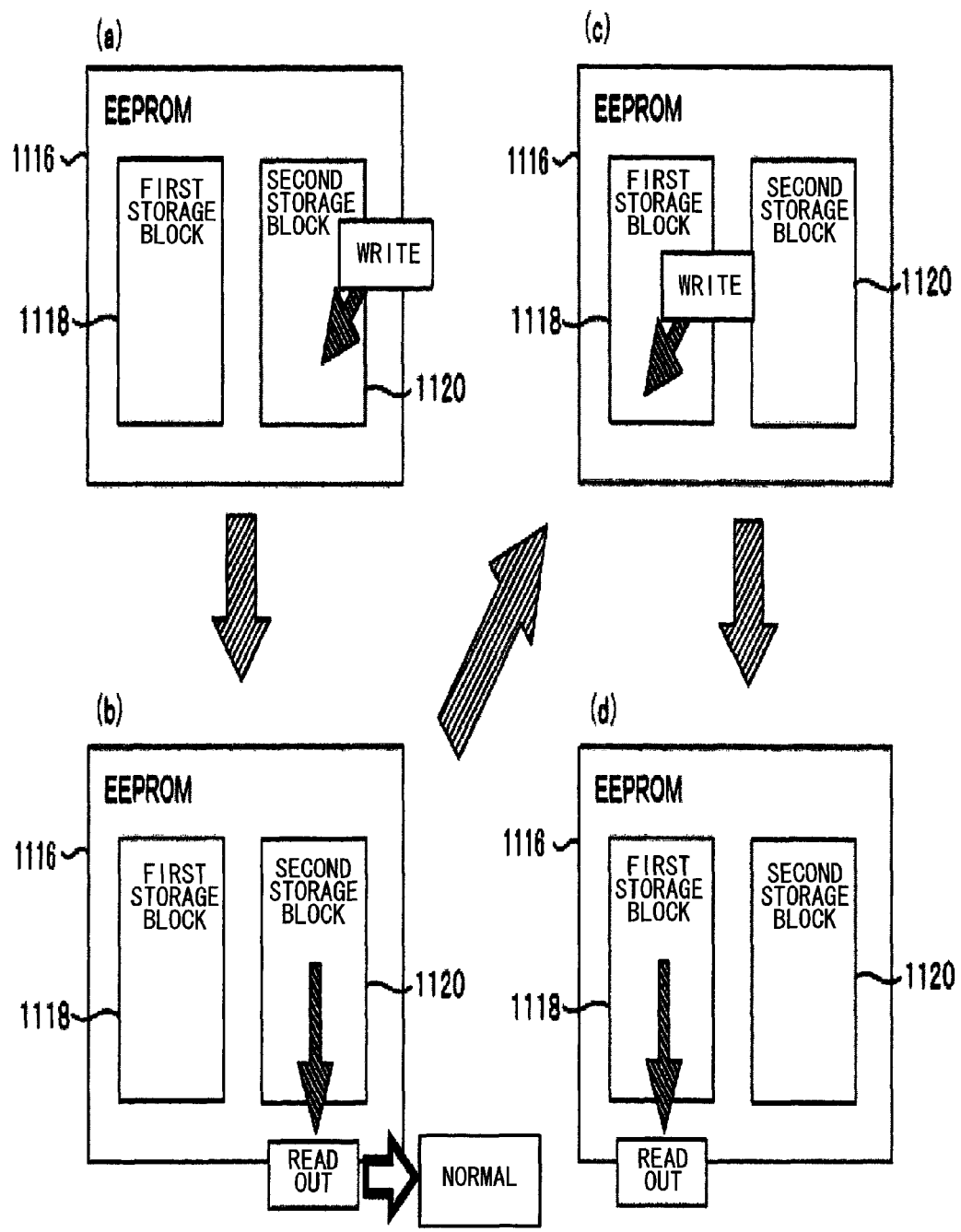
FIG. 21 is a state transition diagram for the non-volatile memory, for explanation of the operation shown in FIG. 13.

It should be understood that, here, FIG. 21 corresponds to FIG. 13. In other words, the final step 884 of the starting control of FIG. 9 corresponds to FIG. 21(a). Moreover, in order to simplify the explanation, in FIG. 21, the non-volatile memory from which the data is initially read out in the starting control of FIG. 9 (the step 810) is the first storage block 1118 of FIG. 21.

The processing described from FIG. 21 to FIG. 27 and referred to in the following explanation is an operational flow corresponding to when the reading and writing operation has been checked for all of the non-volatile memory in the step 810 or 884 of the starting control of FIG. 9 and a malfunction has been found in the writing operation, and the other operations are omitted. Furthermore, as will be described hereinafter, the block of the non-volatile memory from which the data is initially read out by the starting control in the stopped state of the battery system might not be the block 1118; it could also be the block 1120, or some other block.

Since it was supposed that, in the starting control, the data was initially read out from the first storage block, accordingly, as will be described in detail hereinafter, the storage region in the rewritable non-volatile memory 1116 in which the stored data is finally written in the final step 884 of the starting control (FIG. 21(a)) becomes the second storage block 1120. In the step 1202 described above, as shown in FIG. 21(b), the stored data is read out from the second storage block 1120, i.e. from the storage block in which it was finally written, and then in the step 1203 it is written into the volatile memory 1117.

Returning to the explanation of FIG. 13, in the step 1204, diagnosis is performed as to whether or not there is any error in the information that has been read out from the rewritable non-volatile memory 1116, i.e. in the stored data that has been written into the volatile memory 1117. In this diagnosis, as described above, for example a parity checking method may be employed. If in this step 1204 it is decided that there is no error and that the data is correct, then the operation (the step 810 and 884) ends (END, 1212), and when the starting control ends the system shifts to normal control, as shown in FIG. 9.

Here, the same processing is performed as the processing in the step 832 or 886, and the data that has been read out into the volatile memory is updated during the operation of the power supply system.

The method of employing a parity check is one technique for diagnosing whether or not writing or reading out or the like of data has been performed normally, and it is a method in which testing for the presence or absence of error is performed for every number of bits, i.e. for every basic units consisting data. Supposing that the data consists of basic units of 8 bits, then it may be supposed that the data is configured by combining a plurality of these basic units. In order to test for the presence or absence of error in each of these basic units, a single parity bit is appended to each of the basic units. For each of the basic units, the value of each of its bits is either "1" or "0" in binary, and the value of its parity bit is determined so that this parity bit indicates whether the number of bits having, for example, the value "1" is an odd number or an even number. If, for each of these basic units, the value of evenness or oddness of the actual number of "1"s in the basic unit and the value of that parity bit agree with one another, then a diagnosis is made that the data is correct. Conversely, if they do not agree with one another, then a diagnosis is made that the data is erroneous.

When the operation of the power supply system ends, then the storage operation to the rewritable non-volatile memory 1116 of the steps 860 and 894 of the flow from the START to the END at the lower side of FIG. 9 is performed, and then in a step 1207, as shown in FIG. 21(*c*), the stored data of the volatile memory 1117 that has been updated is written into the first storage block 1118, this being different from the storage block 1120 of the rewritable non-volatile memory 1116 that was read out. It should be understood that this step 1207 of FIG. 13 corresponds to the steps 860 and 894 of FIG. 9. The writing operation terminates with the step 1214 of FIG. 13. Next, for example when the vehicle is restarted, when the flow of FIG. 13 is executed for a second time, in the step 1202 of FIG. 13, as shown in FIG. 21(*d*), the data is read out that was stored in the first storage block 1118 when the final write was performed.

The processing in the step 1204 of FIG. 13 when performing diagnosis if an error is present will now be explained with reference to FIG. 22.

Figure 22:
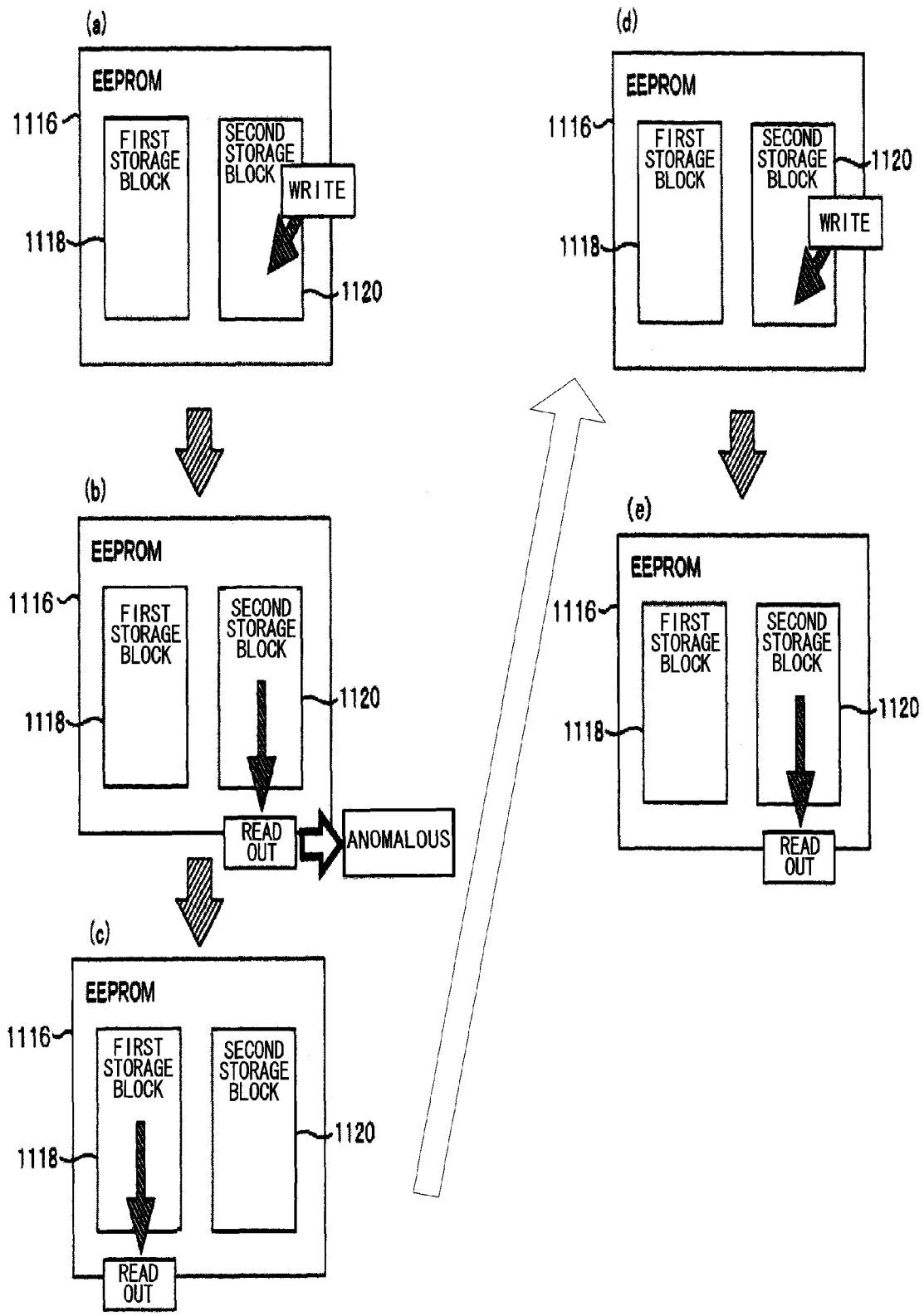
FIG. 22 is a state transition diagram for the non-volatile memory, when a data anomaly has occurred as shown in FIG. 13.

If, as shown in FIG. 22(*b*), a diagnosis has resulted that there is an error in the data of FIG. 22(*a*) that was read out from the second storage block 1120, then the flow of control proceeds from the step 1204 to a step 1205, and, as shown in FIG. 22(*c*), the stored data is read out that is stored in the first block, i.e. that is stored in another storage block. This stored data that is read out is the information shown in FIG. 8, as described above. The operation of reading out the stored data terminates with the step 1212. Next, the flow of control proceeds to the steps 832 and 886 of FIG. 9, i.e. to the operation of updating the stored data that has been read out as described above during the operation of the power supply system 1 as shown in the steps 860 and 894 of FIG. 9.

Next the operation of the power supply system ends, and the flow of control proceeds to the operation of storing the stored data that was updated in the operation of the steps 860 and 894 of FIG. 9 and that is stored in the volatile memory 1117 into the rewritable non-volatile memory 1116. In this case, since the storage block that was finally read out in the step 1205 was the first storage block 1118, accordingly, in the step 1208 of FIG. 13, the data that has been updated and that is stored in the volatile memory 1117 is written (FIG. 22(*d*)) to the second storage block 1120, i.e. to that storage block from which the data in which an anomaly was detected was read out in the step 1208 of FIG. 13. This is because, since there was an error in the information read out from the second storage block 1120, accordingly it will be acceptable for this past information that is erroneous to be deleted. By writing new information, the previous erroneous information comes to be replaced by this new information. It should be understood that, while the information in the first storage block is stored data that was written several cycles before, still it is nevertheless stored data that can be used, and it is information that can be employed if there is a failure in the writing process this time.

In the diagnostics of the step 1204, the possibility that the error in the information that has been read out actually has originated in an abnormality of the hardware structure of the rewritable non-volatile memory is extremely low, and in almost all cases the error is due to a cause such as noise or the like. Accordingly, by writing the stored data that has been updated into the second storage block 1120 in the step 1208, subsequently the normal state is returned to, in which updated data is written alternately in the first storage block 1118 and in the second storage block 1120.

—Embodiment #2 of Writing Data into and Reading Data Out from the Non-volatile memory—

A second embodiment of a method for writing the data into the non-volatile memory and of data updating will now be explained with reference to FIGS. 14 through 23. It should be understood that symbols that are the same as ones in FIG. 13 denote the same structures and functions, or mean that the same operations are performed.

It should be understood that, if the stored data in the rewritable non-volatile memory 1116 is read out and an anomaly has been found in this data that has been read out, then in a similar manner to the flow in FIG. 13 and to FIG. 21, the data that was updated by the step 1207 is taken as stored data for a second time, and is written into the rewritable non-volatile memory 1116.

Figure 14:
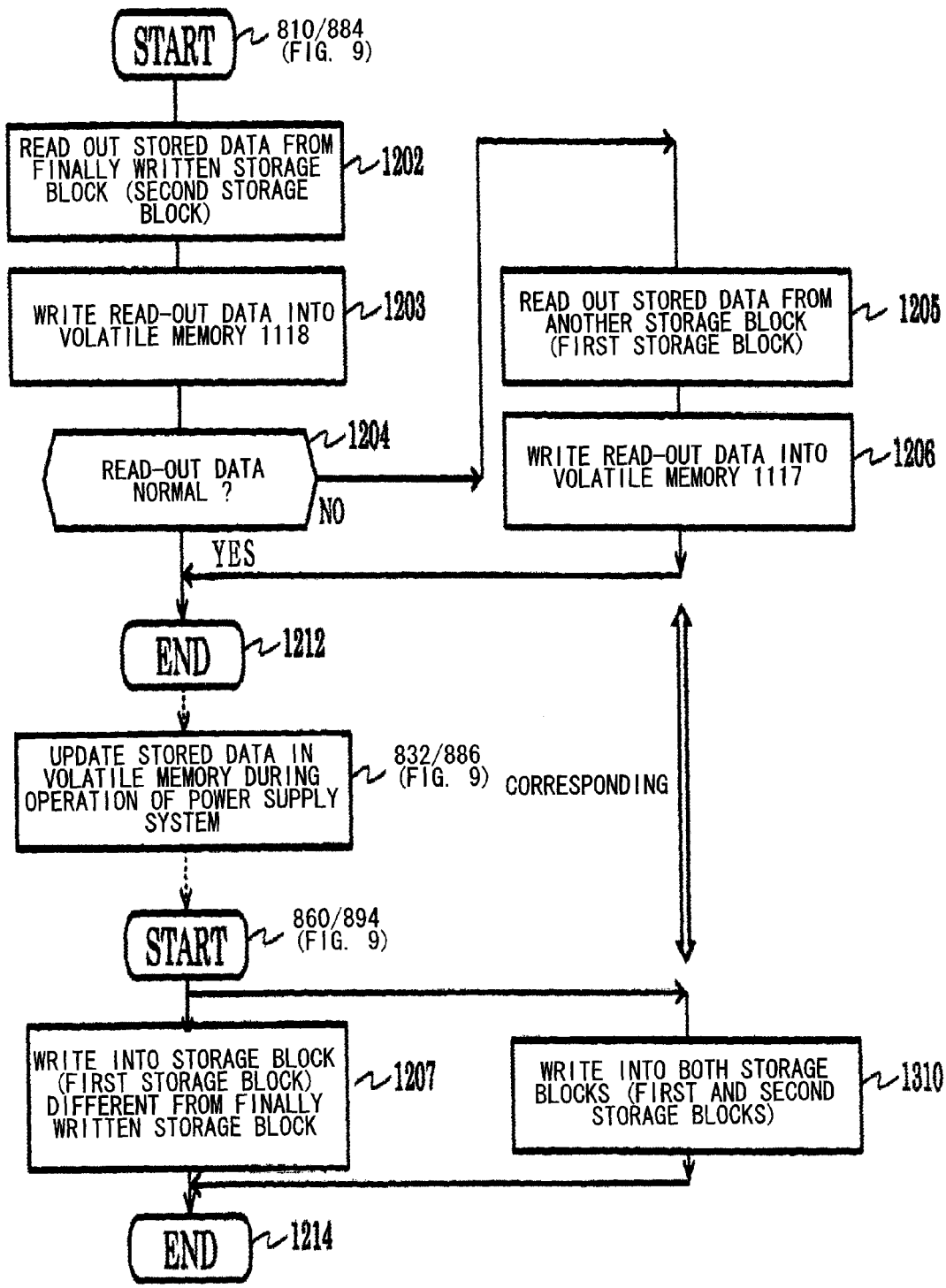
FIG. 14 is a flow chart showing another embodiment, for explanation of the writing operation therein.
Figure 23:
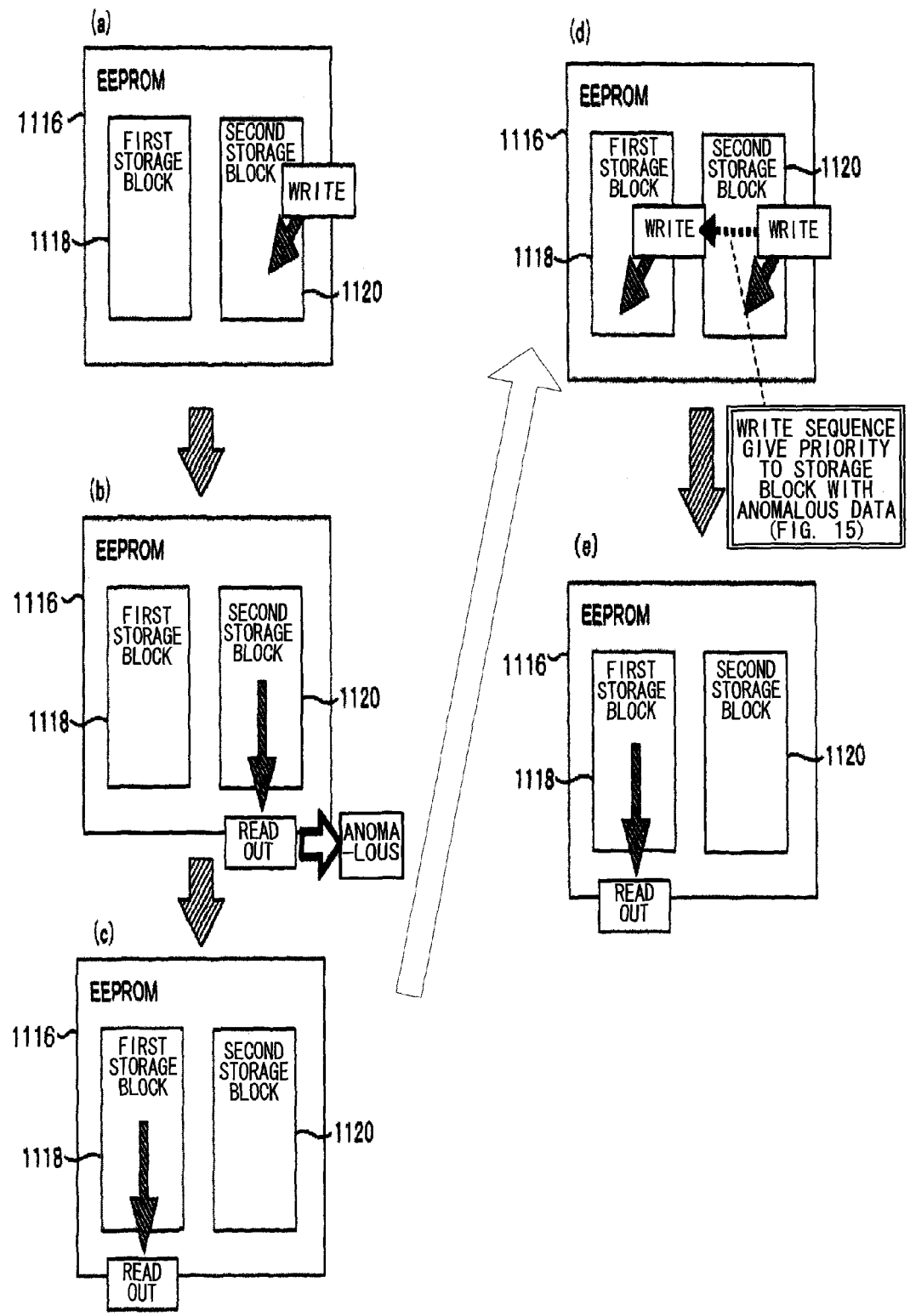
FIG. 23 is a state transition diagram for the non-volatile memory, for explanation of the operation shown in FIG. 15.

With the method described in FIG. 14, the operation from the step 1202 to the step 1212 for reading out the stored data in the rewritable non-volatile memory 1116 in the step 1202 and shifting this stored data that has been read out to the volatile memory 1117 is the same as the operation described in FIG. 13. FIG. 23 is a figure illustrating the operation of FIG. 14. And FIGS. 23(*a*), (*b*), and (*c*) are the same as FIG. 22(*a*), (*b*), and (*c*) in FIG. 22 that illustrate the operation of FIG. 13.

The methods for writing the stored data if it has been diagnosed that there is some anomaly in the data read out in the step 1204 of FIG. 14, are different in FIG. 13 (the step 1208) and in FIG. 14 (the step 1310). The method of FIG. 14 is, when writing the stored data in the volatile memory that has been updated into the rewritable non-volatile memory 1116 for a second time, as shown in the step 1310, not only to write the new data that has been updated into the second storage block 1120 from which the data that was not normal was read out, but also to write the data that is to be stored both into the first storage block 1118 and also into the second storage block 1120 (FIG. 23(*d*)). It should be understood that, in this case, when for example the vehicle is next restarted, as illustrated in FIG. 23(*e*), the reading out of the stored data if it is determined that an anomaly is present becomes, not from the second storage block (1120), but, as explained for the first embodiment of the data writing method into the non-volatile memory and data updating (FIG. 21), becomes the operation in the normal case, in which the data stored in the first storage block is read out.

Since, as described above, the writing is performed into both of the storage blocks (1118 and 1120), accordingly, even supposing that there is some anomaly in the storage area of the second storage block 1120, still it is possible to obtain high reliability, since the data is stored normally in the first storage block 1118.

—A Variant of Embodiment #2 of Writing Data into and Reading Data Out from the Non-volatile Memory—

A more effective method for writing data into the non-volatile memory will now be explained with reference to FIG. 15 and FIG. 23(*d*), although this is fundamentally the same as the method described in FIG. 14.

Figure 15:
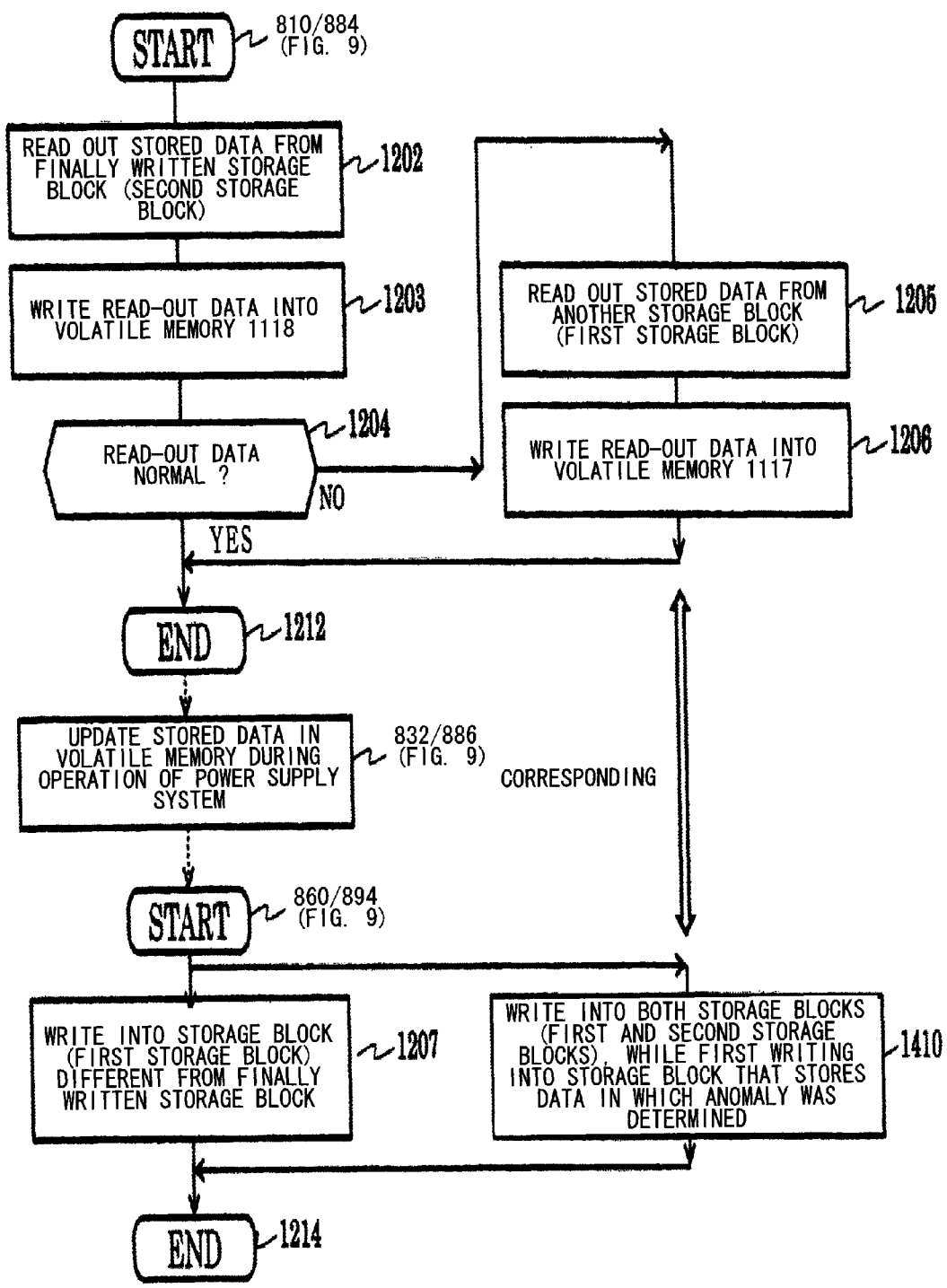
FIG. 15 is a flow chart showing yet another embodiment, for explanation of the writing operation therein.

In the flow shown in FIG. 15, the same reference symbols as ones in FIGS. 13 and 14 denote the same structures and the same operations. The portions that are different between FIGS. 14 and 15, are the steps 1310 and 1410. While the feature that the updated stored data of the volatile memory 1117 is written as stored data into the two blocks (1118 and 1120) of the non-volatile memory is the same, it is arranged first to write this data into that one of the storage blocks in which the data that was read out was anomalous, as shown in the explanatory figure of FIG. 23(*d*). In this embodiment, since the error was in the data that was read out from the second storage block 1120, accordingly operation is first performed to write the data that has been updated into the second storage block, i.e. into the storage block in which the error was present, and next operation is performed to write this data into the first storage block 1118, i.e. into the remaining block.

Since, as previously described, when the stored data is read out the next time, it is read out from the storage block that was written last, accordingly, as shown in FIG. 23(*e*), it will be read out from the first storage block, and thereafter it will be read out alternatingly, thus returning to a normal operation. The frequencies of usage of the first and second blocks are equalized, so that the reliability in the use of the rewritable non-volatile memory 1116 is can be enhanced. The reason that this type of operation is possible is that, if an error is present in reading out data from the memory, the chance of an anomaly having occurred in the memory itself is extremely small, and almost always this anomaly is due to the influence of accidental noise or the like during writing, so that the possibility of the error occurring for a second time is extremely low.

—The Second Embodiment—

Figure 16:
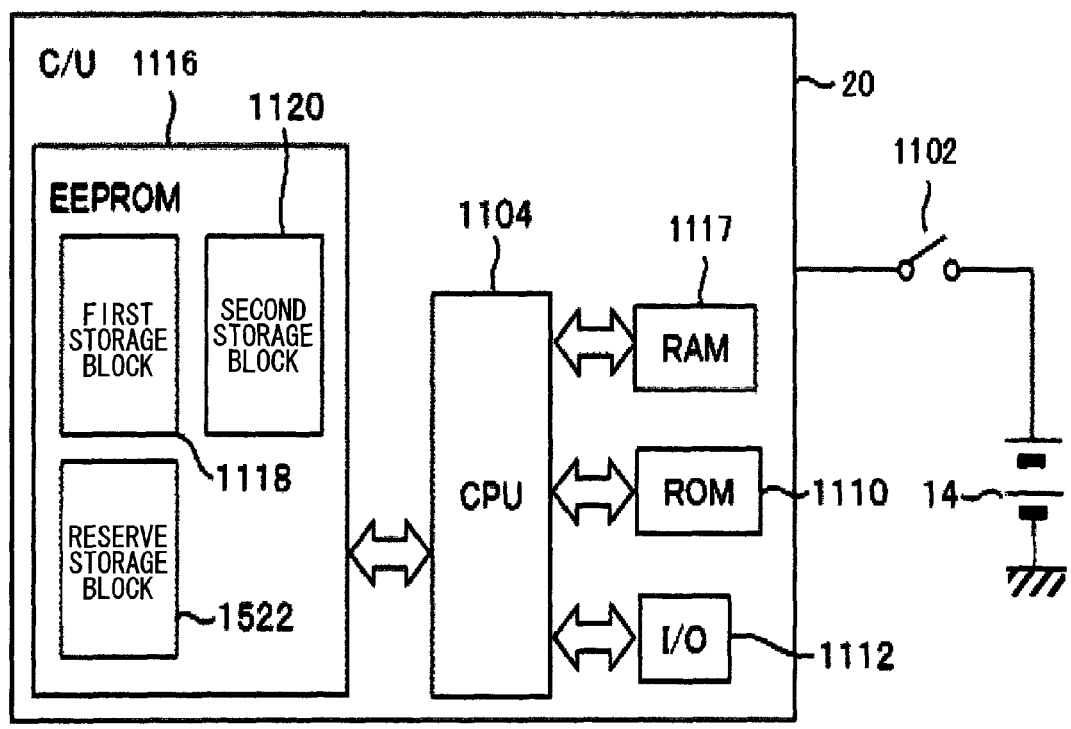
FIG. 16 is a block diagram of a reserve storage block, related to an embodiment of the present invention.

The structure shown in FIG. 16 is another embodiment of the structure of the non-volatile memory of the battery controller 20, this being a variant embodiment of the structure of the non-volatile memory shown in FIG. 12. Reference symbols that are the same as ones in FIG. 12 denote the same structures and the same operations. To compare with FIG. 12, in addition to the first storage block 1118 and the second storage block 1120, a reserve storage block 1522 is also provided in the rewritable non-volatile memory 1116 of FIG. 16. The operation for reading and writing data using this non-volatile memory whose structure is shown in FIG. 16 will now be explained with reference to FIGS. 17, 24, and 25.

—Example #1 of Writing Data into and Reading Data Out from the Non-volatile Memory in the Second Embodiment—

Figure 17:
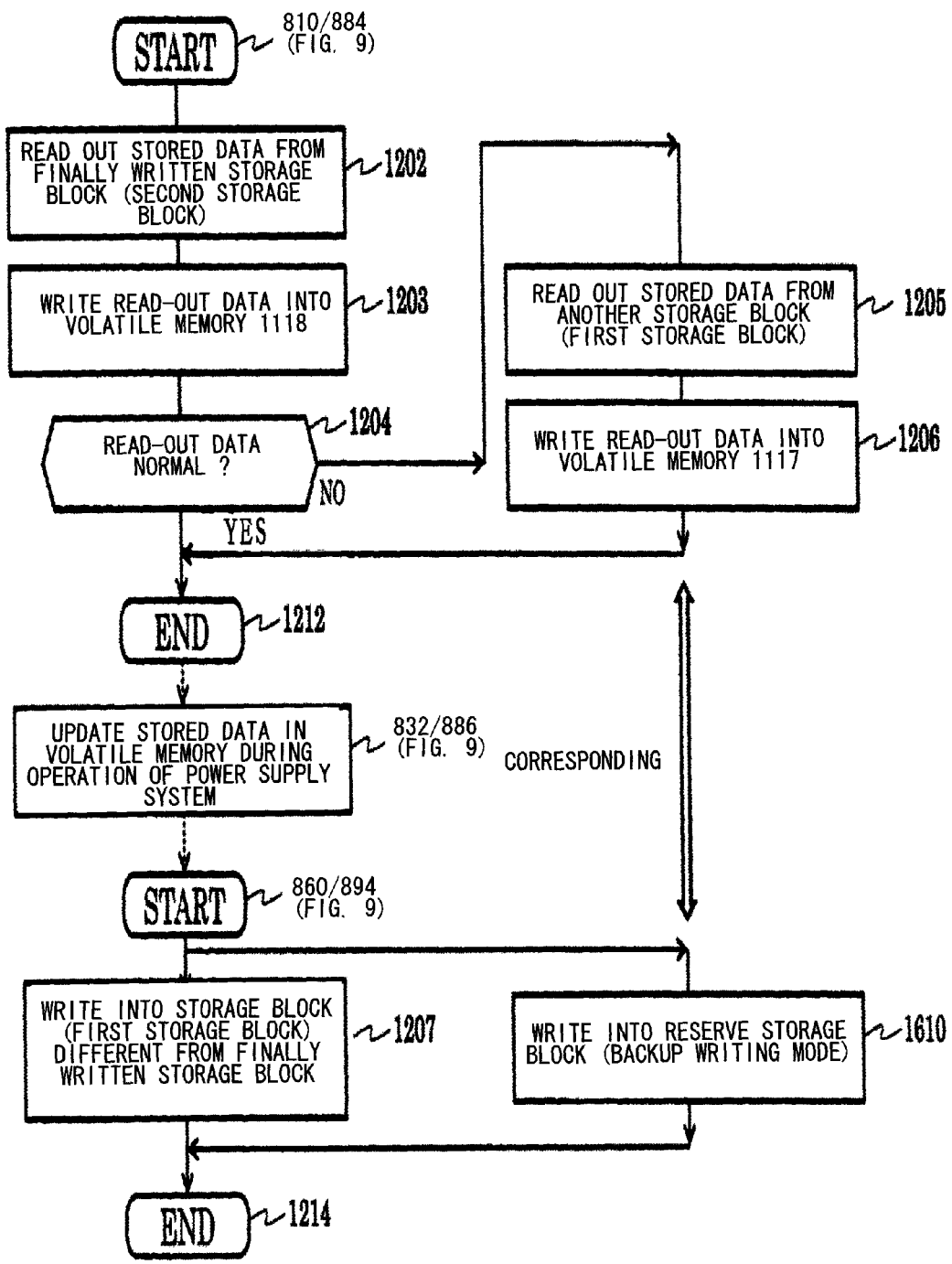
FIG. 17 is a flow chart for explanation of operation that includes a backup writing mode.

FIG. 17 is a flow diagram for the operation to read out and write the data, and reference symbols in FIG. 17 that are the same as ones in FIGS. 13 through 15 denote the same operations. In particular the fundamental portions of the overall structure and operation of the flow diagram of FIG. 17 are almost the same as those of the flow diagram of FIG. 13, already explained. Accordingly, only the features that are different from the flow diagram of FIG. 13 will be explained. Moreover, the operations of writing to the memory blocks and reading out from the memory blocks corresponding to the flow of FIG. 17 are shown in FIG. 24 (when the data that has been read out is normal) and in FIG. 25 (when the data that has been read out is anomalous).

Figure 24:
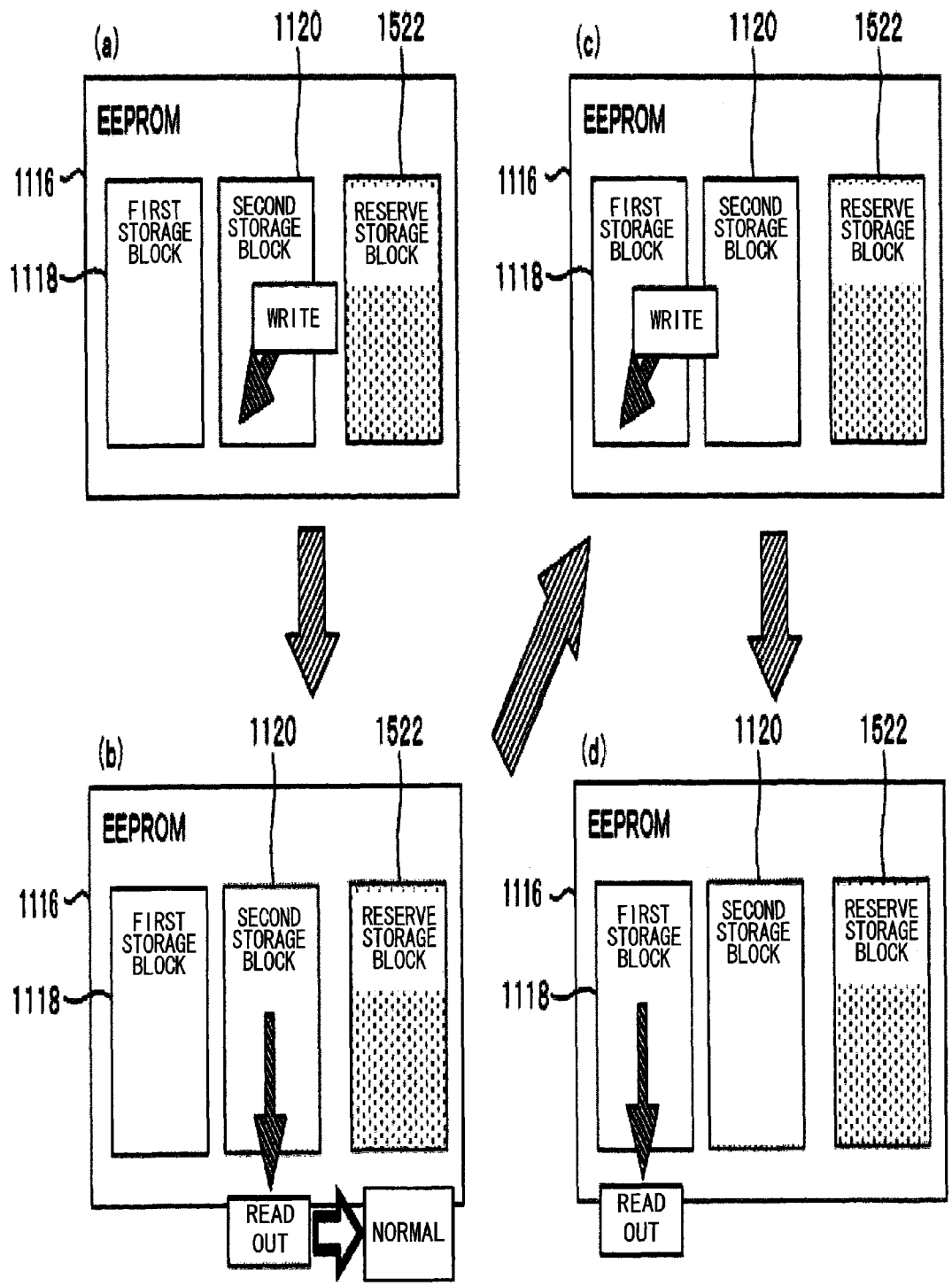
FIG. 24 is a state transition diagram for the non-volatile memory, for explanation of the operation shown in FIG. 16.

In the steps 1202 and 1203 of the flow shown in FIG. 17, as shown in FIG. 24(*a*), if the storage block in which updated data has been written most recently is the second storage block 1120, then the stored data is read out from the second storage block 1120, and is stored in the volatile memory 1117. Then in the step 1204 of FIG. 17, a diagnosis is made as to whether there is any anomaly in the data that has been read out (FIG. 24(*b*)). This diagnosis is performed by the same method using parity checking as described above.

If the data that has been read out is normal, then, as shown in FIG. 24, upon the next writing operation (the step 1207), the data that was updated in the step 832 or in the step 894 of FIG. 17 is written into the first storage block 1118 (FIG. 24(*c*), this being another block that is different from the block that was last read out from, and then this process terminates. Accordingly, for example when the vehicle is restarted, when the stored data is read out from the writable non-volatile memory 1116 in the step 1202, as shown in FIG. 24(*d*), it comes to be read out from the first storage block 1118.

Figure 25:
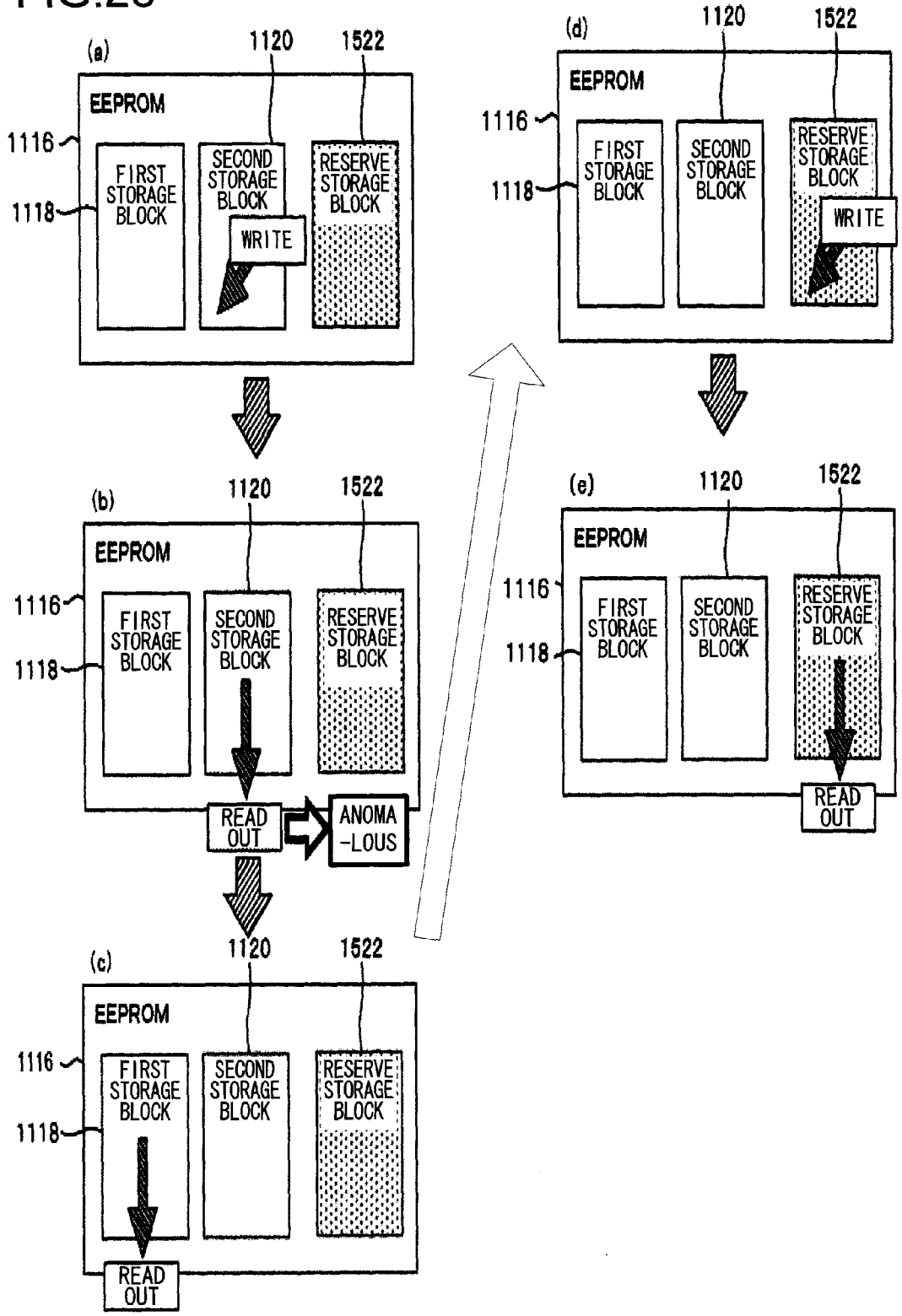
FIG. 25 is a state transition diagram for the non-volatile memory, for explanation of the operation shown in FIG. 17.

If there is some error in the data that has been read out in the operational flow of FIG. 17 (FIG. 25(*b*)), then as described in the step 1205 the stored data in the first storage block 1118 is read out (FIG. 25(*c*)), and is written into the volatile memory 1117 (the step 1206). Next the data is updated on the basis of the data that has been written into the volatile memory 1117. The operation up until this point is the same as the operational flow of FIGS. 13 through 15. The point of difference in the operational flow of FIG. 17 is that, when next storing the updated data in the writable non-volatile memory 1116, a step 1610 is executed.

In this case, as shown in FIG. 25, the destination for newly writing the updated data is not the second storage block 1120, but is taken as being the reserve storage block 1522, so that in this step 1610 writing is performed into this reserve storage block 1522 (FIG. 25(*d*)), and then operation terminates. By writing into the reserve block in this manner, when the step 1202 is executed as for example when the vehicle is restarted, the stored data that is stored in the reserve storage block in which writing was last performed is read out (FIG. 25(*e*)), and is stored in the volatile memory 1117. By doing this, even supposing that an anomaly has occurred in the hardware of the second storage block 1120, it is still possible to resolve this anomaly, so that the reliability is enhanced.

—Variant Example #1 of Example #1 of Writing Data into and Reading Data Out from the Non-volatile Memory in the Second Embodiment—

Figure 18:
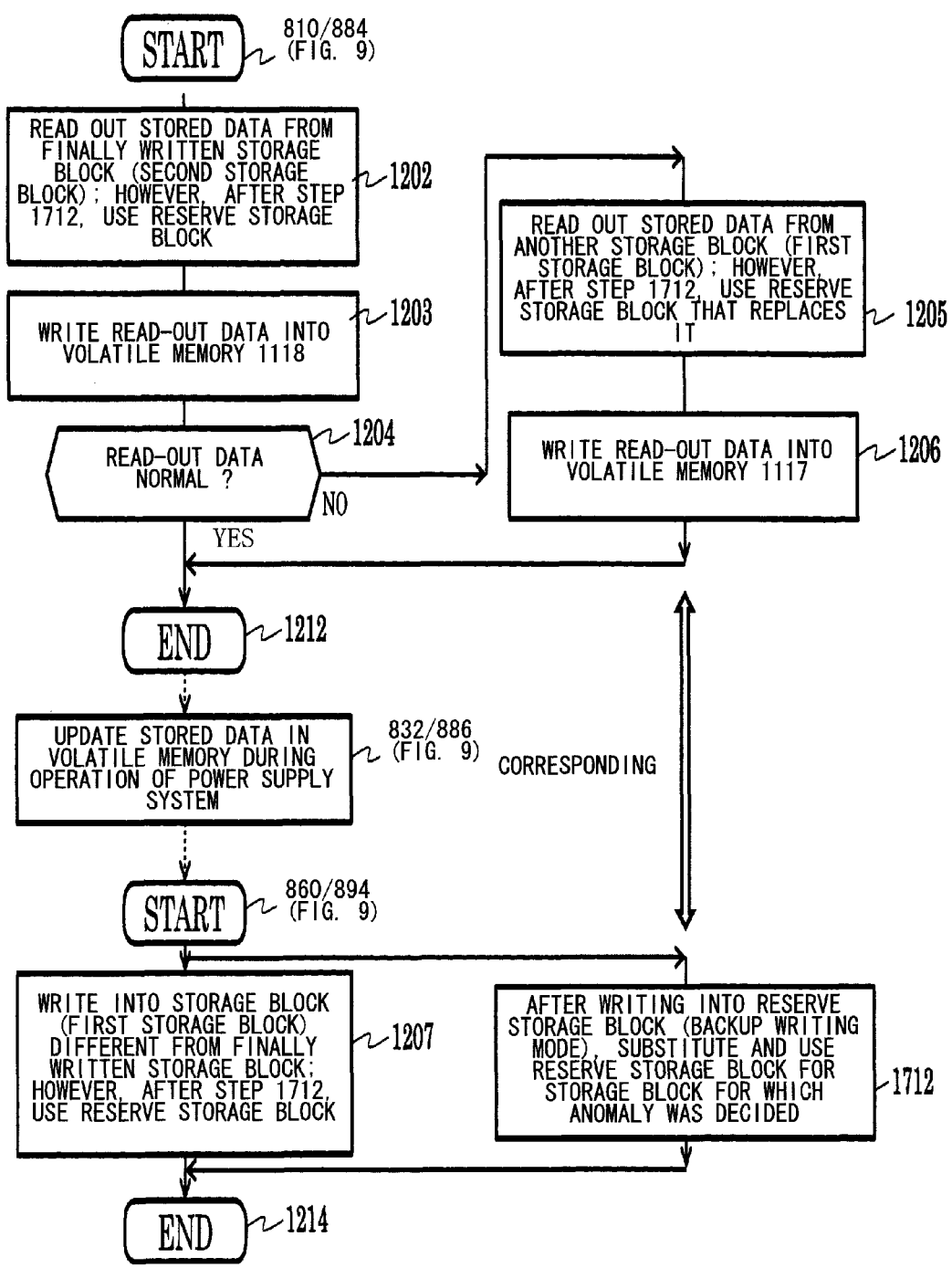
FIG. 18 is a flow chart for a case in which a block function replacement means is provided.

The operational flow of FIG. 18 is a variant example of the operational flow of FIG. 17, and the same reference symbols as ones in FIG. 17 denote the same functions. Moreover, the operations of writing to the memory blocks and reading out from the memory blocks corresponding to the flow of FIG. 18 are shown in FIG. 24 (when the data that has been read out is normal) and in FIG. 26 (when the data that has been read out is anomalous).

If, in the step 1204, no error is found in the data that has been read out from the rewritable non-volatile memory 1116, then the steps 1202, 1203, and 1207 of FIG. 18 have the same function and perform the same operations as those in FIG. 17. Accordingly, the operation in this case becomes the one shown in FIG. 24. Moreover, in a similar manner to the case in FIG. 17, the data written in the step 1203 in the volatile memory 1117 is updated in the step 832 or in the step 886, next in the step 1207 the updated data is stored in the writable non-volatile memory 1116, and finally writing is performed into a storage block that is different from the storage block in which the data was written, in other words into a storage block that is different from the storage block from which the data was read out this time in the step 1202.

Figure 26:
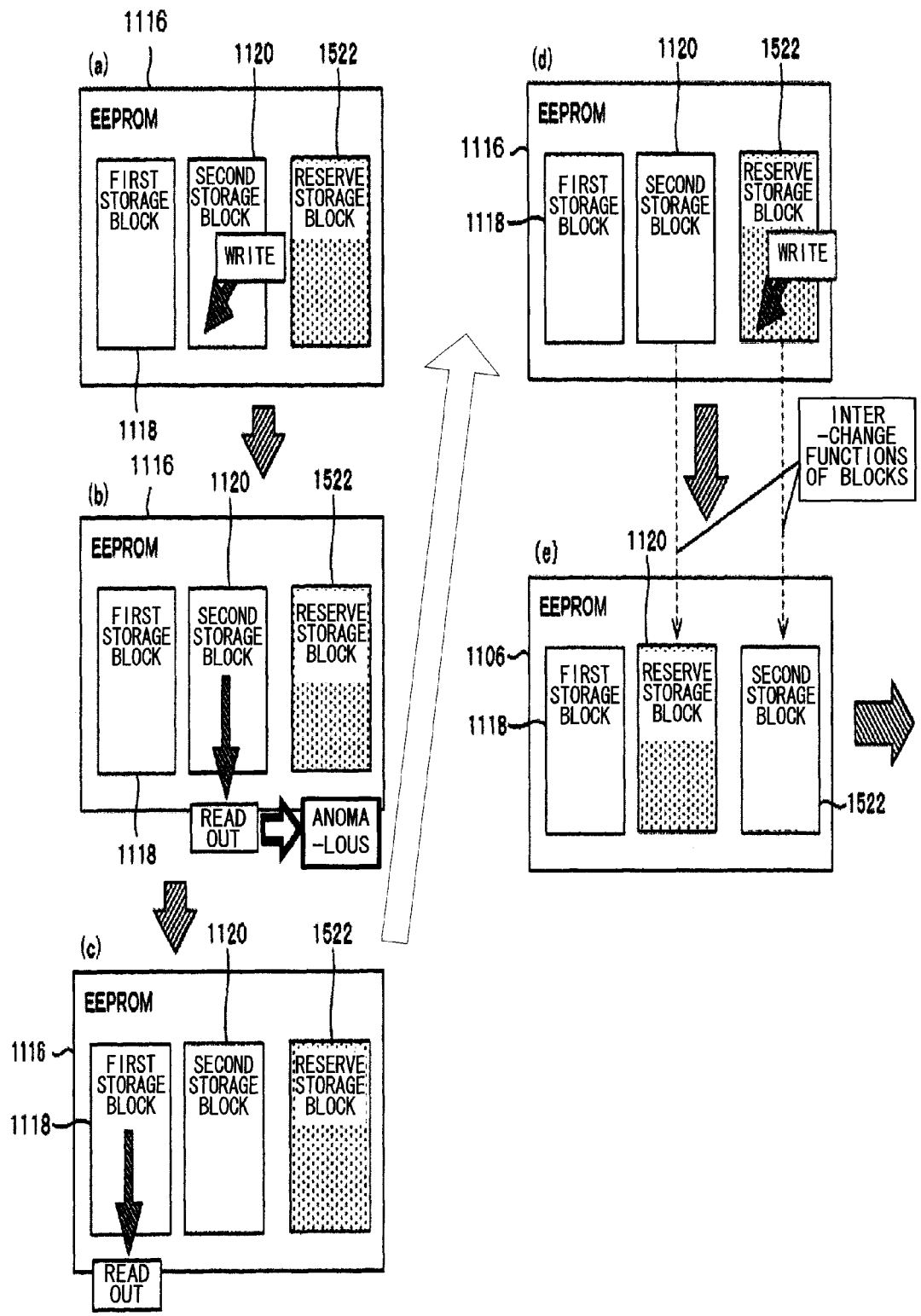
FIG. 26 is a state transition diagram for the non-volatile memory, for explanation of the operation shown in FIG. 18.

Next, if an error is detected in the step 1204 in the data that has been read out (FIG. 26(*b*)), then in the steps 1205 and 1206, in a similar manner to the operational flow in FIG. 17, among the pair of storage blocks, the data is read out from that storage block that is different from the storage block that had a data error (FIG. 26(*c*)), and is stored in the volatile memory 1118. After having performed updating of the stored data in the step 832 or in the step 886, in a step 1712 the stored data that has been updated is written for a second time into the writable non-volatile memory 1116. At this time, also, the storage block from which the data having an error was read out is exchanged for the reserve storage block 1522, so that there is a structure of a pair of storage blocks for storing the stored data alternatingly.

In FIG. 26(*a*) the stored data is written into the second storage block 1120, and, as shown in FIG. 26(*b*), if any error is present in the data that has been read out from the second storage block into which the final writing was performed (FIG. 26(c)), then, as shown in FIG. 26(d), the destination for writing in the step 1207 of FIG. 18 is taken as being the reserve storage block 1522, and moreover, as shown in FIG. 26(e), the second storage block 1120 from which the data in which the error occurred was read out and the reserve storage block 1522 are exchanged with one another, so that the structure of a pair of storage blocks now consists of the first storage block 1118 and the reserve storage block 1522.

After the operation of this step 1712, in the steps 1202, 1207, and 1205 of FIG. 18, operation continues while taking the structure of the pair of storage blocks is taken as being the first storage block 1118 and the reserve storage block 1522. In other words, as shown in FIG. 26(e), in the subsequent operation, the second storage block becomes the reserve storage block 1522, and the reserve storage block becomes the second storage block 1120. Here, furthermore, in the error diagnosis operation of the step 1204, if an error is discovered in the data that has been read out, then, in the operation of the subsequent step 1712, the reserve storage block that, as shown in FIG. 26(e), is in the state of being a reserve storage block that has not been used, and the second storage block in which an error in the data that has been read out has been discovered, are interchanged. By taking the storage block in which an error occurs as being a reserve storage block in this manner, the result is obtained that any storage block in which the number of occurrences of anomalies is great comes to be eliminated from the storage blocks in which stored data is stored, so that the reliability is enhanced.

—Variant Example #2 of Example #1 of Writing Data into and Reading Data Out from the Non-volatile Memory in the Second Embodiment—

Figure 19:
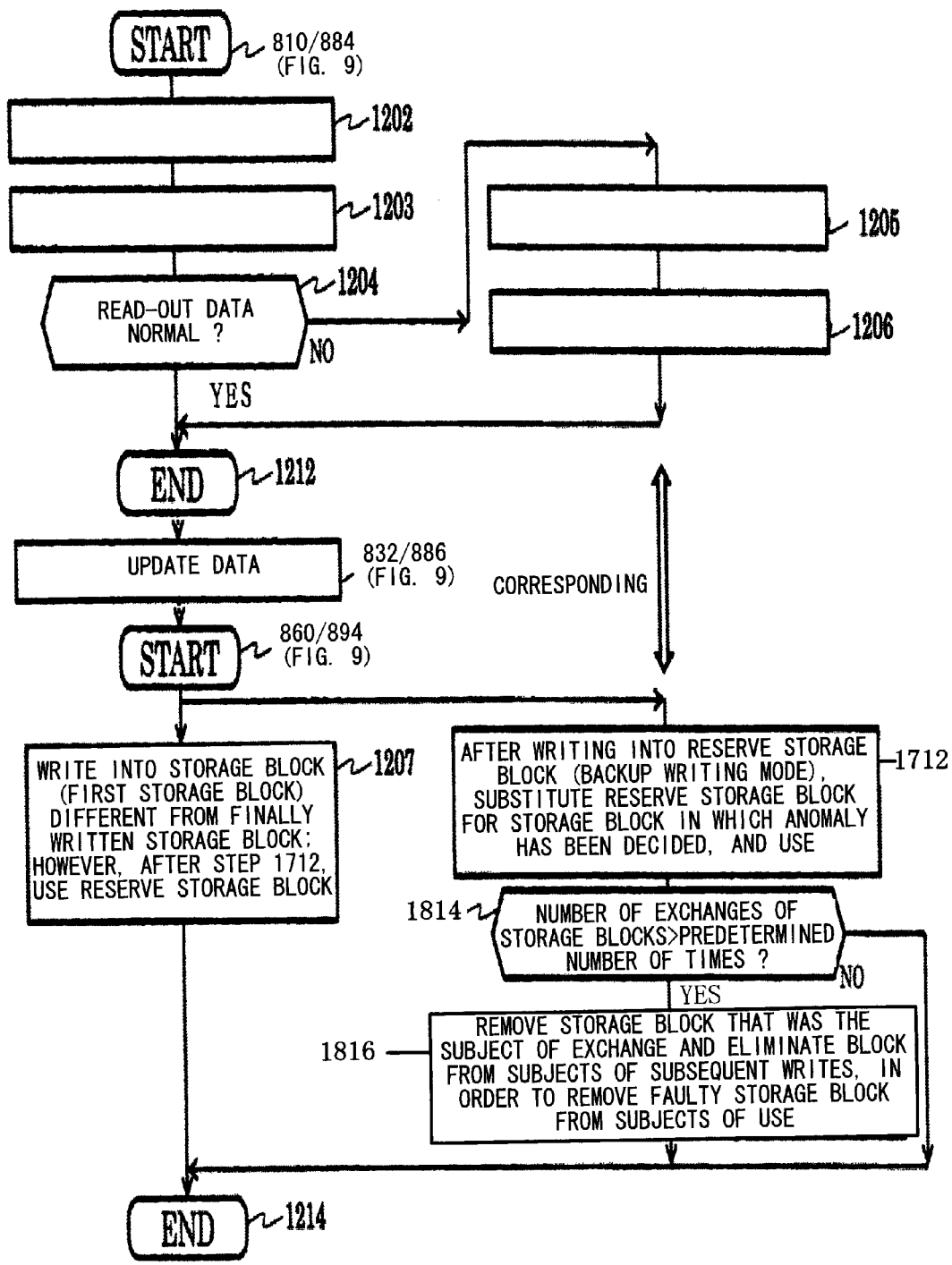
FIG. 19 is a flow chart for a case in which a faulty block exclusion means is provided.

The operational flow shown in FIG. 19 is another variant example of the operational flow of FIGS. 17 and 18. The steps 1202, 1203, 1204, 1205, 1206, and 1212 shown in FIG. 19 have the same operation and the same functions as the steps having those reference symbols, already explained. Moreover, the steps 832, 886, 1207, and 1712 also have the same operation and the same functions as the steps having the same reference symbols, already explained. Furthermore, the operations of writing to the memory blocks and reading out from the memory blocks corresponding to the flow of FIG. 19 are shown in FIG. 24 (when the data that has been read out is normal) and in FIG. 27 (when the data that has been read out is anomalous).

If, when the flow described in FIG. 18 is repeatedly executed, two of the storage blocks are normal among three storage blocks, i.e. a first, a second and a reserve storage blocks, then these two normal storage blocks are selected, and the stored data to be stored is written alternatingly into these two normal storage blocks. However if two of the storage blocks among the three storage blocks develop anomalies, then, although one normal storage block can be selected among the pair of two storage blocks, one anomalous storage block is selected from among the remaining storage blocks. And the two anomalous storage blocks become the reserve storage block alternatingly.

The operational flow shown in FIG. 19 has the function of separating two storage blocks that are anomalous from the storage blocks that are the subjects of use. In other words, in the operational flow shown in FIG. 19, new steps 1814 and 1816 are provided, and, along with the operation of substitution for the step 1712 of FIGS. 18 and 19 for the two anomalous storage blocks to become the reserve storage block alternatingly, the number of times that these storage blocks are exchanged is counted, and it is decided that anomalies are occurring in both of the two storage blocks by this count value reaching or exceeding a number of times that is determined in advance. And in the step 1816 they are removed from the subjects of use. In this case, the remaining normal storage block comes to be repeatedly used.

By an operational flow of this type, it is possible to check whether this is simply an error due to noise, or whether, along therewith, this is erroneous operation based upon a cause related to the circuitry of the blocks that cannot be repaired. If the number of occurrences of error have exceeded the predetermined value, then it is decided that this is erroneous operation based upon a cause that cannot be corrected, and it becomes possible to remove this block from the objects of use.

Figure 27:
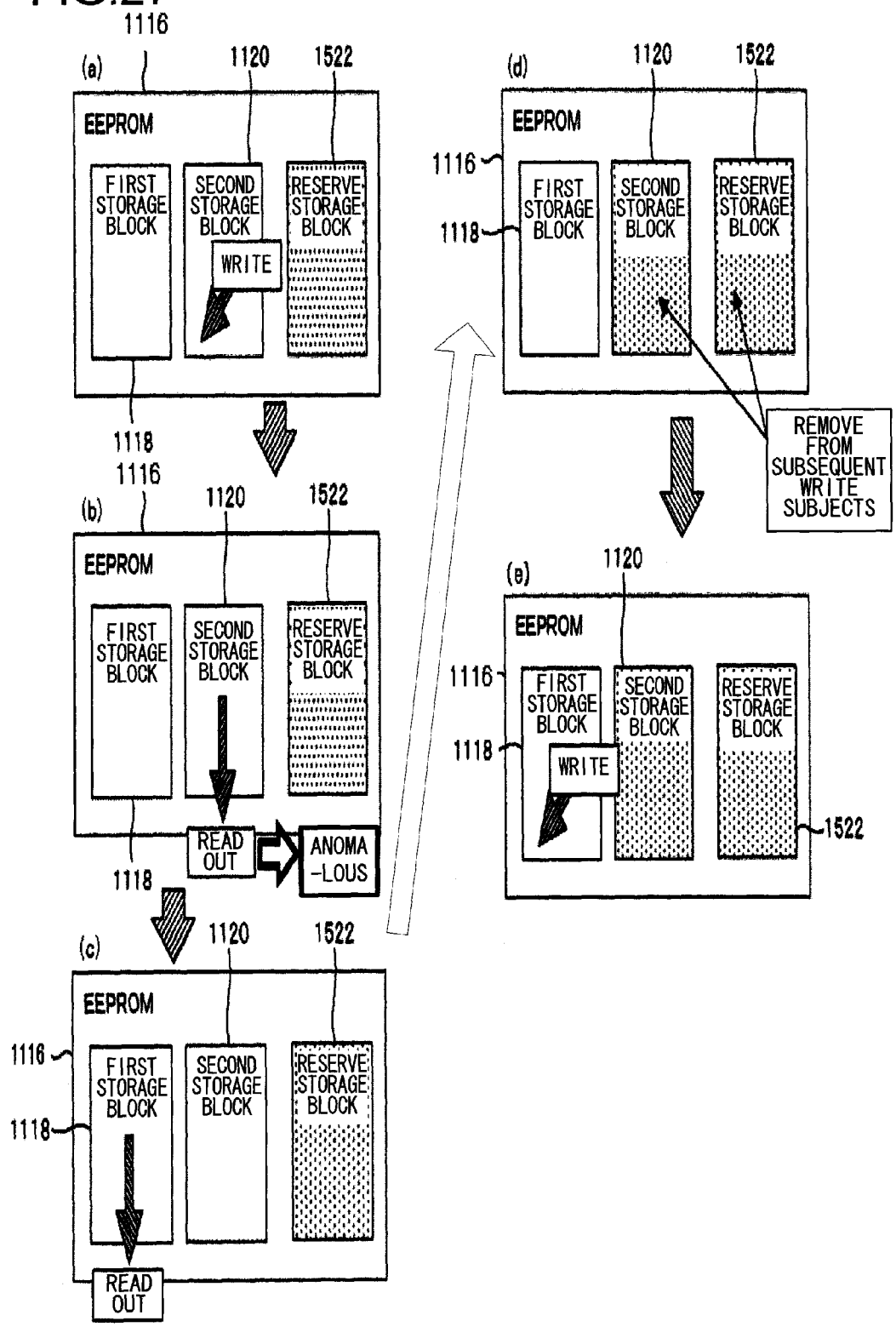
FIG. 27 is a state transition diagram for the non-volatile memory, for explanation of the operation shown in FIG. 19.

In FIG. 27, an explanatory diagram of the operation shown in FIG. 19 is shown. In FIG. 27(b), the presence or absence of anomaly in the data read out by the step 1404 of FIG. 19 is diagnosed. Along with these results of diagnosis, the number of times that anomaly diagnosis is performed is measured in the step 1814, and, if the number of times of detection of an anomaly exceeds a predetermined value, in a step 1816, as shown in FIG. 27(d), then the two anomalous storage blocks are removed from the subjects of use. In FIG. 27, the two anomalous storage blocks are supposed to be the second storage block and the reserve storage block, while the first storage block is supposed to be the storage block that is normal. In this state, the first storage block continues to be used as the storage block for storing data.

—Variant Example #3 of Example #1 of Writing Data into and Reading Data Out from the Non-volatile Memory in the Second Embodiment—

Figure 20:
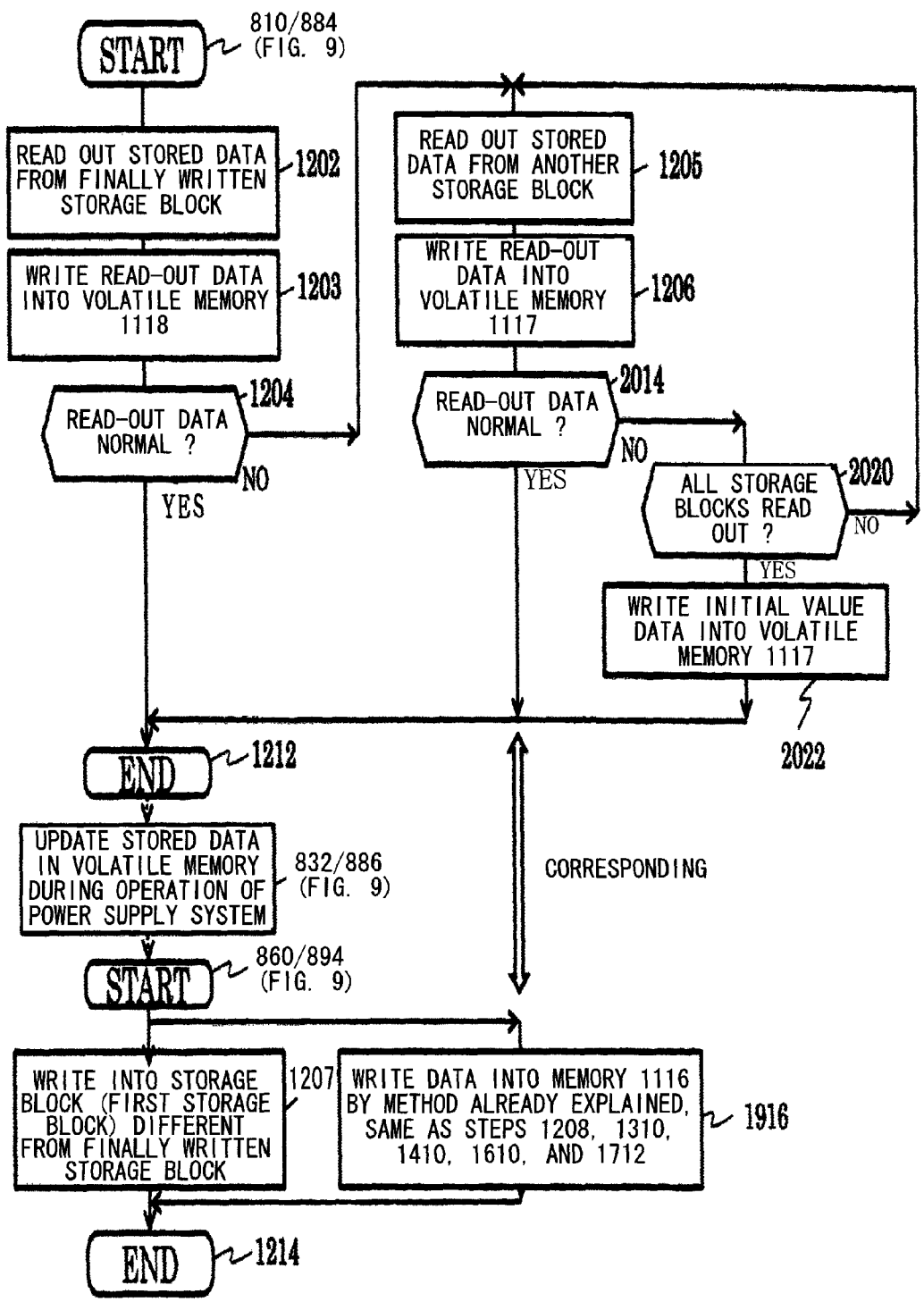
FIG. 20 is a flow chart for explanation for a case in which initial value data is used.

FIG. 20 is a flow diagram showing one variant example, and can be applied to a case in which the number of storage blocks used for data storage is two or more. Steps with the same numbers as in FIGS. 17 through 19 have the same functions and perform the same operations. In the step 1202 the stored data is read out from a predetermined block of the rewritable non-volatile memory 1116, and is written into the volatile memory 1118. And in the step 1204 diagnosis is made as to whether or not the above described data that has been read out is normal. If it is decided that the data is normal, then as described above, when writing the updated data the next time, in the step 1207, as already explained, it is written into a storage block that is different from the storage block from which it was read out in the step 1202. The steps 1202, 1203, 832, 886, and 1207 are thus the same as in the explanation above.

On the other hand, if in the diagnosis of the data that has been read out in the step 1204 it has been decided that the stored data is anomalous, then the flow of control proceeds to a step 1205. In this step 1205, the storage block is interchanged with a next different storage block according to an order that is determined in advance, and the stored data that is stored therein is read out and is stored in the volatile memory 1118. And, in a step 2014, diagnosis is performed as to whether this data that has been read out is normal or not. If it is normal, then the data that is stored in the volatile memory 1118 is updated in the steps 832 and 886. And in a step 1916, the data is stored in the writable non-volatile memory 1117 by a method already explained, in other words by a method as explained in the steps 1208, 1310, 1410, 1610, and 1710.

But if it is decided for a second time in the step 2014 of FIG. 20 that an error is present in the data that has been read out, then the flow of control proceeds to a step 2020 and a setting is established for reading out the data from another storage block according to a predetermined sequence, and then the stored data in the newly set storage block is read out in the step 1205 and is stored in the volatile memory 1117 in the step 1206.

If it is still diagnosed that the data that has been read out is not normal data even though the loop of the step 1205, the step 1206, the step 2014, and the step 2020 is repeated, so that there is no further storage block available to be newly read out from, then the flow of control proceeds from the step 2020 to a step 2022, in which initial data is read out from a non-volatile memory that cannot be written, i.e. from a memory generally termed ROM in which this initial data has been stored before delivery of the system, and this initial data is used. It should be understood that the data described above may, for example, be stored in the memory in which the processing program of the battery controller 20 is stored. After the initial data has been written into the volatile memory 1117 in the step 2022, this data is updated on the basis of the steps 832 and 886 as explained for the normal control mode referring to FIG. 9. And writing of the updated data is performed into the rewritable non-volatile memory 1106 on the basis of the step 1916. Even if it is seen that not all of the data that is read out by the step 2020 is normal, still the possibility that this anomaly originates in the circuitry of the rewritable non-volatile memory itself is low, and the possibility is extremely high that operation will proceed normally during the next write operation. Accordingly, when the data has been written into the rewritable non-volatile memory in the step 1916, the possibility is high that normal operation will be performed from the next cycle onwards.

In the embodiments that have been explained using FIGS. 1 through 20, FIGS. 12 through 20 are related to the use of the rewritable non-volatile memory 1106. While a great beneficial effect is obtained when this method is employed when using a lithium battery system, it can also be applied to control of a general type. The special characteristics when the method of using the rewritable non-volatile memory 1106 explained in FIGS. 12 through 20 is employed for general control will now be described in the following.

The electronic control device described in FIGS. 12 through 20 corresponds to the battery controller 20 or to the integrated circuits 3A through 3N, and this electronic control device includes a rewritable non-volatile memory and a volatile memory that, during the operation of the electronic control device, along with being used for temporary storage of the read-out stored data that is stored in the rewritable non-volatile memory, is also used for updating of that stored data. Moreover, in order to store the stored data, a plurality of storage blocks are established in the rewritable non-volatile memory, in order for the stored data to be recorded within these storage regions of the rewritable non-volatile memory. The electronic control device is distinguished by including a diagnosis means that performs diagnosis as to whether the stored data that has been read out from those storage blocks is normal or is in an anomalous condition, having a writing mode during normal conditions in which, if a decision of normal has been reached by this diagnosis means, then the writing of the updated data is performed into a storage block that is different from the storage block into which it was written the previous time, and a writing mode during an anomaly in which, if an anomaly has been diagnosed by the diagnosis means, then the writing of the updated data is performed into the same storage block as the storage block into which it was written the previous time.

Furthermore, an electronic control device that includes a rewritable non-volatile memory and a plurality of storage blocks within the rewritable non-volatile memory in which data is recorded, and that performs writing of stored data that has been updated to those storage blocks after operation has been stopped until the power supply is cut off, is characterized by including a diagnosis means that performs diagnosis as to whether the stored data that has been read out from those storage blocks is normal or is in an anomalous condition, having a writing mode during normal conditions in which, if a decision of normal has been reached by this diagnosis means, then the writing of the updated data is performed into a storage block that is different from the storage block into which it was written the previous time, and a writing mode during an anomaly in which, if an anomaly has been diagnosed by the diagnosis means, then the writing of the stored data is performed into at least two or more storage blocks.

Furthermore, this electronic control device may be characterized in that, if the writing of the stored data the previous time has been performed to two or more storage blocks as described above, then, in the writing mode during normal conditions, the writing of the stored data that has been updated is performed to one predetermined storage block.

Furthermore, the writing mode to two or more storage blocks may be characterized in that the writing of the data that was updated first this time is performed to the storage block in which the data for which the anomaly has been diagnosed is present.

Furthermore, with an electronic control device that includes a rewritable non-volatile memory, a plurality of storage blocks within this non-volatile memory in which data is recorded, and a reserve storage block in which during normal conditions data is not recorded, this device is characterized by including a diagnosis means that performs diagnosis as to whether the data that has been read out from the storage blocks the previous time is normal or is in an anomalous condition, having a writing mode during normal conditions in which, if a diagnosis of normal has been reached by the diagnosis means, then the writing of stored data this time is performed to a storage block that is different from the storage block to which it was written the time before, and a backup writing mode in which, if a diagnosis of an anomaly has been reached by the diagnosis means, then the writing of data this time is performed to the reserve storage block.

Furthermore, this electronic control device may be characterized by including a storage block change means that, in the above backup writing mode, treats the storage block in which the data for which the anomaly has been diagnosed is present as the reserve storage block, and treats the reserve storage block as the storage block.

Furthermore, this electronic control device may be characterized by including a storage block exclusion means that, if the block change means has been implemented a predetermined number of times or more, excludes the storage block that has become the subject of the block change means and that has been changed from the subsequent subjects of writing, and takes a storage block that has not been a subject of writing as a storage block of a subject of writing.

Furthermore, it may be characterized in that, if an anomaly has been determined by the diagnosis means, then data that has been read out from another storage block is used instead of the data that has been read out. Moreover, it may be characterized in that, if all of the data that has been read out from the plurality of storage blocks has been diagnosed as anomalous by the diagnosis means, then initial value data is used that has been stored in advance in a non-volatile memory that cannot be rewritten.

The above reading out of the data is characterized by being performed during the start processing of the electronic control device, and in which the data that has been read out is updated during operation. And the above writing of the data is characterized by being performed during the stopping processing by the electronic control device.

Even further, such an electronic control device that employs a rewritable non-volatile memory may have the following particular characteristics.

—An Electronic Control Device having First Characteristics—

This electronic control device is characterized by including a rewritable non-volatile memory and a plurality of storage blocks within this non-volatile memory in which data is recorded, and by having a diagnosis means that performs diagnosis as to whether the stored data that has been read out from the storage blocks the previous time is normal or is in an anomalous condition, having a writing mode during normal conditions in which, if a decision of normal has been reached by this diagnosis means, then the writing of the data this time is performed into a storage block that is different from the storage block into which it was written the previous time, and a writing mode during an anomaly in which, if an anomaly has been diagnosed by the diagnosis means, then the writing of the data this time is performed into the same storage block as the storage block into which it was written the previous time.

—An Electronic Control Device having Second Characteristics—

This electronic control device is characterized by including a rewritable non-volatile memory and a plurality of storage blocks within this non-volatile memory in which data is recorded, and by having a diagnosis means that performs diagnosis as to whether the stored data that has been read out from the storage blocks the previous time is normal or is in an anomalous condition, having a writing mode during normal conditions in which, if a decision of normal has been reached by this diagnosis means, then the writing of the data this time is performed into a storage block that is different from the storage block into which it was written the previous time, and a duplicate writing mode in which, if an anomaly has been diagnosed by the diagnosis means, then the writing of the data this time is performed into at least two or more storage blocks.

—An Electronic Control Device having Third Characteristics—

The electronic control device having the first or the second characteristics described above may be characterized in that, if the writing of data the previous time was in the duplicate writing mode, then, during the writing next time in the writing mode during normal conditions, the writing of the data is performed into one predetermined storage block.

—An Electronic Control Device having Fourth Characteristics—

The electronic control device having the first through the third characteristics described above may be characterized in that, in the duplicate writing mode, the writing of the data that has been updated is first performed into the storage block in which the data that has been determined to be anomalous is present.

—An Electronic Control Device having Fifth Characteristics—

This electronic control device is characterized by including a rewritable non-volatile memory, a plurality of storage blocks within this non-volatile memory in which data is recorded, and a reserve storage block into which during normal times the recording of data is not performed, and by having a diagnosis means that performs diagnosis as to whether the stored data that has been read out from the storage blocks the previous time is normal or is in an anomalous condition, having a writing mode during normal conditions in which, if a decision of normal has been reached by this diagnosis means, then the writing of the data this time is performed into a storage block that is different from the storage block into which it was written the previous time, and a backup writing mode in which, if an anomaly has been determined by the diagnosis means, then the writing of the data this time is performed into the reserve storage block.

—An Electronic Control Device having Sixth Characteristics—

The electronic control device having the fifth characteristics described above may be characterized by having a storage block change means that, in the backup writing mode, subsequently treats the storage block in which the data is present that has been diagnosed as being anomalous as the reserve storage block, and treats the reserve storage block as a storage block.

—An Electronic Control Device having Seventh Characteristics—

The electronic control device having the sixth characteristics described above may be characterized by including a faulty storage block exclusion means that, if changing of the storage blocks described above has been implemented a predetermined number of times or more, excludes the storage block that has been the subject of this changing from the storage blocks that are to be the subjects of subsequent writing, and takes a storage block that has not been such a subject as a subject for being written into.

—An Electronic Control Device having Eighth Characteristics—

The electronic control device having the first through the seventh characteristics described above may be characterized by, if an anomaly has been determined by the diagnosis means, reading out data from another one of the storage blocks instead of the one from which the data was read out.

—An Electronic Control Device having Ninth Characteristics—

The electronic control device having the first through the seventh characteristics described above may be characterized by initial value data being used, if all of the data read out from the plurality of storage blocks is diagnosed by the diagnosis means as being anomalous.

—An Electronic Control Device having Tenth Characteristics—

The electronic control device having the first through the ninth characteristics described above may be characterized by the reading out of the data being performed during the starting processing by the electronic control device.

—An Electronic Control Device having Eleventh Characteristics—

The electronic control device having the first through the eleventh characteristics described above may be characterized by the writing of the data being performed during the ending processing by the electronic control device.

While the embodiments described above and illustrated in FIGS. 1 through 20 are effective when applied to a general control device, they are very effective when applied to a battery system, and in particular an even greater beneficial effect is obtained when they are used for a lithium battery system, for which the usage environment exerts a great influence upon the reliability.

—The History Data—

Next, the history data in the stored data that is stored in the rewritable non-volatile memory 1106 shown in FIG. 6A or in the rewritable non-volatile memory 1116 shown in FIG. 7 will be explained.

An example of this history data is shown in FIG. 8. As described above, correction values for correcting the offset voltage of the analog to digital converter 122A and so on and correction values for various other measurement meters are stored in the file KD1. These values are information that is stored upon shipment after production. Moreover, history data as explained below is stored in the file KD2. There is also a file KD3, in which information specifying the usage environment of the power supply system 1 and of the battery system is stored. The data in the files KD2 and KD3 is updated along with usage of the power supply system 1 and of the battery system.

The history data in the file KD2 described above will now be explained with reference to the power supply system shown in FIG. 1, or with reference to the power supply system of FIG. 28 that has a more complicated structure than that of FIG. 1. The power supply system of FIG. 28 incorporates two of the previously explained battery modules 10 of FIG. 1, a battery module 11 and a battery module 12, each of which has the same structure as the battery module 10 of FIG. 1 and operates in a similar manner. Furthermore, integrated circuits 31A through 31N are provided to the battery module 11 and have the same structure and operate in a similar manner to the integrated circuits 3A through 3N for performing monitoring and control of the battery module 10 of FIG. 1 as already explained; and, in the same manner, integrated circuits 32A through 32N are provided to the battery module 12. The integrated circuits 31A through 31N and the integrated circuits 32A through 32N operate in a similar manner to the above described integrated circuits 3A through 3N as already explained, and are each linked to the battery controller 20 via transmission paths 52 and 54.

Figure 28:
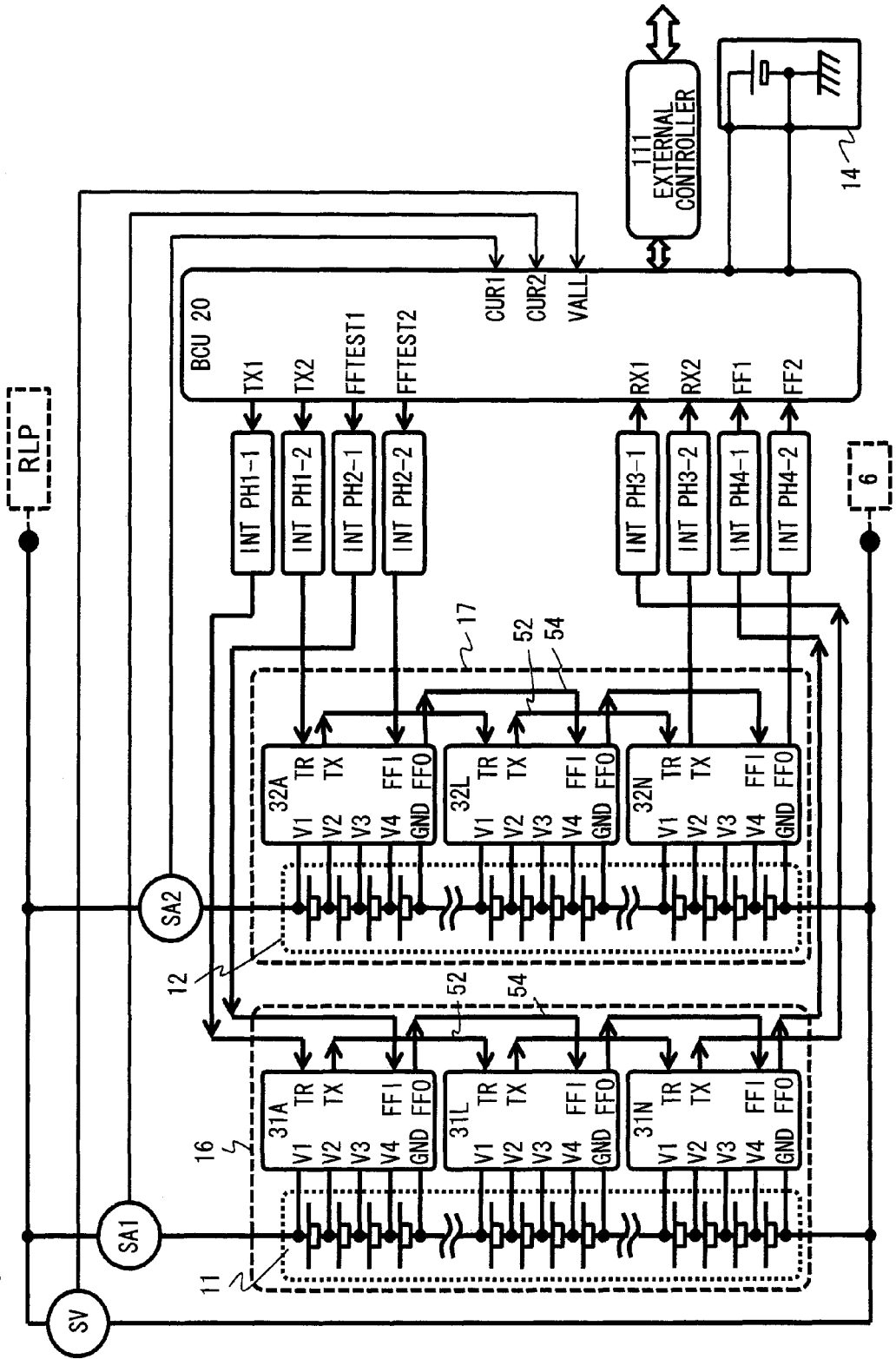
FIG. 28 is a block diagram showing the structure of a battery system in which two battery modules are provided.

Since the way in which data of any type in these two battery systems of FIGS. 1 and 28 is stored as history data is the same in both systems, accordingly the battery system of FIG. 28 will be explained as a representative. It should be understood that one battery assembly 16 consists of the battery module 11 and integrated circuits 31A through 31N for performing measurement and diagnosis of the terminal voltages of the lithium cells that make up the battery module 11 and for making the SOCs of its lithium cells uniform. Moreover, another battery assembly 17 consists of the battery module 12 and integrated circuits 32A through 32N for performing measurement and diagnosis of the terminal voltages of the lithium cells that make up the battery module 12 and for making the SOCs of its lithium cells uniform. A current meter SA1 and a current meter SA2 measure the output currents or the charging currents of the battery module 11 and of the battery module 12 respectively, and output these to the battery controller 20. Moreover, the terminal voltage of the entire battery module consisting of the battery module 11 and the battery module 12 is measured by a voltage meter SV, and is outputted to the battery controller 20.

Figure 29:
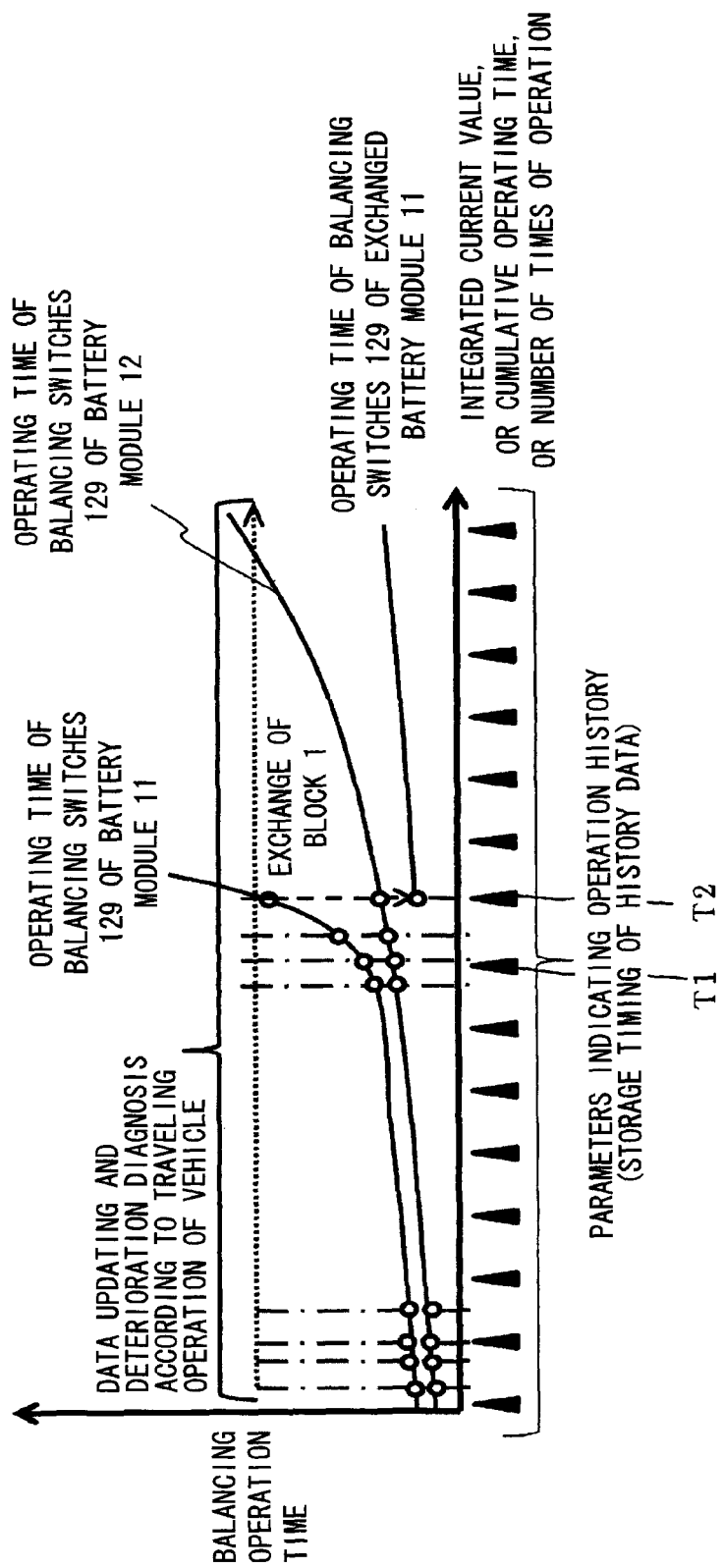
FIG. 29 shows change of an operating time interval for making the SOCs of the cells uniform due to past usage of the battery module, if an anomalous cell is present in the battery module.

FIG. 29 is a graph showing how the operating time intervals for making the SOCs of the lithium cells uniform change according to the operation history of the battery modules, in other words according to the operation history of the battery system. As previously explained with reference to FIG. 2, if for example variation is present in the SOCs of the lithium cells BC1 through BC4, then it becomes impossible to perform charging up of the lithium cells to a sufficient level, as particularly explained in detail in the above section relating to the operation to make the SOCs uniform. For this, the balancing switches 129 shown in FIG. 2 (129A through D in FIG. 2) are operated and some amounts of the electricity accumulated in the lithium cells whose SOCs are large are discharged, so that the SOCs of those lithium cells are brought to be close to the SOCs of the lithium cells whose SOCs are small. If an anomaly occurs with some of the lithium cells along with the deterioration of the battery module or minute leakage or the like, then the variations of the SOCs within the battery module become great, and the operating time intervals of the balancing switches 129 become long.

The horizontal axis in FIG. 29 shows the integrated value of some parameter representing the operation history of the battery module, for example an integrated value of the current of the battery module such as the integrated value of the output current, the integrated value of the charging current, the sum of the integrated values of the charging current and the output current, or the like. Each time the above described integrated value reaches some predetermined value, the operating times of the balancing switches 129 described above are stored as the stored data of FIG. 8 specifying the history. The triangular marks along the horizontal axis in FIG. 29 and below it indicate the timings of storage in the state in which the integrated value of the current has reached the predetermined value, and indicate the timings for storage of the stored data D16 in FIG. 8. The above described operating times of the balancing switches 129 are updated as the stored data D15 of FIG. 8, and the values of D15 are additionally stored as the stored data D16 at the timings shown by the triangles described above. Moreover, at the time that the operation of the power supply system is stopped, all of the data illustrated in FIG. 8 is stored in the rewritable non-volatile memory 1116.

Furthermore, the curves described by the graphs in FIG. 29 show the values of the updated state of D15 in FIG. 8. Moreover, the circular marks shown along these graphs are the timings of storage in the rewritable non-volatile memory 1116 due to stoppage of the operation of the vehicle, and indicate the timings of execution of the steps 860 and 894 of FIG. 9. It should be understood that the actual timings of execution of the steps 860 and 894 occur very frequently, but only some thereof are shown in FIG. 29, since to illustrate them with perfect fidelity would become extremely complicated.

Here, the vertical axis is the total operating time that the balancing switches 129 of the lithium cells of the battery module unit is in continuity. In this example, after the time T1 of operation history, the continuity time of the balancing switches 129 of the battery module 11 increases abruptly. This situation indicates that the deterioration of the battery module 11 has abruptly advanced or that some anomaly has occurred, such as minute current leakage of one or more of the lithium cells or the like. Due to this, the battery assembly 16 that includes the battery module 11 is changed at the state T2 of operation history, so that the state in which it has been newly exchanged is shown at the time point T2 of operation history in FIG. 29. While this graph shows the total operating time of the balancing switches 129 in the battery module unit, instead of this total, it would also be acceptable to use the longest value of the continuity time of the battery switches 129 within the battery modules, or the continuity time of the balancing switches that have comparatively long values. It is possible to decide that those lithium cells for which the continuity time of the balancing switches that constitute the balancing circuits are longest, or for which the continuity time are comparatively long, are lithium cells that are normal. However, the fact that the discharge time for these normal cells become long, and conversely some leakage currents have become large, means that some anomalous lithium cells are present within the battery module.

When only a changing state of the terminal voltages of the lithium cells BC1 through BC4 making up the battery modules 11 and 12 is diagnosed, it is not possible to detect that an anomalous lithium battery cell is existing, until the problem becomes significant due to progress of the anomalous state such as a large leak current. However, as illustrated in FIG. 29, it is possible to detect the presence of some lithium cell in an anomalous condition at an early stage of the occurrence of a minute leakage of current by investigating the rate of change of the operating time of the balancing switches 129 of the normal lithium cells, or by investigating the rate of change of time intervals of an operating time change thereof. While the method of FIG. 29 cannot itself identify the anomalous lithium cell or cells, by being able to detect the presence of some lithium cell or cells that are in an anomalous condition, it becomes possible to institute various types of countermeasure, and it is possible to enhance the security and the reliability.

As the parameter representing operation history, instead of the above described integrated value of current, it would also be possible to employ the operating time, in other words the integrated value of the operating time of the battery module, or the number of times it has been operated. However, deterioration of the lithium cells has a strong relationship with the integrated value of the current, and in particular the integrated value of the current is a desirable parameter representing operation history. However since, during use in an automobile or the like, the same types of operation (starting, operation, stopping and so on) are repeated, it is often the case that the integrated value of the operating time or the number of times of use, and the integrated value of the current, exhibit a tendency to resemble one another, so that it is possible to obtain the beneficial effects described above even if the integrated value of the operating time or the number of times of operation is used.

Figure 30:
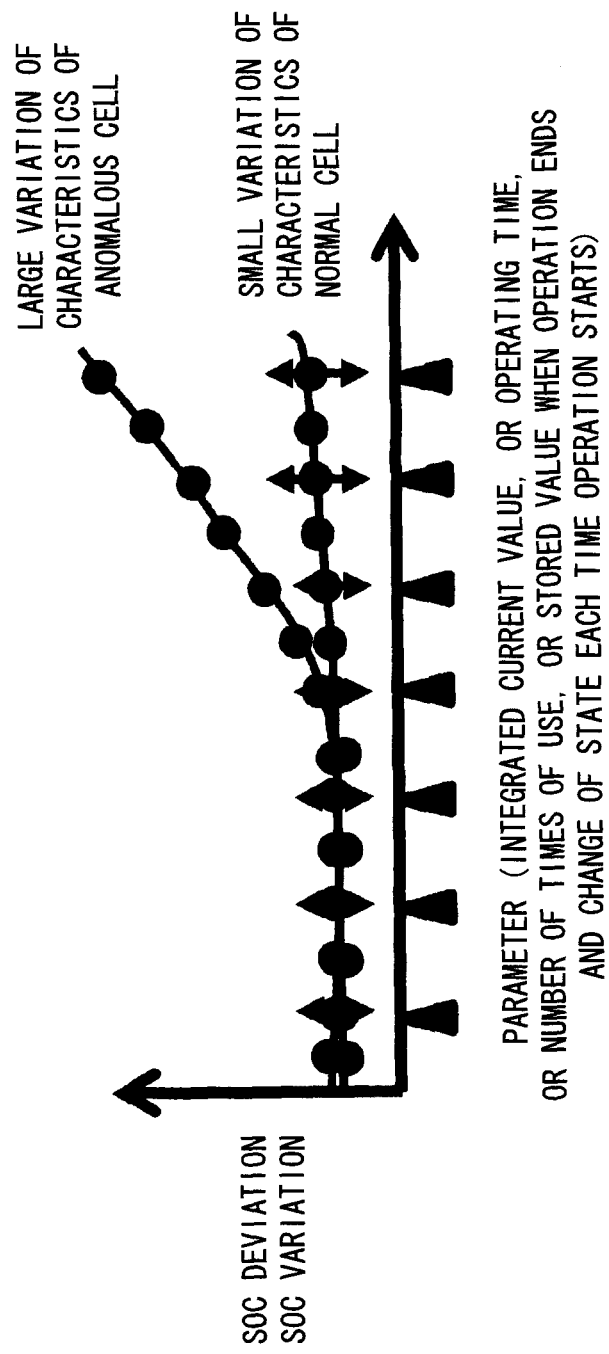
FIG. 30 shows change of the variation of the characteristics of the SOCs of the cells due to operation history of the battery module, when an anomalous cell is present in the battery module.

The graph shown in FIG. 30 is a graph for explanation of an alternative to the method explained in FIG. 29. The terminal voltages of the lithium cells in the no load state that were read in the step 884 of FIG. 9 are stored in the register 275 of FIG. 6B. In other words, when each of the integrated circuits 3A through 3N wakes from its sleep state in the step 882 of FIG. 9, then the stage signals shown in FIGS. 4 and 5 are outputted from the stage counters 256 and 258 via the decoders 257 and 259, and, along with the progression of the stages shown in FIG. 4, in order from the lithium cell BC1, the terminal voltages of the lithium cell BC2, of the lithium cell BC3, and the lithium cell BC4 are inputted to the analog to digital converter 122A of FIG. 6B, so that the terminal voltage of each of the lithium cells BC1 through BC4 is measured in order. The results of measurement of the terminal voltages of the lithium cells in their no load states are specially stored in BBC1 through BBC6 of the register 275, and these values are stored until the operation of the power supply system 1 is stopped. BBC1 through BBC6 of the register 275 are provided so as to be able to handle six cells, and in this example only BBC1 through BBC4 are used, corresponding to the lithium cells BC1 through BC4. It should be understood that, subsequently, the results of measurement of the terminal voltages of the lithium cells BC1 through BC4 are stored in the register 274.

Since the operation of each of the stages of FIG. 4 is executed repeatedly by the stage counters 256 and 258, accordingly the terminal voltages of the lithium cells BC1 through BC4 are repeatedly measured according to the stages of FIG. 4, and the stored values in the register 274 are repeatedly updated. As described above, the data stored in the registers 275 and 274 is compared with the values stored in the reference value storage circuit 278 by the diagnosis circuit 270, and diagnosis is performed for the presence or absence of occurrence of overcharge, over-discharge, or some other anomaly. If an anomaly is detected, then the occurrence of this anomaly is stored in the flag storage circuit 284. And a flag indicating the anomaly is transmitted as an anomaly signal from the OR logic circuit 288 to the battery controller 20, via the output terminal FFO.

FIG. 30 shows the change of the state of variation of a SOC with respect to the parameter representing operation history, or the change of the deviation of a SOC with respect to the parameter representing operation history. It is difficult to detect with high accuracy a lithium cell in which the phenomenon of minute leakage has appeared by only simply inspecting the SOC of a single lithium cell by itself, since it is not clear whether the change of SOC originates in minute leakage or whether it originates in the environment in which the lithium cells are placed. On the other hand, it is possible to eliminate the influence upon the SOCs originating in the environment in which the lithium cells are placed by testing whether the SOC of some specified lithium cell exhibits any idiosyncratic change with respect to change of the SOCs of the large number of other lithium cells. In other words, since it is clear from the research of the present inventors that the proportion of the lithium cells in the battery module in which an anomaly occurs is extremely small, almost all of the lithium cells in the battery module are normal. Due to this the SOCs of almost all the lithium cells exhibit the same type of change, since all of the lithium cells are placed in approximately the same environment. Accordingly, it may be concluded that a lithium cell that exhibits an augmented change of SOC has altered due to some cause other than the environment in which it is placed. The probability that the cause of this is a minute leakage is extremely high. Due to this fact, it is possible to detect an anomalous lithium cell at high accuracy by testing for relative changes of SOC.

The operation of the battery controller 20 will now be explained using FIGS. 29 and 30 that are graphs for explaining anomaly detection, and using the operational flow of FIG. 31 that shows the anomaly detection method illustrated in FIGS. 29 and 30. In the step 884 of FIG. 9, the integrated circuits 3A through 3N measure the terminal voltages of the lithium cells BC1 through BC4 in their no load states, and store the terminal voltages that have been measured in the registers 275 of the integrated circuits 3A through 3N (FIG. 6B). While the battery controller 20 repeatedly executes the step 832 of FIG. 9, the first time that this step 832 is executed, the SOCs of the lithium cells BC1 through BC4 are calculated from the values of the terminal voltages of the lithium cells BC1 through BC4 in their no load states, and the time of continuity of the balancing switches 129 that constitute the discharge circuits for the lithium cells BC1 through BC4 are calculated. The processing based in this manner upon these measured values of the terminal voltages of the lithium cells BC1 through BC4 in their no load states will now be explained with reference to FIG. 31.

Figure 31:
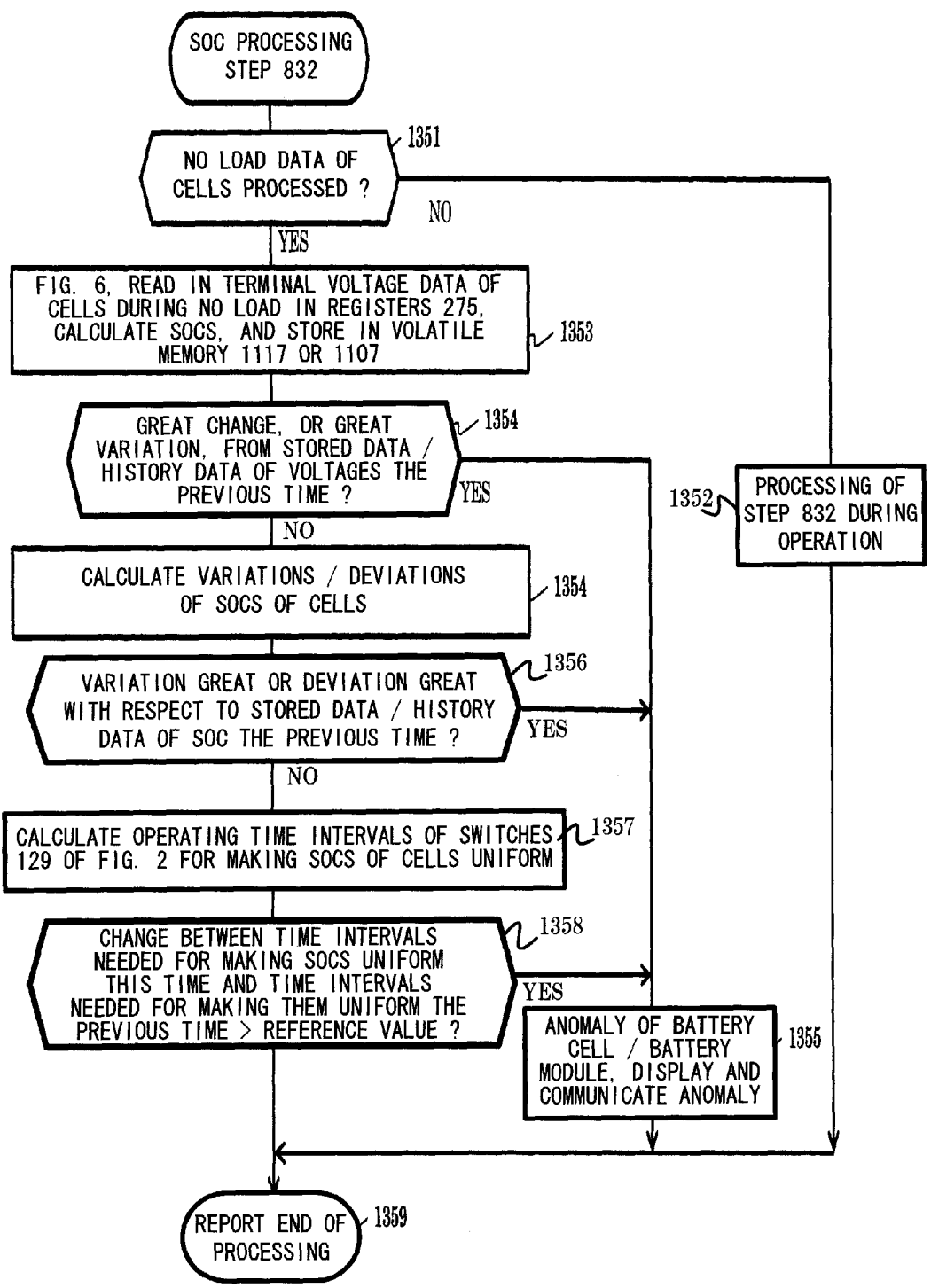
FIG. 31 shows the operational flow in the anomaly detection method shown in FIGS. 29 and 30.

In FIG. 31, processing is performed on the basis of the measured values of the terminal voltages of the lithium cells BC1 through BC4 in their no load states, and in the first step 832 (FIG. 9) the operation of the battery controller 20 shifts to the steps 1351 through 1353. After the processing in the no load state, during the execution of the step 832 (FIG. 9), the operation of the battery controller 20 shifts from the step 1351 to the step 1352. Explanation of the operation in the step 1352 will herein be omitted.

The terminal voltages of the lithium cells BC1 through BC4 of the entire power supply system in their no load states as now measured by the integrated circuits 3A through 3N are read in by the battery controller 20 in the step 1353 from the registers 275 of the integrated circuits 3A through 3N, and are stored in D13 of the file KD2 of FIG. 8. In concrete terms, this data item D13 contains the terminal voltages of all of the lithium cells. In this step 1353, the SOC of each of the lithium cells is calculated from the terminal voltages of the lithium cells in their no load states, and these are written as the data item D15 shown in FIG. 8 into the volatile memory 1117 of the battery controller 20, and are stored therein.

Next in a step 1354 these terminal voltages are compared with the terminal voltages of the lithium cells BC1 through BC4 in the past that have already been stored, and diagnosis is made as to whether the terminal voltages themselves have undergone any great change.

If for example the vehicle has been left for several days in the parked state, then the terminal voltage of any anomalous cell in which a minute leakage is occurring will have greatly decreased as compared to the voltage of the other normal lithium cells. Thus, in the step 1354, the changes are calculated with respect to the terminal voltages of the lithium cells that were stored when the operation the previous time ended, and those cells for which the reduction of the terminal voltage is large are examined first. If there is some cell for which the reduction of the terminal voltage is large (a step 1356), it is decided that an anomaly has occurred.

Moreover, the variations of the terminal voltages of the cells are compared with the previous values that are stored. Since the terminal voltages of the cells decrease in a mutually similar manner if the cells are normal, accordingly the increase in the variation will be small. By variation here is meant variation of the terminal voltages of the plurality of lithium cells that are included in the battery modules. The fact of this variation having become greater means that the possibility is high that some anomalous cell is present in which minute leakage is occurring. If this type of increase of variation is greater than or equal to some reference value, then the flow of control is transferred to a step 1355, and it is determined that an anomaly is present. Moreover, along with providing a warning display for informing the driver of this fact, it is also communicated to any relevant control devices.

Instead of variation as described above, it would also be acceptable to test for increase of deviation. Here, what is meant by deviation is the difference of the measured value for each cell with respect to the average value. Since, during parking, each of the cells is left under approximately the same conditions for the same interval of time, accordingly all of the normal cells should change in the same manner. Thus it is possible to determine that any cell for which the deviation is increased is an anomalous one.

Next in the step 1354 the SOC of each of the cells is calculated from its terminal voltage in the no load state. As for the variation or deviation of the SOC, as shown in FIG. 30, the change for a normal cell is small. A cell or a battery module for which this change is large is considered to be one in which an anomalous cell is present. If in the step 1356 a battery module is detected whose variation is large, then the flow of control is transferred to the step 1355, and the presence of an anomaly is determined. Furthermore, along with providing a warning display for informing the driver of this fact, it is also communicated to any relevant control devices. Here, the variation means the difference between a large value of SOC and the small values of SOC. Moreover, the deviation of a SOC means its difference from the average SOC of the lithium cells of the battery module. As shown in FIG. 30, the variation and the deviation of the SOC of an anomalous cell become increased. By investigating increase of the variation of the SOCs or the deviation of the SOCs, it is possible to perform diagnosis of anomaly of a battery module unit with high accuracy, and it is possible to detect a lithium cell in which an anomaly has occurred at an early stage. After having tested in the step 1356 for increase of the variations of the SOCs or for increase of the deviations of the SOCs, a step 1357 is executed if all is normal, .

Next, time intervals are calculated for continuity of the switches 129 of FIG. 2 on the basis of the variations of SOC obtained from the values of the terminal voltages of the lithium cells BC1 through BC4 in their no load states, in order to make the switches continuous and to form discharge circuits for those cells whose SOCs are large. These continuity times for the switches 129 are integrated, and in a step 1358 a test is made as to whether or not there is any increase with respect to their previous values. If there is some increase, then the step 1355 is executed. Deterioration of a cell linked to an anomaly or an abnormality is detected in this manner.

When operation starts, the data in the rewritable non-volatile memory illustrated in FIG. 8 is written into the volatile memory in the steps 884 and 810 of FIG. 9. Since when operation starts and when operation has ended it is possible to detect the SOCs accurately from the terminal voltages of the lithium cells in their no load states, accordingly values for each of these in the no load state at the start and the end of operation are stored in the volatile memory as the data in the data fields D13, D15, and D17 of 8A. The circular marks shown in FIGS. 29 and 30 indicate the timings of writing from the volatile memory into the rewritable non-volatile memory when operation ends and the values of data written, and data that is shifted from the rewritable non-volatile memory to the volatile memory. Since actually the lithium cells are discharged while the vehicle is parked, accordingly the measured values before operation starts are changed somewhat with respect to the stored values when operation was ended, but this feature is omitted in the graph since it would be troublesome to illustrate it.

Moreover, the triangular marks in FIGS. 29 and 30 indicate the storage timings of history data stored in the fields B of FIG. 8. The timings of these triangular marks are generated each time the parameter representing operation history reaches some predetermined value, and data is repeatedly additionally stored at the timings given by these triangular marks, so that the history data described above is progressively accumulated. The operation of storage of history data of the parameter representing operation history that is performed at the timings shown by the triangular marks described above will now be explained with reference to the operation flow shown in FIG. 32.

Figure 32:
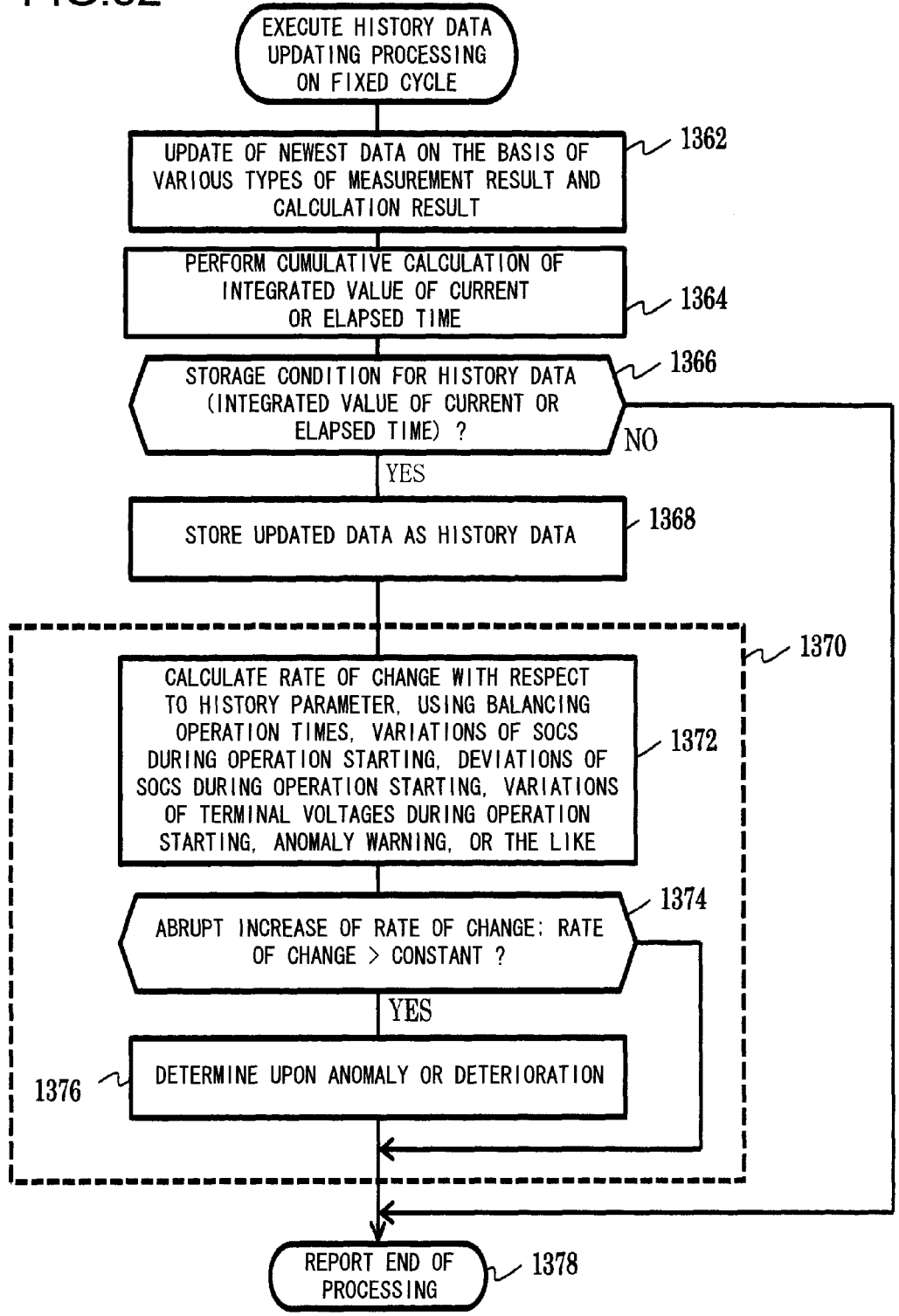
FIG. 32 shows the flow of a history data storage operation that is performed at a timing indicated by the triangle signs shown in FIGS. 29 and 30.

The operational flow shown in FIG. 32 is executed on a predetermined cycle, for example every several hundreds of milliseconds. In a step 1362, the data in the field A of FIG. 8 is updated to data specifying the present state on the basis of measured data and calculated data of various types. For example, the data items D11, D13, D15, D17, D19, D21, and D23 are updated. Next in a step 1364 a calculation is performed to integrate the parameter representing operation history. As this parameter, as described above, the current value of the lithium battery module, or the operating time of the battery system, or the number of times of operation of the battery system, or the like may be employed. Next in a step 1366 a decision is made as to whether or not the value of the parameter representing operation history is the timing of one of the triangular marks shown in FIGS. 29 and 30 that corresponds to the storage condition for the history data, and if it is the timing of one of the triangular marks shown in FIGS. 29 and 30 this being the storage condition for the history data, then the data items D11, D13, D15, D17, and D19 of the field A in FIG. 8 are taken as the data of D12, D14, D16, D18, and D20, and then in a step 1368 this data is additionally stored in the field B of FIG. 8, and is stored as the subsequently stored data. But if the timing of the step 1366 is not the timing of FIGS. 29 and 30, it proceeds to the step 1378, and then the operational flow of FIG. 32 terminates.

Next in a step 1370 a diagnosis is made for deterioration or the presence or absence of an anomaly. In concrete terms, on the basis of the past history data that has been additionally stored at the timings of the triangle marks, each rate of change is calculated between the above described new history data and the history data based upon the storage condition for the operation history parameter shown by the triangle mark one before. Furthermore, the rate of change from the timing of the triangle one before that one is calculated in order. Then in the next step 1374 the change at the new timing is compared with the past change and a decision is made as to whether or not it has abruptly increased, and if this rate of change of the change increases more than some constant that is a reference value, then in a step 1376 it is determined that deterioration or an anomaly is present. If in the step 1374 the rate of change is small, then it is determined that no anomalous lithium cell is present, and the flow of control proceeds to a step 1378, and then the operational flow of FIG. 32 terminates.

Figure 33:
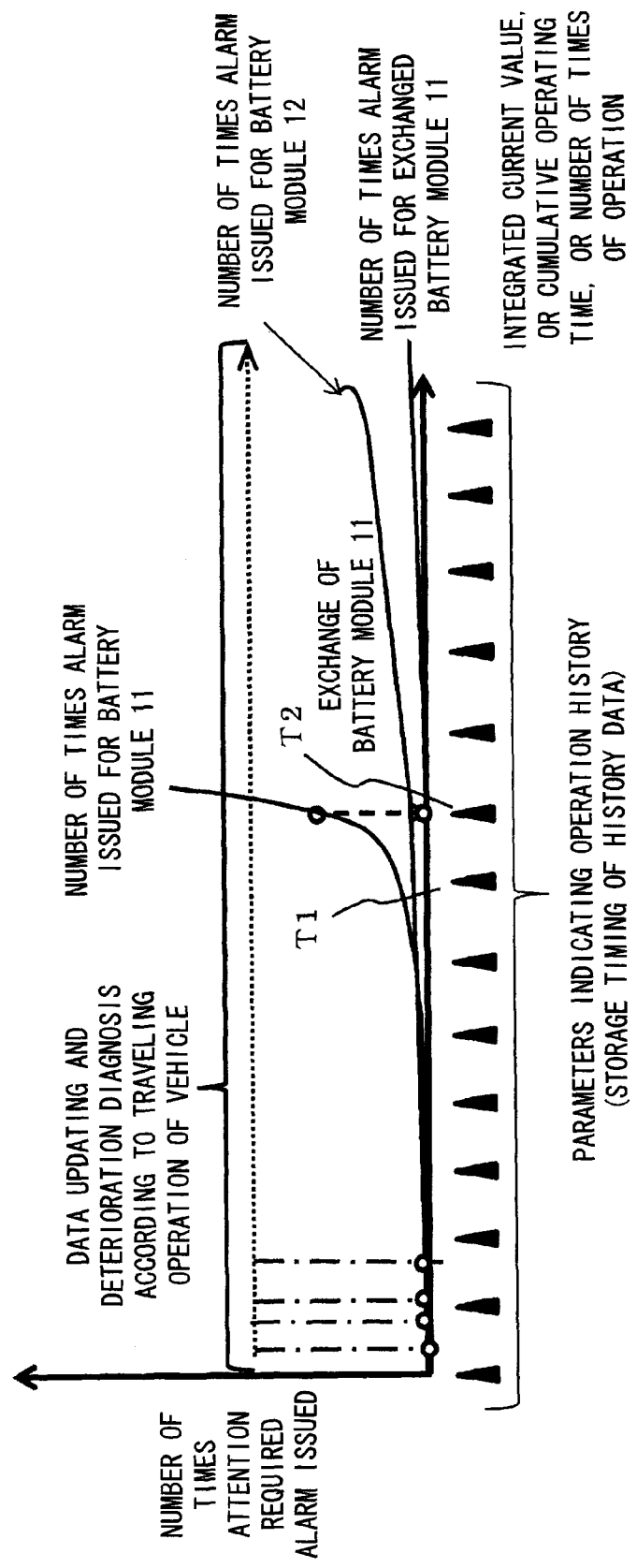
FIG. 33 shows change of the number of times an alarm is issued due to operation history of the battery module when a diagnosis program is implemented on a predetermined cycle, if an anomalous cell is present in the battery module.

FIG. 33 is a graph for explanation of an alternative plan for a method of detecting anomaly of the lithium cells described in FIGS. 29 and 30, and is a figure showing the number of times that an alarm has been issued, that is issued when a diagnosis program that is implemented on a predetermined cycle is executed.

The number of times of that an alarm has been issued that is issued by the diagnosis operation of the integrated circuits 3A through 3N that diagnose the battery module 10 of FIG. 1, or the diagnosis operation of the integrated circuits 31A through 31N that diagnose the battery module 11 of FIG. 28, or the diagnosis operation of the integrated circuits 32A through 32N that diagnose the battery module 12, is shown along with the parameter representing operation history. In the same way as in FIGS. 29 and 30, the horizontal axis is the operation history, while the vertical axis is the number of times that the alarm described above is issued; and the circular marks and the triangular marks in FIG. 33 have similar meanings to those in FIGS. 29 and 30.

In the example shown in FIG. 33, in the same way as in the case described in FIG. 29, after the operation history T1, the number of times that the alarm of the battery module 11 is issued increases abruptly. This state indicates that the deterioration of the battery module 11 has progressed abruptly, or that an anomaly such as a minute current leakage or the like has occurred in a portion of the lithium cells. Due to this, the situation is shown that, at the state of operation history T2, the battery assembly 16 included in the battery module 11 is exchanged for a new battery module.

Figure 34:
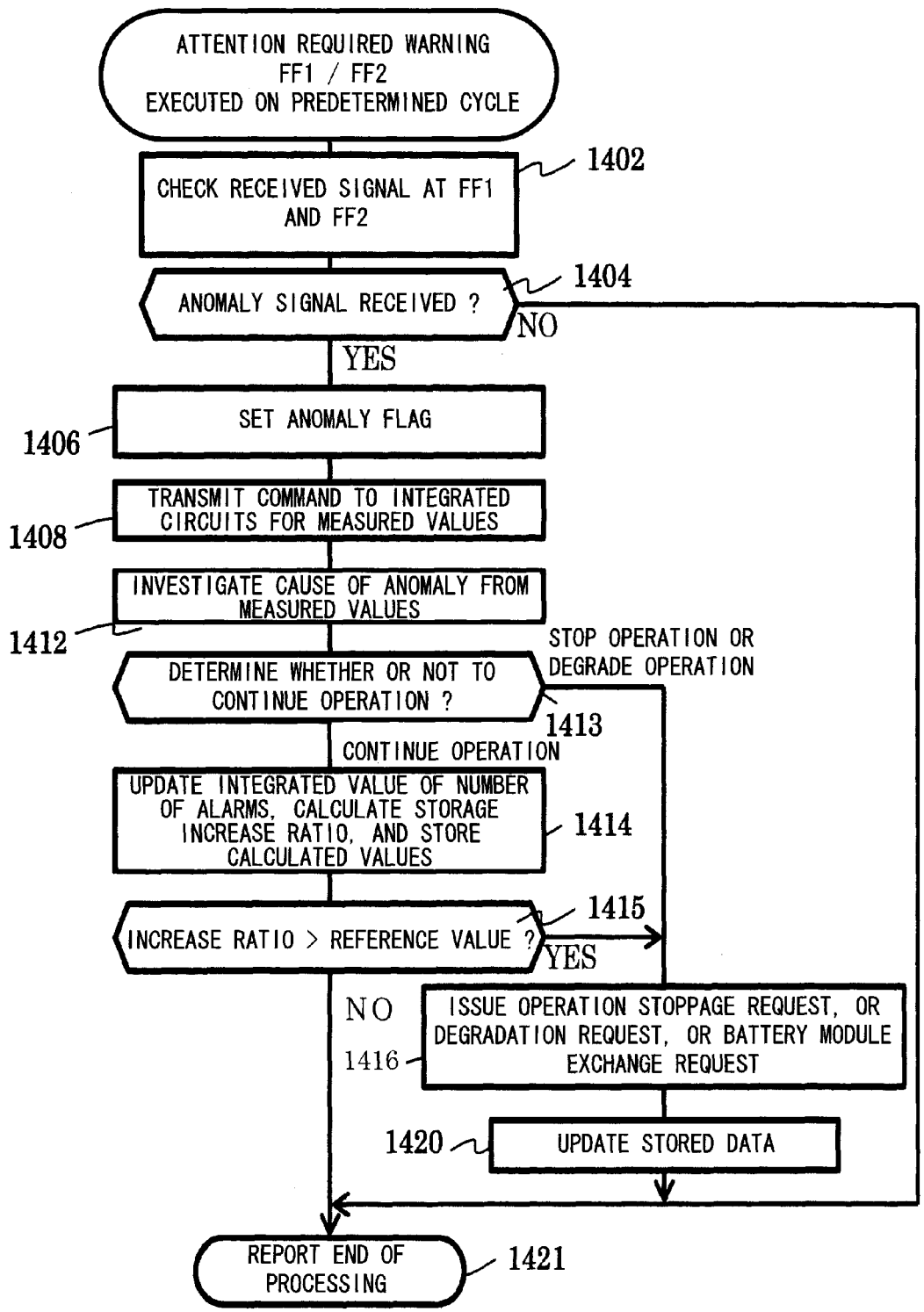
FIG. 34 shows the operational flow of control of a program that executes diagnosis operation and issues the alarm shown in FIG. 33.

FIG. 34 shows an operational flow for execution of the diagnosis operation explained in FIG. 33 that is executed upon a predetermined cycle. In this operational flow, detection of anomaly in the cells is performed by the digital comparator 270 of FIG. 6B as described above, and operation is performed to detect deterioration of anomaly of the lithium cells on the basis of a signal including the results of diagnosis that is sent from the output terminal FFO of the integrated circuit to the battery controller 20 via the transmission path 54 and a photocoupler PH4 that is an insulating circuit. In a step 1402, a signal including the results of diagnosis that is sent via the transmission path 54 and the photocoupler PH4 that is an insulating circuit is received at the terminals FF1 and FF2 of the battery controller 20 (FIG. 28). Next in a step 1404 a decision is made as to whether or not an anomaly signal is included in this signal at FF1 and FF2, and if an anomaly signal is included, then in a step 1406 an anomaly flag is raised. On the other hand, in the case of a test signal for testing whether or not the transmission path is normal or the like, if there is no signal indicating an anomaly, then the flow of control proceeds to a step 1421, and the execution of this diagnosis program is terminated.

In the next step 1408, in order to investigate the cause of the anomaly, the battery controller 20 orders each of the integrated circuits to transmit to the battery controller 20, via the transmission path 52, the data stored in its registers 275 and 274 and the RAM 1107 of FIG. 6A, and the information in the flag storage circuit 284 of each of the integrated circuits shown in FIG. 6B. The cause of occurrence of the anomaly signal is investigated on the basis of the measured values and the flag information, i.e. on the basis of the above described data that has been sent from the integrated circuits in the step 1412. Then in a step 1413, on the basis of the cause of occurrence of the anomaly signal, a decision is made as to whether normal operation should be continued, or the operation should be stopped or degraded. In the case of stoppage of operation or degradation of operation, the flow of control is transferred to a step 1416, and a request is communicated to relevant control devices for stoppage of the operation or for degradation of the operation of the power supply system. In this case, this state is stored in FIG. 8 in the next step 1420. The relevant control devices to which the above described request for stoppage of operation or for degradation of operation is communicated may, for example, be the control circuit 222 for the inverter device 220 of FIG. 7 that controls the motor, and/or the external controller 111 that controls the overall operation of the vehicle. Apart from this, since there is also an effect upon regenerative braking control, the request is also communicated to the braking device of the vehicle, so that it shifts to a degraded operational mode or the like.

If operation is to be continued irrespective of the generation of an anomaly signal, then in a step 1414 an integrated value is obtained by integrating the number of times of issuance of a warning, and the number of warnings is stored as the data item D19 of the field A of FIG. 8. Moreover, the proportion of increase of the number of cases of warning is calculated in this step 1414, using the history data D20 of the field B of FIG. 8. In the next step 1415 it is decided whether or not the proportion of increase that has been calculated is greater than some reference value, and if the proportion of increase is great then the flow of control continues to a step 1416, in which, along with transmitting a request for stoppage of operation or a request for degradation of operation to the relevant control devices, a warning is also displayed to the driver. Moreover, in a step 1420 these details are stored as stored data of FIG. 8. But if the proportion of increase of the number of cases of warning does not exceed the reference value, then the flow of control proceeds to a step 1421, in which execution is terminated. It should be understood that, due to the execution of the step 1368 shown in FIG. 32, the data D19 of the field A of FIG. 8 is taken as history data, and is stored as the history data D20 of the field B of FIG. 8.

FIG. 33 shows the frequency of generation of anomaly signals, and, when the frequency increases abruptly, by detecting increase of the frequency of generation of anomaly signals according to the operational flow of FIG. 34 described above, it is possible to detect deterioration of the lithium cells BC1 through BC4 or occurrence of an anomalous condition thereof, or deterioration of the battery module or occurrence of an anomalous condition thereof with high accuracy.

While various embodiments and variant examples have been explained in the above description, the present invention is not to be considered as being limited by these details. Other modes that are considered to fall within the range of the technical concept of the present invention are also included within the range of the present invention.

The content of the disclosure of the following application, upon which priority is claimed, is hereby included herein by reference:

Japanese Patent Application 221, 825 of 2009, filed on 28 Sep. 2009.

The invention claimed is:

1. A battery system, comprising:
a battery module comprising a plurality of cell groups connected in series, each comprising a plurality of cells connected in series;
a plurality of integrated circuits provided to corresponding each cell group of the battery module, that perform detection of terminal voltages of the cells in the corresponding each cell group, and that also perform diagnosis; and
a battery controller that, along with issuing commands to the plurality of integrated circuits, also receives results of detection and results of diagnosis by the plurality of integrated circuits;
wherein the battery system comprises a writable non-volatile memory, and data is stored in the writable non-volatile memory specifying usage environment of the battery module, including a maximum voltage or a maximum current of the battery module and history data based upon operation history of the battery module;
at least a first storage block and a second storage block are set as a storage block for storing the data specifying the usage environment and the history data in a storage region of the non-volatile memory;
data stored in a storage block, among the first and the second storage blocks in the non-volatile memory, in which writing of data is performed later is read out; and
as a result of being decided whether or not the data that has been read out is normal, if it has been decided that the data that has been read out is normal, then, among the first and the second storage blocks, writing of next data in the non-volatile memory is performed into a storage block that is different from the storage block from which the data that it was decided was normal was read out; and
wherein, if it has been decided that the data that has been read out is anomalous, then the writing of next data to the non-volatile memory is performed to the storage block that is the same as the storage block from which the data that it was decided was anomalous was read out.

2. A battery system according to claim 1, wherein when storing, as the history data in the non-volatile memory, as stored data that is not to be deleted, data indicating the states of the cells in a state in which a cumulative value indicating operation history of the battery module satisfies a predetermined condition, this data is stored in a storage block that is set in the non-volatile memory as the data that is not to be deleted.

3. A battery system according to claim 1, wherein, as the history data, data representing states of the cells each time integrated value of current of the battery module reaches a predetermined value is appended, as stored data that is not to be deleted, to the stored data that is not to be deleted that is already stored, and is stored in the non-volatile memory.

4. A battery system according to claim 1, wherein, as the history data, data representing states of the cells each time the integrated value of the operation time of the battery module reaches a predetermined value is appended, as stored data that is not to be deleted, to the stored data that is not to be deleted that is already stored, and is stored in the non-volatile memory.

5. A battery system according to claim 1, wherein, as the history data, data representing states of the cells each time an integrated value related to the number of episodes of operation of the battery module reaches a predetermined value is appended, as stored data that is not to be deleted, to the stored data that is not to be deleted that is already stored, and is stored in the non-volatile memory.

6. A battery system according to claim 1, wherein:
a circuit is provided for making charge states (SOCs) of the cells uniform; and
data specifying operational time intervals calculated for striving to making the charge states (SOCs) of the cells uniform is appended, as stored data that is not to be deleted, to the stored data not to be deleted that is already stored, and is stored in the non-volatile memory as the history data.

7. A battery system according to claim 1, the battery system comprising a volatile memory, wherein, at start of operation, data representing the usage environment and history data stored in the non-volatile memory are read out from the non-volatile memory and are written into the volatile memory, during operation data written in the volatile memory is updated, and during ending of operation updated data stored in the volatile memory is written into the non-volatile memory for a second time.

8. A battery system according to claim 1, wherein, if it has been decided that the data that has been read out is anomalous, then new writing of data to the non-volatile memory is performed both for the first storage block and for the second storage block.

9. A battery system according to claim 1, wherein:
a third storage block is further set in the non-volatile memory; and
if it has been decided that the data that has been read out is anomalous, then, when writing next data to the non-volatile memory, the next data is written to the third storage block, and, when reading out the next data from the non-volatile memory, data stored in the third storage block is read out.

10. A battery system according to claim 1, wherein:
a third storage block is further set in the non-volatile memory; and
if it has been decided that the data that has been read out is anomalous, then, when writing next data to the non-volatile memory, the next data is written both to the storage block from which the data that it was decided was anomalous was read out and to the third storage block.

11. A battery system according to claim 7, wherein terminal voltages of the cells are detected during operation starting, variation or deviation of SOCs is obtained from the terminal voltages that have been detected during operation starting, the variation or deviation of the SOCs that has been obtained is compared with variation or deviation of the SOCs that is stored in the non-volatile memory, and it is determined that an anomaly is present if the variation or deviation of the SOCs is increased.

12. A battery system according to claim 7, wherein terminal voltages of the cells are detected during operation starting, a discharge time for making the SOCs uniform is obtained from the terminal voltages that have been detected during operation starting, the discharge time that has been obtained is compared with discharge time that is stored in the non-volatile memory, and it is determined that an anomaly is present if the discharge time is increased.

13. A battery system according to claim 7, wherein terminal voltages of the cells are detected during operation starting, the terminal voltages of the cells that have been detected are compared with the terminal voltages of the cells that are stored in the non-volatile memory, and it is determined that an anomaly is present if terminal voltage is increased.

* * * * *